(12) United States Patent
Sasaki

(10) Patent No.: US 8,421,152 B2
(45) Date of Patent: Apr. 16, 2013

(54) SEMICONDUCTOR DEVICE AND MANUFACTURING METHOD FOR THE SAME

(75) Inventor: Yuji Sasaki, Kanagawa (JP)

(73) Assignee: Sony Corporation, Tokyo (JP)

(*) Notice: Subject to any disclaimer, the term of this patent is extended or adjusted under 35 U.S.C. 154(b) by 500 days.

(21) Appl. No.: 12/538,118

(22) Filed: Aug. 8, 2009

(65) Prior Publication Data

US 2010/0059818 A1    Mar. 11, 2010

(30) Foreign Application Priority Data

Sep. 10, 2008    (JP) .................... 2008-231781

(51) Int. Cl.
*H01L 29/66*    (2006.01)

(52) U.S. Cl.
USPC .......................................... 257/339; 257/492

(58) Field of Classification Search .................. 257/339, 257/341, 401, 492, 493
See application file for complete search history.

(56) References Cited

U.S. PATENT DOCUMENTS

| 7,989,910 B2 * | 8/2011 | Saito et al. ........... 257/493 |
| 2006/0220156 A1 * | 10/2006 | Saito et al. ........... 257/409 |

FOREIGN PATENT DOCUMENTS

| JP | 09-191109 | 7/1997 |
| JP | 2002-280555 | 9/2002 |
| JP | 2002-299622 | 10/2002 |
| JP | 2006-5275 | 1/2006 |
| JP | 2006-278826 | 10/2006 |
| JP | 2007-019146 | 1/2007 |
| JP | 2007-96344 | 4/2007 |
| JP | 2007-116190 | 5/2007 |
| JP | 2007-173418 | 7/2007 |
| JP | 2008-078282 | 4/2008 |

* cited by examiner

*Primary Examiner* — Mark Prenty
(74) *Attorney, Agent, or Firm* — Robert J. Depke; The Chicago Technology Law Group, LLC.

(57) ABSTRACT

A semiconductor device includes a first conductive type first semiconductor region, a second semiconductor region, and a second conductive type lateral RESURF region. The first semiconductor region is arranged on a first electrode side. The second semiconductor region includes first conductive type first pillar regions and a terminal part. The second pillar regions are alternately arranged on an element part. The terminal part is formed around the element part along a surface of the first semiconductor region on a second electrode side opposite to the first electrode side of the first semiconductor region. Furthermore, the second conductive type lateral RESURF region is formed in the second semiconductor region on the terminal part.

11 Claims, 29 Drawing Sheets

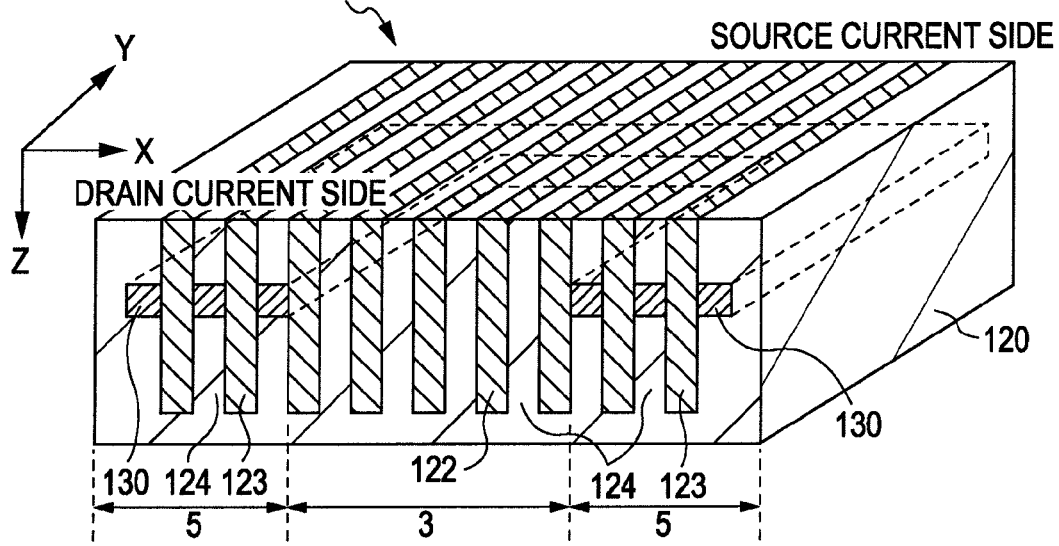
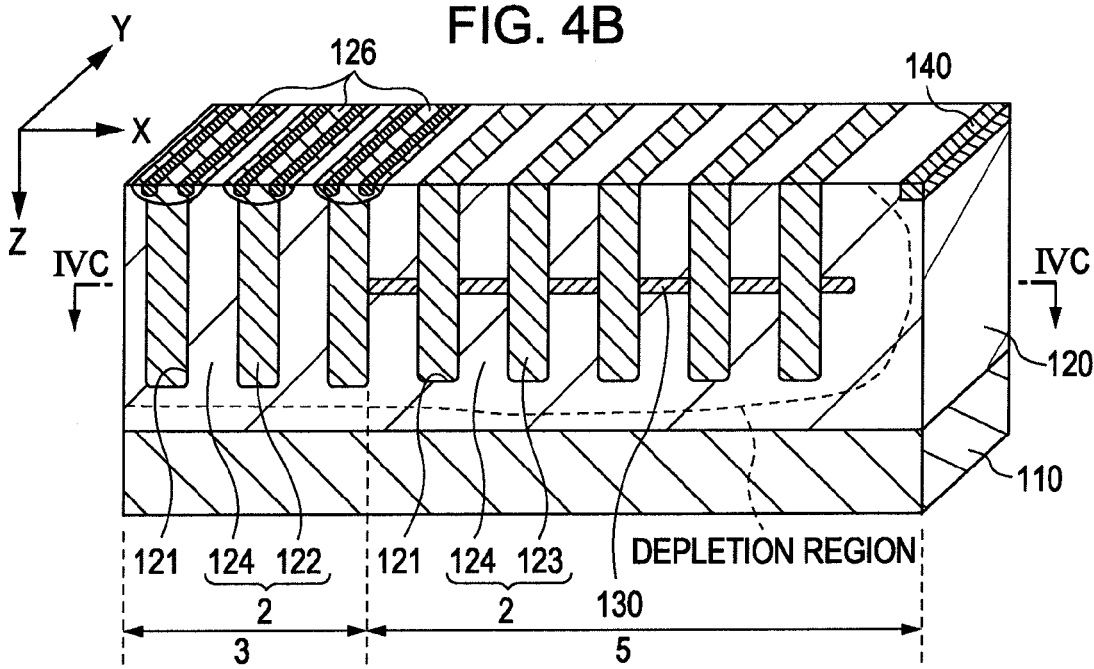
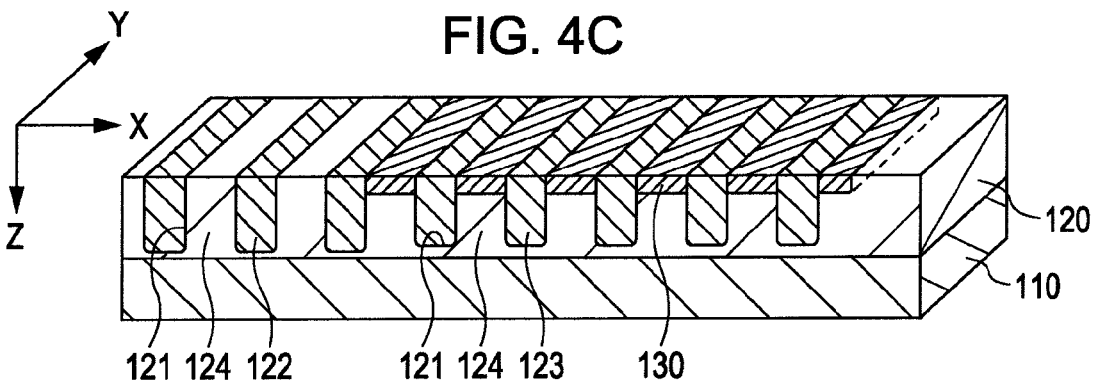

SEMICONDUCTOR DEVICE AND MANUFACTURING METHOD FOR THE SAME

The present application claims priority to Japanese Patent Application JP 2008-231781 filed in the Japan Patent Office on Sep. 10, 2008, the entire contents of which are hereby incorporated by reference.

BACKGROUND OF THE INVENTION

1. Field of the Invention

The present invention relates to a semiconductor device and a manufacturing method of the same. More specifically, the present invention relates to a semiconductor device with a super junction structure and a manufacturing method of the same.

2. Description of the Related Art

In recent years, there are increasing demands for thin-shaped, lightweight electronic apparatuses represented by a liquid crystal TV, a plasma TV, and an organic EL TV. In connection with such demands, there are other strong demands for small-sized high-performance power supply devices. In response to such demands, for example, efforts have been made to improve the performance of a power semiconductor, such as improvements in properties of withstand voltage (breakdown voltage), high current, low loss, high speed, and high breakdown voltage. For example, a power MOSFET has been known as a switching element for power electronics.

The on-resistance and the breakdown voltage of MOSFET depend on the impurity concentration of its conductive layer, an N region, to a great extent. The impurity concentration of the conduction layer is made high to reduce the on-resistance. For securing a desired breakdown voltage, however, it is difficult to increase the impurity concentration higher than a certain level. In other words, in the MOSFET, a semiconductor region that connects a source region and a drain region is generally called a drift region (drift layer). The drift region becomes a current path when the MOSFET is on. In contrast, when the MOSFET is off, the breakdown voltage of the MOSFET is retained by a depletion layer extending from a p-n junction formed between the drift region and a base region.

The on-resistance of the MOSFET depends on the electrical resistance of the conductive layer (drift region). For lowering the on-resistance of the MOSFET, the impurity concentration of the drift region may be increased to lower the electric resistance of the drift region. However, if the impurity concentration of the drift region is too high, the extent of the depletion layer becomes insufficient, causing a decrease in breakdown voltage of the MOSFET. In other words, even though lower resistance can be attained by a higher impurity concentration of the drift region, an increase in impurity concentration is limited to secure the desired breakdown voltage. In the MOSFET, therefore, there is the trade-off relationship between an increase in on-resistance and a decrease in breakdown voltage. An improvement in such a trade-off relationship has been desired for a low power consumption element.

As a technique for breaking through the trade-off, a multi-RESURF structure or a super junction structure has been known in the art (see, for example, Japanese Published Patent Application No. 2002-280555, Japanese Published Patent Application No. 2006-005275, Japanese Published Patent Application No. 2007-096344, Japanese Published Patent Application No. 2007-173418, and Japanese Published Patent Application No. 2007-116190). Hereinafter, such a technology will be collectively called a super junction.

As shown in these patent documents, the MOSFET having a drift region with a super junction structure includes: a column-shaped p-type semiconductor region (a p region, a p-type pillar region, a p-type vertical RESURF layer) and a column-shaped n-type semiconductor region (an N region, an n-type pillar region, an n-type vertical RESURF layer) are alternately arranged or periodically arranged like islands in parallel with the surface of the semiconductor substrate. In other words, the MOSFET has a vertical RESURF structure in which the p-type pillar regions and the n-type pillar regions are alternately arranged in the lateral direction in the semiconductor layer sandwiched between a source electrode and a drain electrode.

The "breakdown voltage" is held by a depletion layer extended from a p-n conjunction formed by these semiconductor regions. These semiconductors can be completely depleted by narrowing them even if the depletion area extends a little by increasing the impurity concentration for lower on-resistance. The N region of the transmissive layer causes a current flow at an ON state, while the breakdown voltage can be secured by completely depleting the P region and the N region at an off state, thereby simultaneously attained both the lower ionic resistance and high breakdown voltage of the MOSFET.

Therefore, in such a super junction structure, the performance of the MOSFET depends on the width of each p-type semiconductor region and the width of each n-type semiconductor region sandwiched between the p-type semiconductor regions. If the more the width of the p-type semiconductor region and the width of the n-type semiconductor region are reduced, the more the impurity concentration of the n-type semiconductor region can be increased. As a result, the on-resistance can be further decreased while the breakdown voltage can be further increased. As is evident from the above description, the impurity concentration is important for determining the breakdown voltage and the on-resistance.

Therefore, preferably, it is important to achieve a balance between the impurity of the p-type semiconductor region and the impurity of the n-type semiconductor region (a so-called charge balance) to cause a further increase in breakdown voltage. In other words, the impurity concentration of the p-type semiconductor region and that of the n-type semiconductor region are made equal to each other to equivalently make the impurity concentration zero, resulting in high breakdown voltage. At the time of reverse bias (OFF state), complete depletion is intended while high breakdown voltage is retained. At the time of zero bias (ON state), electric current is flown through the n-type semiconductor region doped with impurities at high concentration to realize an element with low on-resistance that exceeds the limit of a material.

Furthermore, in the semiconductor device with the super junction structure, a breakdown voltage, and an avalanche voltage depend not only on the structure of a region where the semiconductor device functions actively (which is any of regions called as an element part, an element activating region, an active region, a cell region, and a device body, where these regions will be totally represented by an element region) but also on the structure formed around the element region (a terminal region, an element-surrounding region, a peripheral structure region, and a junction termination region, where these regions will be totally represented by an termination region).

Thus, there is a difference in extent of depletion layer between the element part and the terminal part. If both the element part and the terminal part are formed so that they have an equal amount of impurities, a decrease in breakdown voltage occurs and an electric field is locally concentrated on the terminal part. As a result, the element may be damaged and the entire element may hardly obtain a sufficient breakdown voltage.

Furthermore, if there is no super junction structure on the terminal part, the occurrence of avalanche breakdown leads to the generation of electrons and holes, enhancing the electric fields of the upper and lower portions of the terminal part. An increase in breakdown current tends to break the element. In other words, the avalanche voltage decreases.

In the MOSFET with a super junction structure, therefore, it has been also desired to appropriately design the structure of the element part and the terminal part. Procedures for responding such a demand can be roughly classified into an idea of taking a measure while also forming a super junction structure on the terminal part and an idea taking a measure without forming a super junction structure on the terminal part. Any of Japanese Published Patent Application No. 2006-005275, Japanese Published Patent Application No. 2007-096344, Japanese Published Patent Application No. 2007-173418, and Japanese Published Patent Application No. 2007-116190 proposes the structure of the terminal part that employs the former idea.

The semiconductor device described in Japanese Published Patent Application No. 2006-005275 includes an element part and a terminal part. The element part is provided with a super junction structure having a first conductive type first pillar region and a second conductive second pillar region. The terminal part is provided with a super junction structure adjacent to that of the element unit and the thickness thereof in the vertical direction is smaller than that of the element part. Furthermore, for securing the breakdown voltage of the terminal part, the impurity concentration of an n-type semiconductor region in the terminal region is lower than that of an n-type semiconductor region in the element part. For example, the terminal part includes a first conductive type third pillar region and a second conductive type fourth pillar region. The outermost pillar region is additionally formed on part of the third or fourth pillar region, which is the nearest to the terminal part of a super junction structure. The outermost pillar region has an impurity concentration lower than that of the first and second pillar regions. A first conductive type high resistance region is formed on the third pillar region and the fourth pillar region and is provided with a resistance value higher than that of each pillar region.

For securing the breakdown voltage of the terminal part in Japanese Published Patent Application No. 2007-096344, the impurity concentration of an n-type semiconductor region in the terminal region is smaller than that of the n-type semiconductor region of the element part. For example, an ion injection area of a second conductive partition region on the outermost part of the terminal region is set to be smaller than each region of the parallel p-n layer in the inside thereof to equalize the net impurity concentration of the second conductive type partition region on the outermost side and that of each region of the parallel p-n layer on the inner side thereof.

Likewise, in Japanese Published Patent Application No. 2007-173418, a terminal part is provided with a super junction different from that of an element part. For example, n-type regions and p-type regions are formed in parallel on the principal surface of an n+ layer in the terminal part. In addition, n-type regions and p-type regions are formed in parallel on a high resistance semiconductor layer. The impurity concentration of at least one of the n-type and p-type pillar regions is gradually changed in the direction from the first to second main electrodes so that the impurity concentration of the n-type pillar region is smaller than that of the p-type pillar region on the side of the first main electrode (source electrode) but larger on the side of the second main electrode (drain electrode).

In Japanese Published Patent Application No. 2007-116190, when a semiconductor device includes an element part where a drift current flows and a terminal part around the element part, the terminal part is provided with a second n-type drift layer and a second p-type drift layer formed in at least one of directions perpendicular to each other.

On the other hand, as a method for manufacturing a super junction structure, any of the following techniques may be employed.

(1) Ion implantation is employed to introduce n-type and p-type impurities into an epitaxial layer (epitaxial silicon) independently and the formation of such an epitaxial structure is repeated several times to form a super junction structure (hereinafter, the method will be referred to as a first manufacturing method). In other words, it is a multi-epitaxial manufacturing method that repeats the same kind of epitaxial growth several times.

(2) A trench groove is formed in a thick epitaxial layer and impurities are then doped in the groove-formed side of the layer by diffusion or the like, followed by being embedded with an insulating material or a non-conductive material (hereinafter, the method will be referred to as a second manufacturing method).

(3) A trench groove is formed in a thick epitaxial layer and silicon epitaxial containing impurities is then embedded in the groove (the method will be referred to as a third manufacturing method). In other words, it is a method of filling a trench groove once formed with epitaxial growth (trench formation epitaxial method).

SUMMARY OF THE INVENTION

Here, when comparing first to third manufacturing methods with each other, the third method may include a smaller number of steps and realize a super junction structure with a high integration degree.

However, the third manufacturing method have problems in conditions for preventing the generation of any defect during epitaxial growth to a trench groove and control of the amount of impurities to be doped. The rate of epitaxial growth and the concentration of impurities may be changed depending on the direction of a crystal plane appeared at the time of trench groove formation. Therefore, there is a need of defining defect-free productive conditions while controlling the rate of epitaxial growth and the concentration of impurities with high precision.

Actually, any system for obtaining an appropriate terminal part has not been established in the formation of the super junction structure by the third manufacturing method. Although the relative arrangement of the trench groove of the element part and the trench groove of the terminal groove may be sufficiently considered, there is no established system for such an arrangement. The present invention has been made in consideration of the above circumferences. It is desirable to provide a semiconductor device with a super junction structure by a simple process and a system for favorably ensuring a breakdown voltage around the element part.

A first embodiment of the present invention is a semiconductor device includes an element part and a terminal part around the element part. Each part has a super junction structure where first conductive first pillar regions and second conductive second pillar regions are provided in pairs and alternately arranged. In addition, portion of the terminal part within the second semiconductor region with the super junction structure is provided with a second conductive lateral RESURF region.

The semiconductor device is formed by a simple process in which both an element part and a terminal part around the element part are provided with super junction structures. In the semiconductor device, the presence of a lateral RESURF region that functions as an extended depletion layer region on the terminal part allows a region to be depleted at the time of applying a drain voltage (in the off state) to be extended to the terminal part. Therefore, the resulting semiconductor device is free of concentrated electric field. In addition, a lateral RESURF region is arranged in a second semiconductor region of the terminal part. Thus, a depletion layer formed at the time of applying drain voltage is provided with a certain curvature. In addition, an increase in breakdown voltage is attained while the impurity concentration of the second semiconductor region on the terminal part is kept high. Furthermore, the impurity concentration of a first pillar region of the element part is substantially equal to the impurity concentration of a first pillar region of the terminal part. Therefore, the process design of a super junction structure can be simplified.

Such a structure of the semiconductor device according to the first embodiment will be obtained by one of the following two manufacturing methods:

The first method includes the steps of: forming a first conductive type second semiconductor region on a first conductive type first semiconductor region; forming trench grooves at the same depth in the same direction in an element part and a terminal part around the element part to form a first conductive first pillar region between the trench grooves adjacent to each other; forming a second conductive type second pillar region by embedding a second conductive type semiconductor in the trench groove by epitaxial growth; forming a second conductive type lateral RESURF region on a surface of the second semiconductor region on a terminal part opposite to the first semiconductor region; and repeating the step of forming the first semiconductor region until a predetermined number of layers of the lateral RESURF regions is obtained. In the first manufacturing method, the lateral RESURF region and the second pillar region are overlapped.

On the other hand, the second manufacturing method includes the steps of forming a first conductive type second semiconductor region along a surface of a first conductive type first semiconductor region; forming a second conductive type lateral RESURF region on a surface of the second semiconductor region on a terminal part opposite to the first semiconductor region; repeating the step of forming the first semiconductor region until a predetermined number of layers of the lateral RESURF regions is obtained. After that, trench grooves are formed at the same depth in the same direction in an element part and a terminal part around the element part to form a first conductive first pillar region between the trench grooves adjacent to each other. Then, a second conductive type second pillar region is formed by embedding a second conductive type semiconductor in the trench groove by epitaxial growth. In the second manufacturing method, the formation and filling of trench groove may be carried out only once. Even after the formation of a lateral RESURF region, at least a part of the second pillar regions on the terminal part does not overlap the lateral RESURF region. A phenomenon of an increase in impurity concentration by the overlap does not occur. Thus, a phenomenon of stopping fulfilling depletion conditions, which is caused by the overlap, may be avoided.

A second embodiment of the present invention is a semiconductor device includes an element part and a terminal part around the element part. Each part has a super junction structure where first conductive first pillar regions and second conductive second pillar regions are provided in pairs and alternately arranged. In addition, a second conductive lateral RESURF region is formed on the surface of the terminal part of the second semiconductor region having the super junction structure on the side of the first semiconductor region.

A third embodiment of the present invention is a semiconductor device includes an element part and a terminal part around the element part. Each part has a super junction structure where first conductive first pillar regions and second conductive second pillar regions are provided in pairs and alternately arranged. In addition, a second conductive lateral RESURF region is formed on the surface of the terminal part of the second semiconductor region having the super junction structure on the side of the second electrode region. Furthermore, all of the second pillar regions on the terminal part are capable of electrically connecting to the lateral RESURF region.

In each of the second and third embodiment, the semiconductor device is also formed by a simple process in which both an element part and a terminal part around the element part are provided with super junction structures. Although it is not more than the first embodiment, in the semiconductor device, the presence of a lateral RESURF region that functions as an extended depletion layer region on the terminal part allows a region to be depleted at the time of applying a drain voltage (in the off state) to be extended to the terminal part. Therefore, the resulting semiconductor device is free of concentrated electric field. In addition, an increase in breakdown voltage is attained while the impurity concentration of the second semiconductor region on the terminal part is kept high. Furthermore, the impurity concentration of a first pillar region of the element part is substantially equal to the impurity concentration of a first pillar region of the terminal part. Thus, the process design of a super junction structure can be simplified.

According to any embodiment of the present invention, the semiconductor device is formed by a simple process in which both an element part and a terminal part around the element part are provided with super junction structures. Since the lateral RESURF region exists in the terminal part, a high stable breakdown voltage is realizable.

BRIEF DESCRIPTION OF THE DRAWINGS

FIG. 1 illustrates the configuration of a semiconductor device of a comparative example, where

FIG. 2 illustrates the configuration of a semiconductor device according to a first embodiment of the present invention, wherein

FIG. 3 illustrates an exemplary process for manufacturing the semiconductor device according to the first embodiment where

FIG. 4 illustrates the configuration of a semiconductor device as a first modified example according to the first embodiment of the present invention, where FIG. 4A to FIG. 4C are schematic perspective diagrams illustrating the configuration of the semiconductor device.

FIG. 5 illustrates an exemplary process for manufacturing the semiconductor device according to the first embodiment (first modified example) wherein

FIG. 6 illustrates the configuration of a semiconductor device as a second modified example according to the first embodiment of the present invention, wherein

FIG. 9 illustrates the configuration of a semiconductor device according to a second embodiment of the present invention, where

FIG. 10 illustrates the configuration of a semiconductor device according to a third embodiment of the present invention, where

FIG. 11 illustrates the configuration of a semiconductor device according to a forth embodiment of the present invention, where

FIG. 13 illustrates the configuration of a semiconductor device according to a fifth embodiment of the present invention, where

FIG. 14 illustrates the configuration of a semiconductor device according to each of sixth to eighth embodiments of the present invention, where FIG. 15 illustrates the configuration of a semiconductor device according to a ninth embodiment of the present invention, where

DESCRIPTION OF THE PREFERRED EMBODIMENTS

Figure 1A:
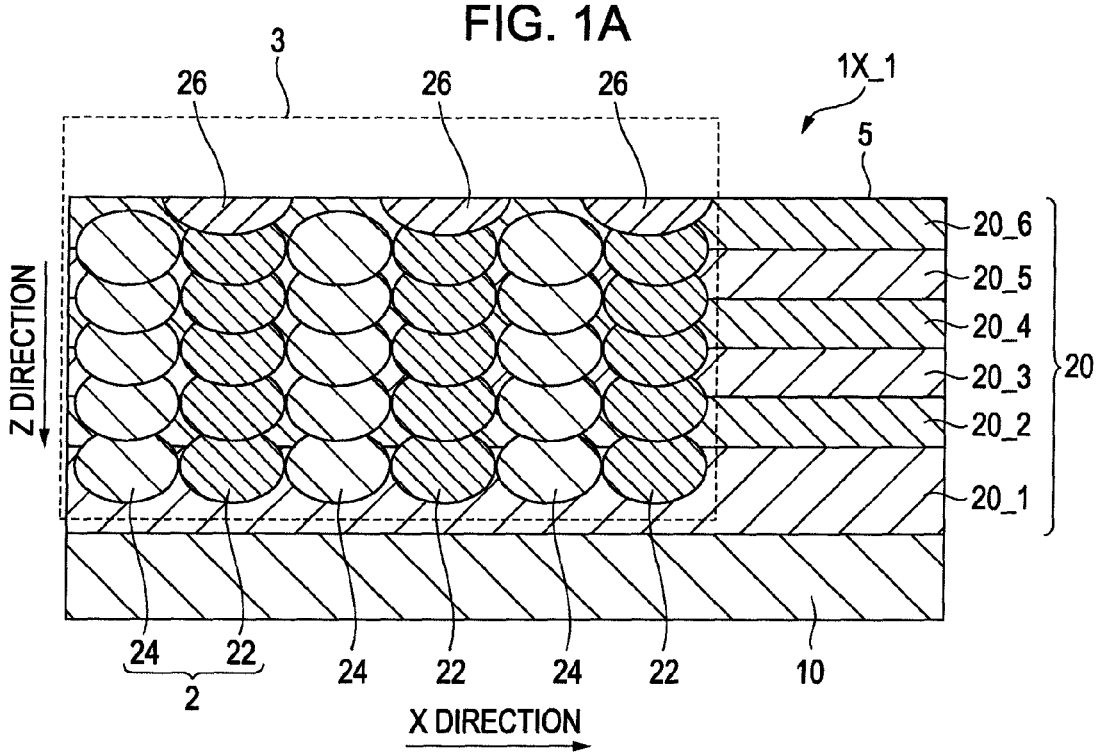
FIG. 1A is a schematic cross-sectional view of a semiconductor device of a first comparative example.

Hereafter, embodiments of the present invention will be described in detail with reference to the attached drawings. The same or similar structural components will be denoted with the same reference numerals as long as no additional description will be required and redundant descriptions will be thus omitted. For distinguishing similar structural components of different embodiments, capital letters will be added to the corresponding reference numerals. Figure numbers will be also described in a similar manner.

Hereinafter, unless otherwise noted, the term "substrate" means a substrate made of silicon Si, the term "first conductive type" means an n-type, and the term "second conductive type" means a p-type. In addition, the concentration of impurities will be represented by any of "n−", "n", "n+", "p−", "p", and "p+". In other words, "n+" means high impurity content relative to "n" and "n−" means low impurity content relative to "n". The same rules are also applied to "p". The more the number of "−" or "+" increases, the more the relative intensity represented by such a symbol increases.

Comparative Example

Figure 1B:
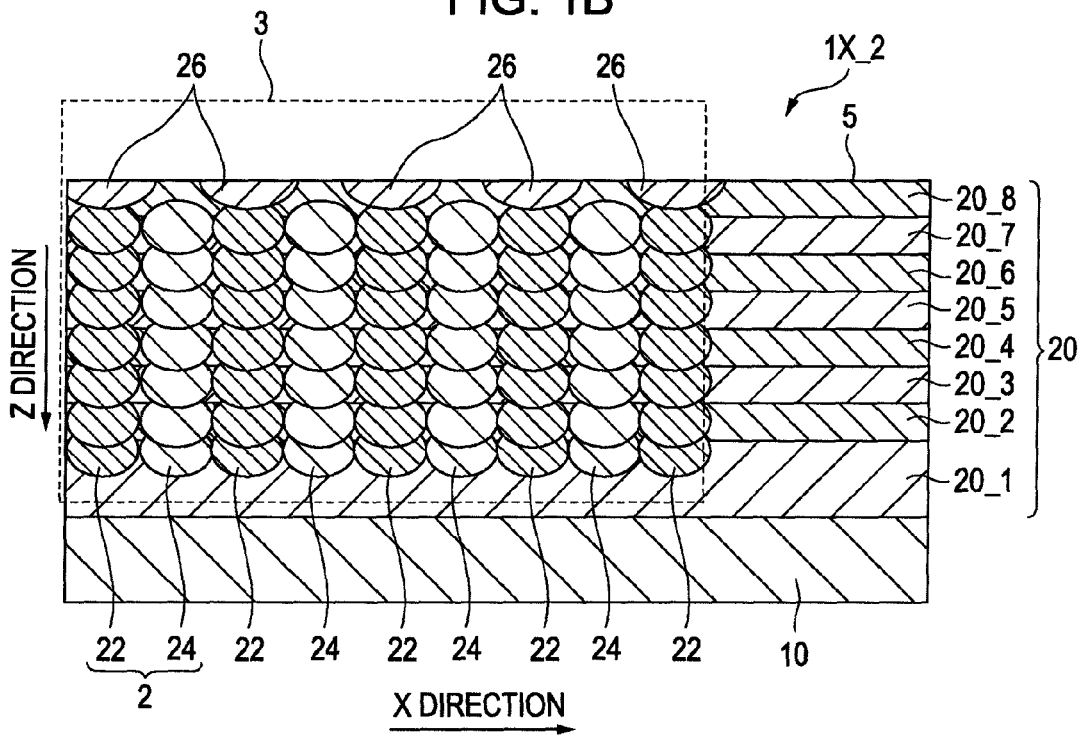
FIG. 1B is a schematic cross-sectional view of another semiconductor device of the first comparative example.
Figure 1C:
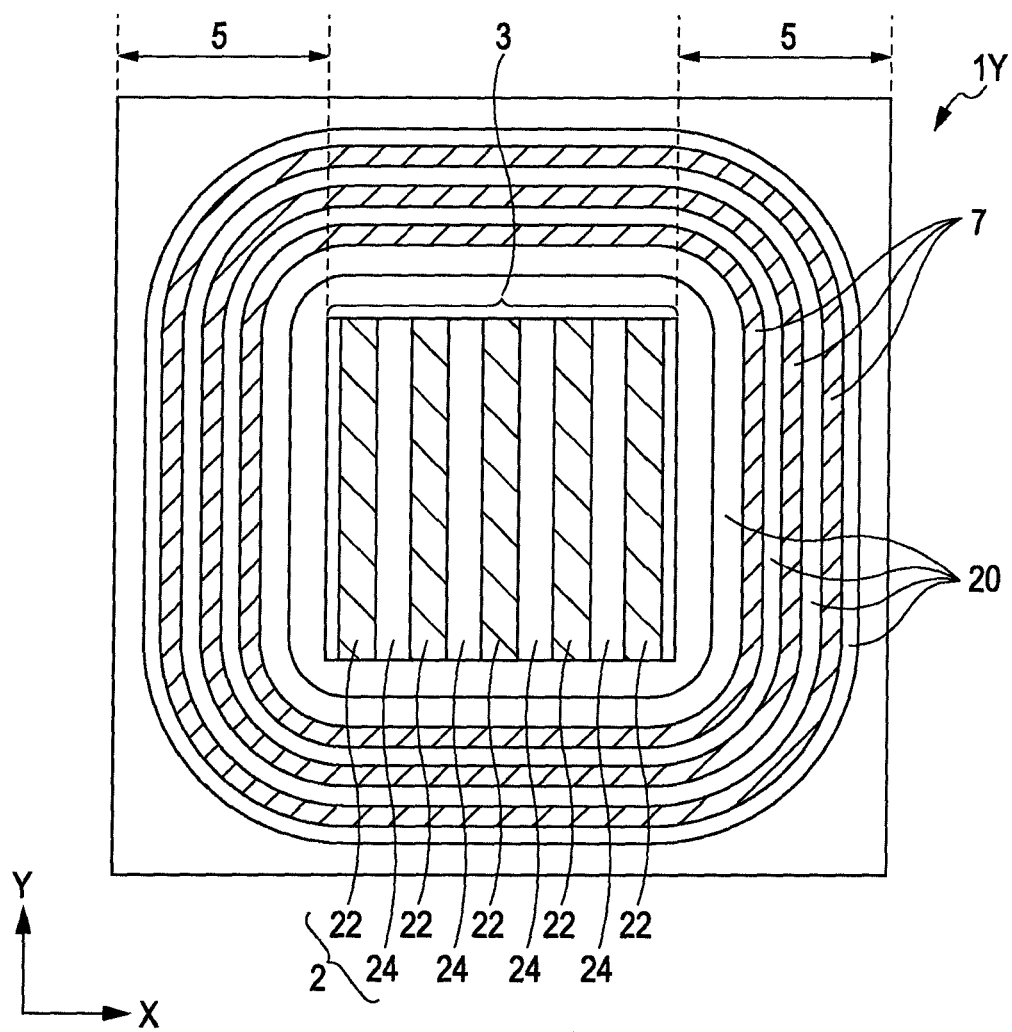
FIG. 1C is a schematic plan view of a semiconductor device of a second comparative example.

FIG. 1A to FIG. 1C illustrate semiconductor devices of comparative examples for the sake of comparison with those of embodiments of the present invention. Here, FIG. 1A is a schematic cross-sectional view of a semiconductor device 1X of a first comparative example. FIG. 1B is a schematic cross-sectional view of the same kind of the semiconductor device 1X of the first comparative example, except for the number of epitaxial layers. FIG. 1C is a schematic plan view of a semiconductor device 1Y of a second comparative example.

The semiconductor device 1X is a power metal-oxide semiconductor field-effect transistor (hereinafter, referred as a "power MOSFET") provided with a large number of element cells with a parallel p-n structure. As shown in FIG. 1A and FIG. 1B, the semiconductor device 1X includes an n-type epitaxial layer 20 with a predetermined pitch on the surface of an n-type high concentration substrate 10 (n+ drain layer) as an example of a fist conductive type semiconductor layer with a comparatively high impurity concentration. In other words, the pitches of thin layers of the n-type epitaxial layer 20 are substantially equal to each other, except for the bottom layer (on the side of the n-type high concentration substrate 10).

The n-type epitaxial layer 20 is divided into two parts, an element part 3 and a terminal part 5. The element part includes element cells 2 each having a parallel p-n structure of a pair of a p-type semiconductor region (p-type pillar region) and an n-type semiconductor region (n-type pillar region). The element part 3 is also referred to as a super junction element region. The terminal part 5 is formed around the element part 3 and provided as a periphery structure region.

Furthermore, in the element part 3, p-type pillar diffused layers 22 (p-type drift layers) and n-type pillar diffused layers 24 (n-type drift layers) are formed at predetermined pitches, respectively, or the same pitch as that of the n-type epitaxial layers 20. A super junction structure is formed by the n-type pillar diffused layer 24 sandwiched between the p-type pillar diffused layer 22 and the p-type pillar diffused layer 22. The p-type pillar diffused layers 22 and the n-type pillar diffused layers 23 extend like stripes perpendicular to the sheet. A p-type base region 26 is selectively formed near the surface of the p-type pillar diffused layer 22, which is opposite to he side of the high-concentration n-type substrate 10, so that it may connect with the p-type pillar diffusion layer 22.

An exemplary size of each of pillar diffused layers 22 and 24 satisfies the following equation:

$$C \approx 7.2 \times 10^{16} \cdot Vb^{(-0.2)}/b (cm^{-3})$$

where Vb represents a breakdown voltage, D represents the depth of each of the pillar diffused layers 22 and 34 (D=α·Vb^1.2: e.g., α=0.024 [μm]), W represents a depth, and C represents the concentration of impurities).

In other words, the depth D and width W of each of the pillar diffused layers 22 and 24 depends on the breakdown voltage Vb and the impurity concentration C. If the desired breakdown voltage is about 500 to 800 V, then the width W may be set to about 1 to 10 μm and the depth D may be set to about 30 to 80 μm. In this case, the concentration of impurities may be defined depending on these values. As is evident from the above, each of the pillar layers 22 and 24 has a narrow width W and a deep depth D (in other word, a high aspect ratio).

Although not illustrated, a drain electrode (first main electrode) is formed on the surface of the high-concentration n-type substrate 10, which is opposite to the n-type epitaxial layer 20, and electrically connected therewith. In addition, an n+ source region and a contact region in contact with a source electrode are formed on the surface of a p-type base region 26. A source electrode (second main electrode) is formed so that it will touch the surface of each of the n+ source region and the p-type region 26. On the side of the surface of the n-type epitaxial layer 20, which is located on the side of the source electrode, a gate (control electrode) is formed on the surface of the n-type pillar diffused layer 24 sandwiched between the adjacent p-type base regions 26 and the surfaces of these adjacent p-type base regions 26 and their n+ source regions through a gate insulating film so as to be surrounded by the source electrodes. The p-type base regions 26, n+ source regions, source electrodes, and gate electrodes are also formed in stripe shapes in the same direction as that of the p-type pillar diffused layer 22 and the n-type pillar diffused layer 24. Such a structure allows a semiconductor device 1X to be constructed of an n-channel MOSFET for electron injection, where the surface of a p-type base region 26 directly under the gate insulating film.

Here, in the power MOSFET with a super junction structure, it is important to appropriately design the structure of a region where the semiconductor device is actively driven (corresponding to the element part 3 of the semiconductor device 1X) and the structure of the element periphery part (corresponding to the terminal part 5 of the semiconductor device 1X). It is desirable to obtain a breakdown voltage higher than that of the element part 3. In other words, the breakdown voltage property of the terminal part 5 may be one of factors that define the device properties of the power MOSFET.

The breakdown voltage of the terminal part 5 is determined depending on the thickness of a depletion layer in the vertical direction as long as both the p-type pillar region (corresponding to the p-type diffused layer 22 of the semiconductor device 1X) and the n-type pillar region (corresponding to the n-type pillar diffused layer 24 of the semiconductor device 1X) are completely depleted while the drain is under an applied voltage in an off state. Therefore, an increase in impurity concentration of the n-type pillar region leads to a decrease in on-resistance. In contrast, it is important to ensure the breakdown voltage of the terminal part 5 in consideration that the depletion layer extends in the lateral direction in the off state. Furthermore, it is also important to prevent an electric filed from reaching to a critical level in the laterally elongated depletion layer.

In other words, in the case of a semiconductor device for electric power application, such as a switch MOSFET device for electric power application, for example, a multi-RESURF structure or a super junction structure, where P regions and N regions are alternately arranged in a repetitive manner to attain complete depletion when biasing, is used for ensuring a high breakdown voltage of 500 V or more. Such a technology may be combined with MOSFET to simultaneously realize the on-resistance and the high breakdown voltage of a switch element. The structure of such a switch element is insufficient for ensuring the high breakdown voltage, it is important to design the layout and structure of the periphery chip structure (terminal structure) so as to be provided with a breakdown voltage higher than that of the breakdown voltage of the element.

As an example of realizing such a layout or structure, any combination of a guard ring structure, a field plate structure, and a p-type lateral RESURF structure may be used. For example, a semiconductor device 1Y provided as a second comparative example shown in FIG. 1C employs a guard ring structure. As shown in the figure, a plurality of guard ring portions 7 is formed (multileveled) on the surface of the terminal part 5 so that these portions 7 are located near the boundary between the terminal part 5 and the element part 3 while surrounding all sides of the element part 3. Furthermore, an n-type semiconductor layer (n-type epitaxial layer 20) is formed on the terminal part 5 of the semiconductor device 1Y, but neither a p-type pillar diffused layer (n-type drift layer) nor an n-type pillar diffused layer (p-type drift layer) is formed thereon. Therefore, the plurality of guard ring portions 7 made of p-type semiconductor is selectively formed on the surface of the n-type epitaxial layer 20 to surround all sides of the element part 3. However, such a guard ring structure leads to an increase in area of the terminal part 5.

In addition, as a modified example, a super junction structure may be applied to the terminal part 5 just as in the case with the element part 3 and a guard ring part 7 may be then formed on the surface of the super junction structure. In this case, however, it is important to provide the guard ring structure with an optimized stripe width of each of the p-type pillar diffused layer 22 and the n-type pillar diffused layer 24 (or trench grooves when formed therewith) and an optimized distance between them and to consider their crystal orientation dependence, resulting in difficulty in optimization.

In addition, there is no appropriate method for making a combination of the guard ring portion 7 surrounding all sides of the element part 3 and the striped super junction structure. In particular, the impurity concentration of an overlapped portion where the p-type pillar diffused layer 22 and the p-type guard ring part 7 are simultaneously formed thereon. Thus, such an increase in impurity concentration may cause some disadvantages, such as a decrease in breakdown voltage and a decrease in electric field balance, so that such disadvantages may be considered when designing the structure. Furthermore, but not shown in the figure, an increase in number of steps of the process is inevitable when the terminal part 5 is provided with a filed plate or a lateral RESURF structure. Thus, it is desirable to provide the terminal part 5 with a cheap structure with a good compatibility with an element structure process.

On the other hand, as a method for manufacturing a super junction structure, any of the following techniques may be employed:

(1) A first manufacturing method (multi-epitaxial manufacturing method) is a method in which ion implantation is employed to introduce n-type and p-type impurities into an epitaxial layer (epitaxial silicon) independently and the formation of such an epitaxial structure is repeated several times to form a super junction structure.

(2) A second manufacturing method is a method in which a trench groove is formed in a thick epitaxial layer and impurities are then doped in the groove-formed side of the layer by diffusion or the like, followed by being embedded with an insulating material or a non-conductive material.

(3) A third manufacturing method (trench-formation epitaxial-refilling method) is a method in which a trench groove is formed in a thick epitaxial layer and silicon epitaxial containing impurities is then embedded in the groove.

For realizing these methods, there are various points to be overcome. In particular, some of them will be described below. First, the first manufacturing method is used for the production of the semiconductor device 1X. An n-type epitaxial layer 20 is grown about 10 μm on a wafer substrate (high-concentration n-type substrate 10). A p-type semiconductor region and an n-type semiconductor region are formed by ion injection, followed by further growth of a high-resistance n-type epitaxial (n-type epitaxial layer 20) to form a p-type semiconductor region and an n-type semiconductor region, respectively. This step is repeated about 5 to 10 times to form both a p-type pillar diffused layer 22 and an n-type p-pillar diffused layer 24. For example, the n-type epitaxial layer 20 is formed by performing epitaxial growth in several times (e.g., six times for the semiconductor device 1X_1 in FIG. 1A). Thus, six epitaxial layers 20_1 to 20_6 formed by the respective divided growth processes are stacked one on top of the other to form the n-type epitaxial layer 20. Each of the p-type pillar diffused layer 22 and the n-type pillar layer 24 are formed by carrying out ion injection and diffusion into the n-type epitaxial layer 20 and combining a plurality of diffused layers 22_1 to 22_6 or 24_1 to 24_6 thus formed in the depth direction.

Therefore, the first manufacturing method, which is also called a multi-epitaxial manufacturing method, is able to form n-type semiconductor regions and p-type semiconductor regions having different profiles on the element part 3 and the terminal part 5, respectively. Thus, the first method has advantages in that the super junction structure is realized by a comparatively easy process and the impurity profiles in the element part 3 and the terminal part 5 are easily defined by modifying the amount of impurities to be introduced into each laminated layer and the patterns thereof.

However, the p-type pillar diffused layers 22 and the n-type pillar diffused layer 24 are alternately placed in the silicon at depths from the top thereof to about 40 to 80 μm. Thus, the structure is complicated and the manufacturing process is also complicated because comparatively many processing operations are necessary for the number of stacking layers to be ion implanted or to be grown epitaxially. Furthermore, sufficient diffusion temperature and time are necessary for connecting the p-type and n-type pillar diffused layers 22 and 24 with each other in the vertical direction, so that the diffusion in the lateral direction is hardly disregarded. Thus, further effort to attain a comparatively microfabricated structure is necessary.

On the contrary, to shorten the diffusion temperature and time, it is necessary to make each of the epitaxial layers thinner, corresponding to an increase in number of repetitively stacking the epitaxial layers. Therefore, as shown in FIG. 1B, it leads to an increase in number of the process works as described above (eight times for a semiconductor device 1X_2 shown in FIG. 1B). That is, there is a trade-off relationship between a decrease in chip size and a decrease in wafer cost.

In the second manufacturing method, it is desirable to select an appropriate insulating material to be embedded. The breakdown voltage of the material and the interface of the material and silicon Si (the substrate) may be considered. Furthermore, a difference between the thermal expansion coefficient of the embedding insulating material and that of the silicon Si will affect on the generation of crystal defects due to subsequent heat processing. Thus, such a difference should be avoided.

Alternatively, the third manufacturing method may be applied to the semiconductor device 1X when an element cell 2 with a parallel p-n structure is formed. In this case, an n-type epitaxial layer with a thickness of 40 to 80 m is formed on a wafer substrate by epitaxial growth and then stripe patterns are formed thereon. The n-type epitaxial layer is etched into a trench shape in the depth direction to form a trench groove with a depth substantially equal to the thickness of the n-type epitaxial layer or less (e.g., about 30 to 70 μm in depth). The trench groove is refilled with a p-type semiconductor by epitaxial growth. In such a third manufacturing method, a super junction structure with a high degree of integration can be obtained with a smaller number of steps.

In this case, however, there are some points to be improved, such as conditions for preventing defects in epitaxial growth to form a trench groove and controls for the amount of impurities to be doped. In particular, the rate of epitaxial growth and the concentration of impurities may vary depending on crystal face orientation appeared at the time of trench groove formation. Thus, it is important to determine the conditions of the production without any defect while precisely controlling rate of epitaxial growth and the concentration of impurities at a time. A sufficient consideration for the arrangements of the trench groove in the element part 3 and the trench groove in the terminal part 5 is desired.

In any of embodiments of the present invention, the third manufacturing method is employed while at least one of the aforementioned problems is improved to realize a super-junction type semiconductor device having a high breakdown voltage and a high avalanche voltage compared with those of existing semiconductor devices. In particular, any of the embodiments of the present invention will realize the structure of a semiconductor device and a method of manufacturing such a semiconductor device. In the method, a super junction structure is formed by the third manufacturing method which is a simple process compared with other methods while solving at least one of the aforementioned problems to satisfactory ensure the breakdown voltage of an element periphery part. Hereafter, any of the embodiments of the present invention will be described.

First Embodiment

Basic Constitution

Figure 2A:
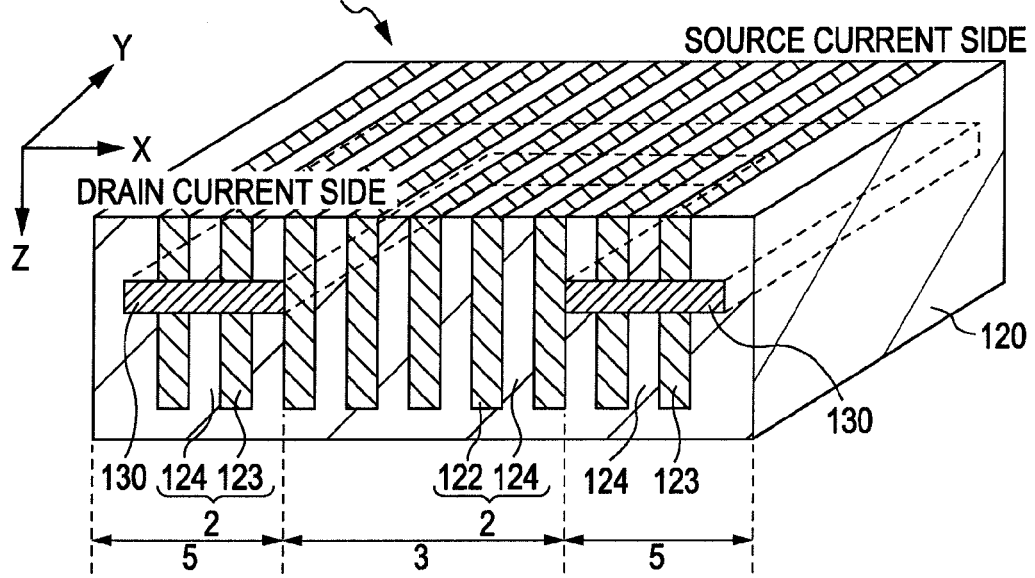
FIG. 2A to FIG. 2C are schematic perspective diagrams illustrating the basic configuration of the semiconductor device.
Figure 2B:
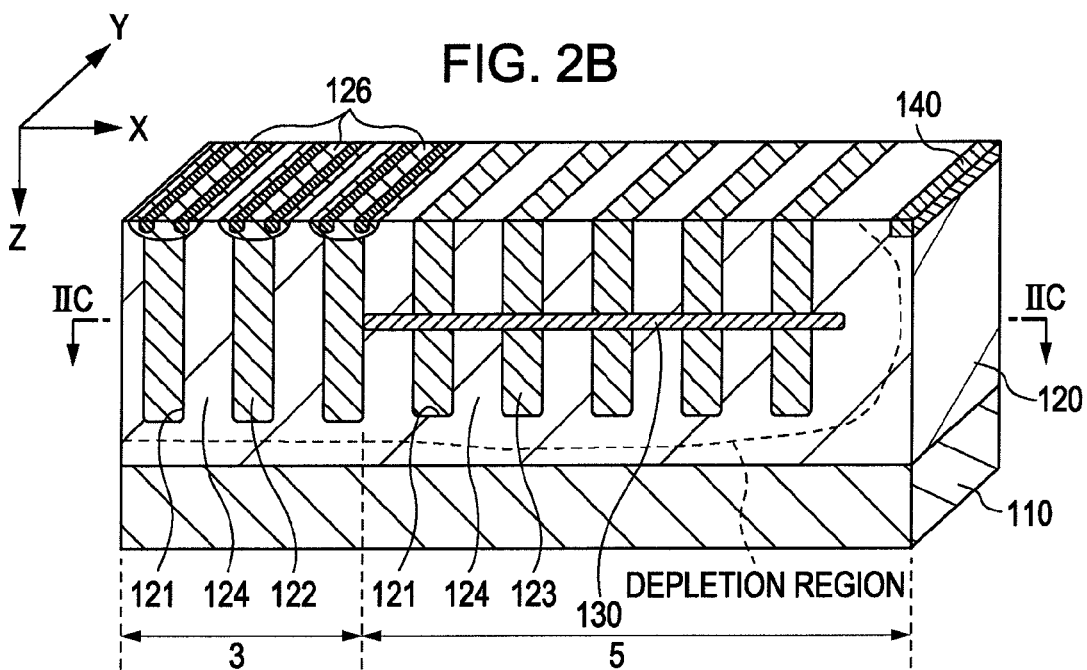
Figure 2C:
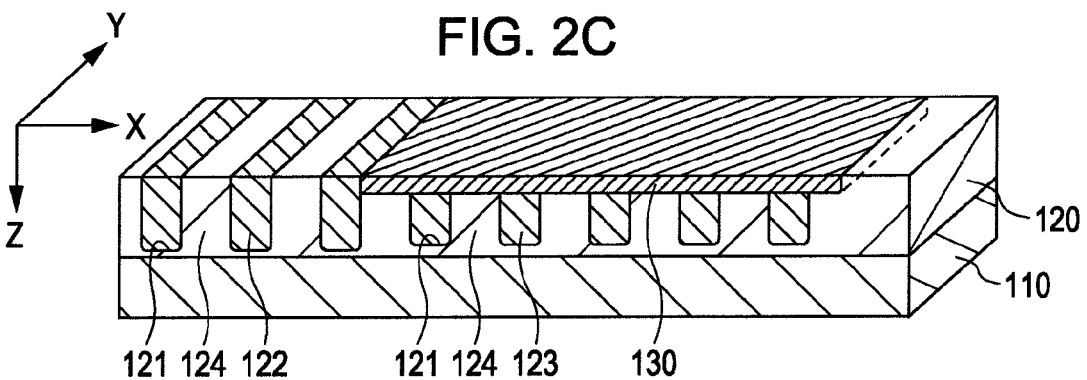
Figure 2D:
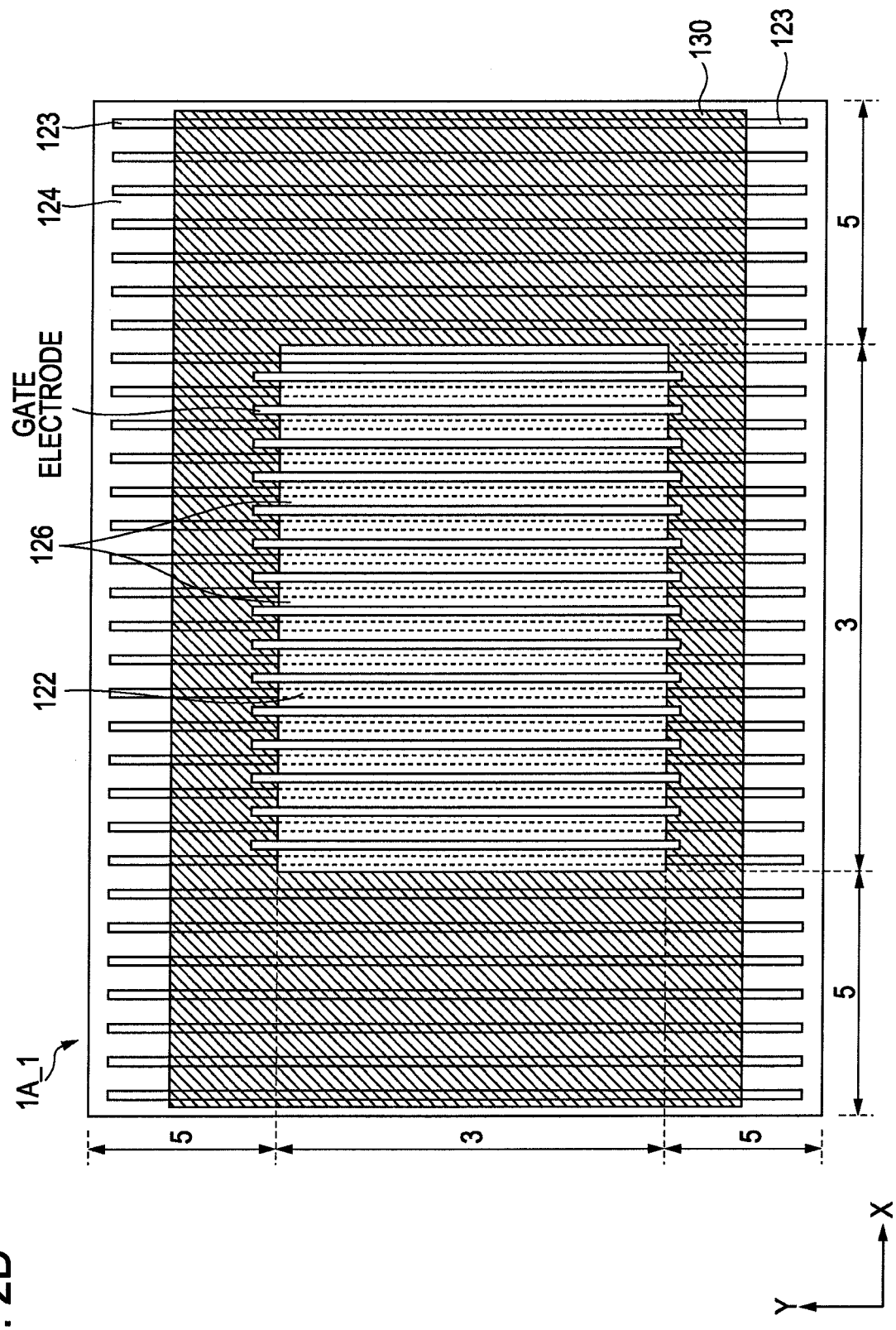
FIG. 2D is a plan view of the semiconductor with reference to the X-Y plane.
Figure 2E:
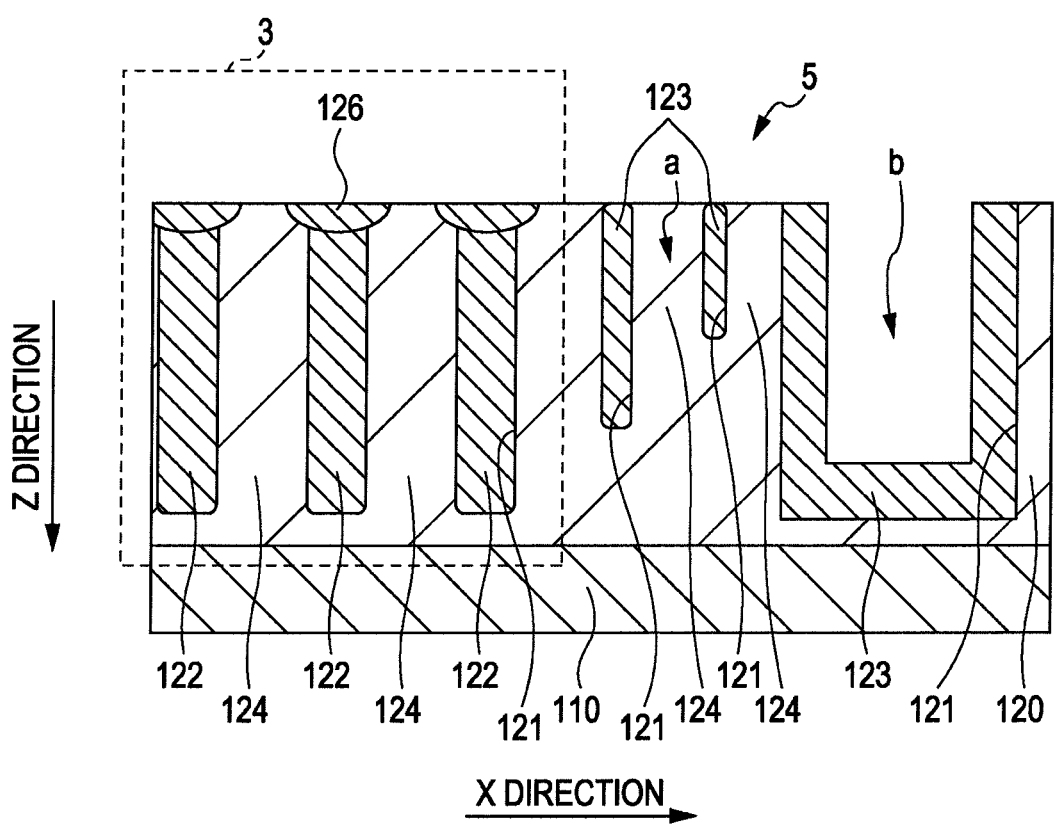
FIG. 2E is a side view of the semiconductor with reference to the X-Z plane.

FIG. 2A to FIG. 2E illustrate the configuration of a semiconductor device 1A_1 according to a first embodiment (basic configuration) of the present invention. Here, FIG. 2A is a perspective diagram schematically illustrating the configuration of almost the half part of the semiconductor device 1A_1. FIG. 2B and FIG. 2C are schematic diagrams illustrating the configuration of the boundary between an element part 3 and a terminal part 5 of the semiconductor device 1A_1, where FIG. 2B is a schematic perspective view of the semiconductor device 1A_1 and FIG. 2C is a cross-sectional view of the semiconductor device 1A_1 along the IIC-IIC line in X-Y directions in FIG. 2B. FIG. 2D is a plan view (transparent view) of the semiconductor device 1A_1 with reference to the X-Y plane in FIG. 2B and the X-Y plane in FIG. 2C. In this figure, a source region is omitted, while both a base region and a gate electrode are illustrated. Any of these diagrams is only provided for diagrammatic illustration of the semiconductor device 1A_1, so that the device will not be limited to the dimensions thereof represented in the figure and the same will apply to any of other embodiments. FIG. 2E is a schematic diagram for illustrating undesired effects of changes in trench groove width and crystal face orientation of a super junction structure when the third manufacturing method is applied.

The semiconductor device 1A_1 of the first embodiment (first example) of the present invention includes, on the surface of a high-concentration n-type substrate 110 (n+ drain layer) which is an example of a first conductive type first semiconductor region with a comparatively high impurity concentration, an n-type epitaxial layer 120 (first conductive type second semiconductor region) whose impurities concentration is lower than the high-concentration n-type substrate 110. Although not illustrated, a drain electrode (first main electrode) is formed on the surface of the high-concentration n-type substrate 110, which is opposite to the side of the n-type epitaxial layer 120.

The n-type epitaxial layer 120 is divided into an element part 3 (super junction element region) and a terminal part 5 surrounding the element part 3. The element part 3 includes an element cell 2 having a parallel p-n structure constructed of a pair of a p-type semiconductor region (p-type pillar region) and an n-type semiconductor region (n-type pillar region). For example, each side of the element part 3 has a length of several millimeters (e.g., 2 to 5 mm) and each side of the terminal part 5 has a length of several hundreds micrometers.

In the element part 3, a plurality of p-type epitaxial buried layers 122 (second conductive second pillar region) is epitaxially grown in the respective trench grooves 121 to form a super junction structure. Likewise, in the terminal part 5, a plurality of p-type epitaxial buried layers 123 (second conductive second pillar region) is epitaxially grown in the respective trench grooves 121 to form a super junction structure. In other words, the p-type epitaxial buried layers 122 and 123 are periodically arranged in a predetermined direction not only in the element part 3 but also in the terminal part 5 from one side of the n-type epitaxial layer 120 facing to the high-concentration n-type substrate 110 to the other side thereof opposite to the base 110. Therefore, the super junction structure is formed and the p-type epitaxial buried layers 122 and 123 are functioned as p-type drift layers. Furthermore, in the n-type epitaxial layer 120, the n-type epitaxial layer 124 has a portion (first conductive first pillar region) sandwiched between the p-type epitaxial buried layer 122 and the p-type epitaxial buried layer 123. Such a portion is functioned as an n-type drift layer.

The n-type epitaxial layer 120 includes impurities uniformly distributed all over the surface, so that the impurity concentrations of the respective n-type epitaxial layers 124 in the element part 3 and the terminal part 5 are equal to each other. In addition, the impurity concentration of the element part 3 and that of the terminal part 5 are equal to each other when the trench grooves 121 are filled up. Thus, the impurity concentrations of the respective p-type epitaxial embedded layers 122 and 123 are equal to each other.

On the periphery of the terminal part 5, a channel stopper 140 is formed on the surface of the n-type epitaxial layer 120 on the side of the source electrode. The same will be applied to any of other embodiments which will be described later. A p-type base region 126 is selectively formed near the surface of the p-type epitaxial buried layer 122, which is opposite to the side of the high-concentration n-type substrate 110, so that it may connect with the p-type epitaxial buried layer 122.

In addition, but not shown in the figure, an n+ source region and a contact region in contact with a source electrode are formed on the surface of a p-type base region 126. A source electrode (second main electrode) is formed so that it will touch the surface of each of the n+ source region and the p-type base region 126. On the side of the surface of the n-type epitaxial layer 120, which is located on the side of the source electrode, a gate (control electrode) is formed on the surface of the n-type pillar diffused layer 124 sandwiched between the adjacent p-type base regions 126 and the surfaces of these adjacent p-type base regions 126 and their n+ source regions through a gate insulating film so as to be surrounded by the source electrodes.

On the whole, the semiconductor device 1A has a super junction structure where P-type epitaxial buried layers 122 or 123 and n-type epitaxial layers 124 are alternately arranged in a repetitive manner in the n-type epitaxial layer 120 formed on the high-concentration n-type substrate 110. The high-concentration n-type substrate 110 on the bottom side of the semiconductor device 1A is provided for a high voltage electrode (drain electrode) and the side thereof opposite to the high-concentration n-type substrate 110 is provided for a low voltage electrode (source electrode). This low-voltage electrode is usually used at a ground potential.

The cross-sectional structures of the p-type pillar region (p-type epitaxial buried layers 122 and 123) and the n-type pillar region (n-type epitaxial layer 124) represent a pair of a p-type column-shaped semiconductor region and an n-type column-shaped semiconductor region. In other words, the p-type epitaxial layers 122 and 123 are formed in their respective column shapes (extending in the Y direction) and arranged in the n-type epitaxial layer 120 provided as an n-type pillar region. The n-type epitaxial layer 124, the n-type column-shaped semiconductor region, is sandwiched between the adjacent p-type epitaxial buried layers 122 or 123. The n-type epitaxial layer 124 is formed in a column shape and arranged in the n-type epitaxial layer 120.

On the other hand, the plane structures of the p-type pillar region and the n-type pillar region are represented so that the p-type epitaxial buried layers 122 and 123 are formed in stripe shapes and arranged in the n-type epitaxial layer 120 provided as an n-type pillar region. The n-shaped epitaxial layer 124, the n-type column-shaped semiconductor region, sandwiched between the p-type epitaxial buried layers 122 and 123 is formed in stripe shape and arranged in the n-type epitaxial layer 120. The p-type base regions 126, n+ source regions, source electrodes, and gate electrodes are also formed in stripe shapes in the same direction as that of the p-type epitaxial buried layers 122 and 123. In the element part 3, the pitch of the high breakdown voltage structure in the super junction structure (repetition pitch of the p-type epitaxial buried layers 122 and 124) is generally about ten and several micrometers to several tens micrometers. In the present example, a field-effect transistor (FET) gate pitch as a switch is matched with the pitch of the super junction structure.

Such a structure allows a semiconductor device 1A to be constructed of an n-channel MOSFET for electron injection, where the surface of a p-type base region 126 directly under the gate insulating film. The trench grooves and the p-type silicon epitaxial layer (p-type epitaxial buried layers 122 and 123) filling the trench grooves, which construct the super junction structure, are formed in stripe shapes extending in the Y direction and arranged in parallel with each other. In this case, it is noted that, in the terminal part 5 around the element part 3, the stripes extend in the longitudinal direction (Y direction) along not only the element part 3 (device body) but also the terminal end 5. In the X direction, also, the stripes are arranged in parallel with each other in the terminal part 5 with substantially the same pitch and substantially the same shape (the same dimensions: width and depth) as those in the element part 3. Here, the term "width" means a width in the direction (X direction) along which the p-type epitaxial buried layers 122 and 124 and the n-type epitaxial layers 124 are alternately appeared at the same depth position. The term "substantially the same" means that it may have a difference of several percents (e.g., 5% or less). In this case, the trench grooves 121 for forming the p-type epitaxial buried layer 122 and the p-type epitaxial buried layer 123 are relatively formed so that they have substantially the groove width and substantially the same groove distance (arrangement pitch), but such an arrangement of the trench grooves 121 is not necessary. However, the device can be uniformly formed as long as they are substantially the same and advantageously contributes to a high breakdown voltage of the terminal part 5.

Furthermore, in the semiconductor device 1A_1, the super junction structure is combined with a lateral RESURF structure that functions as a p-type depletion layer extending layer (depletion layer extending region) to provide the terminal part 5 with a high breakdown voltage to stabilize the characteristics of the semiconductor device 1A_1. Especially, one of advantageous features of the semiconductor device 1A_1 of the first embodiment is that the lateral RESURF structure (p-type depletion layer extending layer) of the terminal part is formed in the n-type epitaxial layer 120. Furthermore, the semiconductor device 1A_1 is different from one of the first embodiment (third modified example) as described later in that only the terminal part 5 is provided with one p-type lateral RESURF region 130 in the n-type epitaxial layer 120 sandwiched between the drain electrode and the source electrode.

As an example, the n-type epitaxial layer 120 is roughly divided into almost halves in the Z direction (depth direction). Then, a p-type lateral RESURF region 130 is formed on the divided position (i.e., the middle portion: almost at ½ from the bottom of the Z direction). However, it is not desirable to divide the n-type epitaxial layer 120 equally. For example, the p-type lateral RESURF region 130 may be arranged at a position almost ⅓ from the bottom. However, it is preferable to equally device the layer 120. Although an increase in number of steps is inevitable when the lateral RESURF structure is employed, a high stable breakdown voltage is preferentially realized by forming a p-type lateral RESURF region 130 in the terminal part 5.

That is, the p-type lateral RESURF region 130 with a predetermined impurity concentration is formed in the terminal part 5. In addition, the p-type lateral RESURF region 130 is almost formed over the entire surface of the terminal part 5 so as to connect with the n-type epitaxial layer 124 at the boundary thereof with the element part 3 and to surround the element part 3. The p-type lateral RESURF region 130 (p-type semiconductor region) functioned as a depletion layer extending region is formed only in the middle of the n-type epitaxial layer 120 in the terminal part 5 around the element part 3 so as to be perpendicular to both the p-type epitaxial buried layer 123 (p-type pillar region) and the n-type epitaxial layer 124 (n-type pillar region), or in parallel with both the surface of the drain electrode and the surface of the drain electrode. As the p-type lateral RESURF region 130 is provided, the function of the depletion layer extending region produces a reduction in electric field upon switching off. Thus, a high breakdown voltage is obtained stably.

The p-type epitaxial buried layer 123 (i.e., the p-type pillar region) has a vertical RESURF structure and a combination thereof with a lateral RESURF structure having a depletion layer extending function may obtain a higher breakdown voltage.

Each of the p-type epitaxial buried layers 123 of the terminal part 5 is not brought into an electrically floating state but a least part thereof is designed to electrically connect to the p-type lateral RESURF region 130. The p-type lateral RESURF region 130 connects with, for example, the p-type epitaxial buried layer 122 located at the boundary portion of the element part 3 with the terminal part 5 to electrically connect to the source electrode.

Here, the p-type epitaxial buried layers 122 and 123 are formed using the third manufacturing method. That is, the p-type epitaxial buried layers 122 and 123 (second conductive type stripe-shaped pillar region) with substantially the same dimensions (width and depth) and substantially the same pitch are formed in the predetermined direction over the entire area of the device in addition to the formation of trench grooves 121 and the epitaxial growth of the p-type (second conductive) semiconductor.

In this way, the semiconductor device 1A_1 of the first embodiment is a device in which the p-type epitaxial buried layers 122 (semiconductor P region) and the n-type epitaxial layers 124 (semiconductor N region) are alternately arranged in a repetitive manner and completely depleted when reversely biased.

The n-type epitaxial layer 124 (first conductive pillar region) is formed over the entire surface of the substrate. In contrast, the p-type epitaxial buried layers 122 (second conductive pillar region) of the element part 3 are formed as repetitive stripe grooves.

In addition, the p-type epitaxial buried layer 123 is formed in the terminal part 5 surrounding the element part 3 (periphery region), extending in the same direction as that of the p-type epitaxial buried layer 122 and being arranged in a manner similar to that of the p-type epitaxial buried layer 122.

That is, the p-type epitaxial buried layers 123 are extended in the same direction as that of the striped p-type epitaxial buried layer 122 and spaced apart from one another in the direction along which stripes are repetitively arranged.

When forming the structure, the n-type region (n-type epitaxial layer 124) is formed using a fist conductive n-type epitaxial substrate (n-type epitaxial layer 120). The P region (p-type epitaxial buried layers 122 and 123) is formed by forming trench grooves in the n-type epitaxial layer 120 and filling the trench grooves with the p-type semiconductor by epitaxial growth. At this time, the width of trench, the opening of trench, and crystal face orientation are set to constant levels.

By employing the above configuration of the device and the manufacturing method thereof, the silicon substrate can be prevented from causing various kinds of crystal face orientation at the time of forming trench grooves and p-type epitaxial buried layers 122 and 123. The crystal face orientation and the trench opening area ratio are uniformly realized in the chip (i.e., the element part 3) and the entire area of the wafer (i.e., up to the terminal part 5). Therefore, a stable super junction structure can be obtained when manufacturing the device. In addition, optimization of patterns can be easily examined and the patterns can be easily designed without depending on specifications. The terminal part 5 is formed with the same structure as that of the element part 3. Therefore, the semiconductor device 1A_1 can be manufactured cheaply without an increase in number of steps.

For example, as shown in FIG. 2E, it is considered that the trench groove for p-type epitaxial buried layer 123 of the terminal part 5 is smaller than the trench groove for p-type epitaxial buried layer 122 of the element part 3. In other words, as indicated by the arrow "a", the trench groove in the terminal part 5 is formed so that the opening size (width) thereof is smaller than that of the trench groove in the element part 3. However, if the opening size (width) of the trench groove is small, the depth of etching is generally small. Thus, the dimensions of the p-type epitaxial buried layer 122 become unstable.

In contrast, furthermore, if the trench groove for the p-type epitaxial buried layer 123 of the terminal part 5 is broadened than the trench groove for the p-type epitaxial buried layer 22 of the element part 3. In other words, as indicated by the arrow b, the trench groove in the terminal part 5 is formed so that the opening size (width) thereof is larger than that of the trench groove in the element part 3. However, if the opening size (width) of the trench groove is too large, or the aspect ratio (depth/width) thereof is too small, the trench groove may be hardly filled by epitaxial growth at the time of subsequent formation of the p-type epitaxial buried layer 123.

In addition, but not shown in the figure, if the direction of the trench groove for the p-type epitaxial buried layer 123 in the terminal part 5 is different from (e.g., perpendicular to) the direction of the trench groove for the p-type epitaxial buried layer 122 of the element part 3, the trench groove may be hardly filled by epitaxial growth or the epitaxial growth may be abnormally occurred at the time of subsequent formation of the p-type epitaxial buried layer 123 because of an influence of the crystal face orientation of the substrate (n-type high concentration substrate 110).

On the other hand, in the case of the semiconductor device 1A_1 of the first embodiment, at the time of trench groove formation, the etching shape is kept constant by fixing to crystal face orientation and a predetermined shape (rectangle stripe with a longitudinal direction). In addition, at the time of filling the trench groove by epitaxial growth of p-type semiconductor, the conditions of epitaxial growth can be kept constant because of constant crystal face orientation and shape. The characteristics of the terminal part 5 become stable. As a result, a high breakdown voltage of the terminal part 5 can be attained.

In this way, the semiconductor device 1A_1 of the first embodiment (first example) is provided as a device having a periphery region with a super junction structure constructed of trench groups and a p-type epitaxial buried layer. A potential transfer can be improved and easily performed by the RESURF structure to a recovery delay of the reverse diode which provides a periphery floating structure for ensuring a high breakdown voltage. In addition, since the p-type lateral RESURF region 130, which is functioned as a depletion layer extending region, is present in the terminal part 5, an area to be deleted when applying a drain current (when switching off) is extended to the terminal part 5. Thus, the structure of the device can prevent an electric force from being concentrated. A suitable layout in which the p-type lateral RESURF region 130 is placed on almost the middle of the n-type epitaxial layer 120 makes it easy to design the shape of a depletion layer with a curvature formed when applying a drain voltage. As a result, the breakdown voltage of the terminal part 5 is improved while keeping the impurity concentration of the n-type epitaxial layer at high concentration of impurity in the n-type epitaxial layer. In other words, the impurity concentrations of the respective n-type epitaxial layers 124 in the element part 3 and the terminal part 5 are equal to each other, so that the MOSFET process design of the super junction structure can be simplified.

The impurity concentration of the n-epitaxial layer 124 in the element part 3 can be equal to the impurity concentration of the n-epitaxial layer 124 in the terminal part 5. Thus, it is not desirable to reduce only the impurity concentration of the n-type epitaxial layer 124 in the terminal unit 5 to ensure breakdown voltage. An optimal structure of the terminal part 5 is provided for the super junction structure constructed of trench grooves 121 and the p-type epitaxial buried layers 122 and 123. As the n-type epitaxial layer 124 is allowed to contain impurities at higher concentration, the semiconductor device 1A_1 with small on-resistance can be realized.

The p-type lateral RESURF region 130 that functions as a depletion layer extending region formed in the terminal part 5 is electrically connected to the p-type pillar region (p-type epitaxial buried layer 123) which has been in a floating state in the terminal part 5 when the present invention is not applied. Thus, the transmission of hall current, which is generated when the breakdown with serge voltage or avalanche breakdown generated at the time of switching operation with inductive load or recovery delay of reverse diode occurs, is facilitated. As a result, overload capacities to these phenomena can be improved.

Manufacturing Method

First Embodiment: Basic Configuration

Figure 3A:
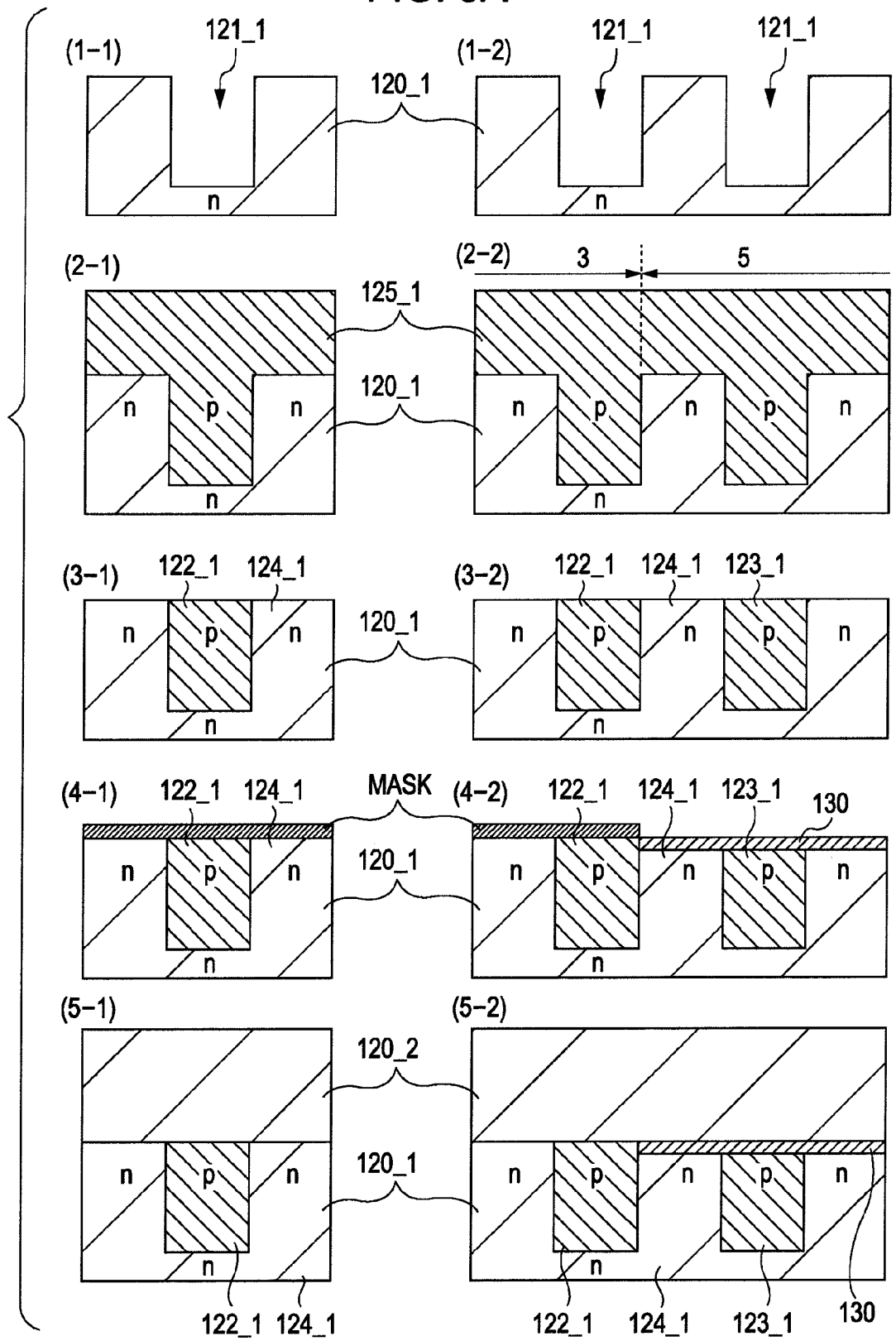
FIG. 3A and FIG. 3B are schematic cross sectional view for illustrating the respective steps in the manufacturing process.
Figure 3B:
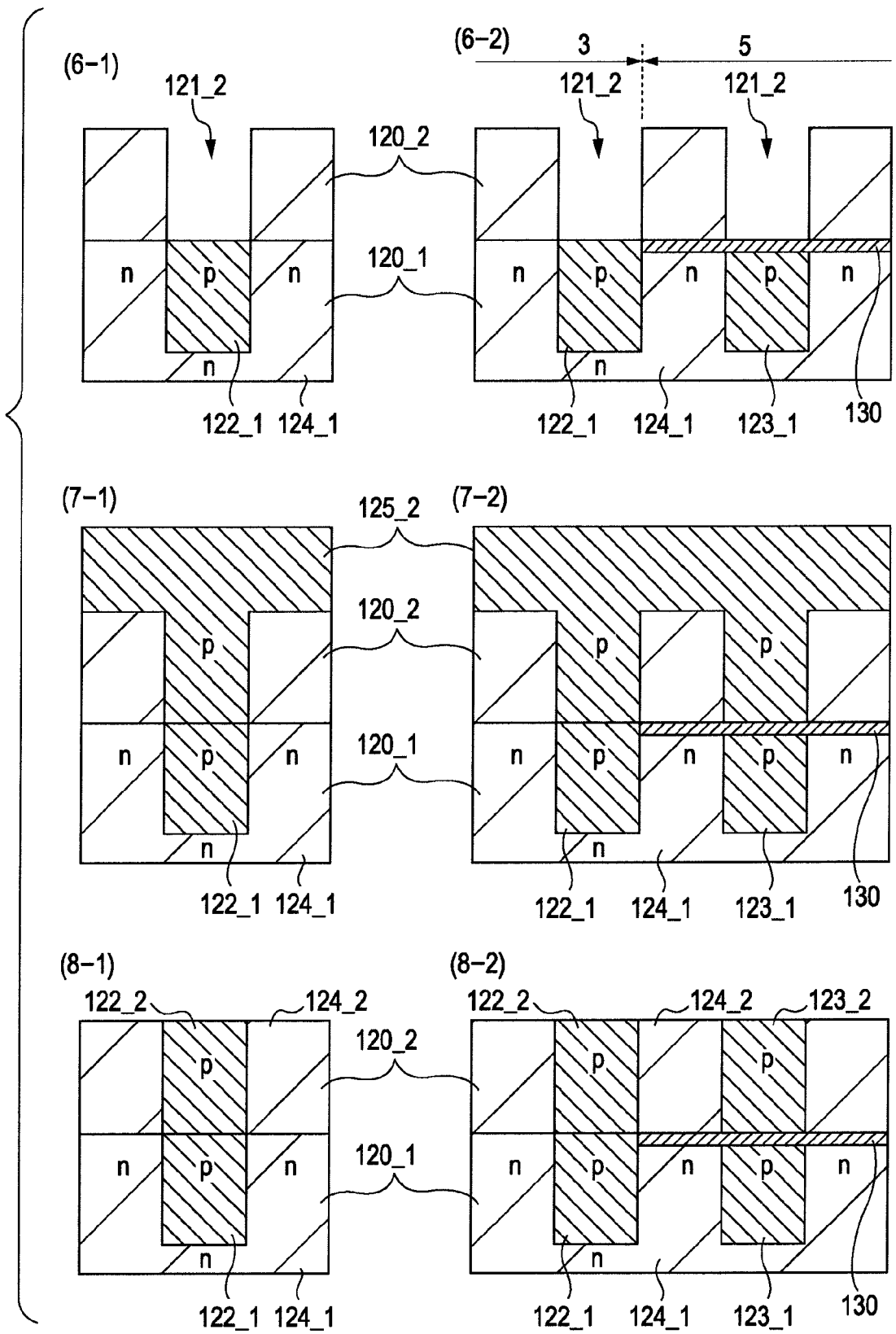

FIG. 3A and FIG. 3B illustrate an exemplary process for manufacturing the semiconductor device 1A_1 having the basic configuration according to the first embodiment. In each figure, each of the parenthetical numerals, (*_1), on the left side corresponds to the middle portion of the element part 3 and ach of the parenthetical numerals, (*_2), on the right side corresponds to the boundary between the element part 3 and the terminal part 5. Alternatively, the (*_1) on the left side and the (*_2) on the right side may be collectively referred to as (*) The same will be applied to any of other embodiments which will be described later.

As described above, trench grooves are formed in a thick epitaxial layer (n-type epitaxial layer 120). P-type epitaxial buried layers 122 and 123 are formed by a method of filling trench grooves once formed with silicon doped with impurities by epitaxial growth (third manufacturing method; trench-formation epitaxial-refilling method). At this time, the process may be performed in consideration of forming a p-type lateral RESURF region 130 on the middle portion of the n-type epitaxial layer 120 in the terminal part 5.

For example, trench-embedded crystal growth with a low aspect ratio is repeated twice. First, an n-type epitaxial layer 120_1 is formed up to one half of the desired film thickness on a high-concentration n-type substrate 110 (drain layer). Then, a trench-shaped groove (trench groove 121_1) is formed in each of the element part 3 and the terminal part 5 by etching processing using a photoresist or an oxidized film hard mask with an aspect ratio enough to fill one half of the depth D of each of the p-type epitaxial buried layers 122 and 123, which will be finally desired (FIG. 3A, (1-1), (1-2)). At this time, the trench grooves 121_1 for the p-type epitaxial buried layers 122 and 123 are formed throughout the device so that they have substantially the same dimensions (width and depth) and substantially the same pitch in a certain direction. In other words, the dimensions and repetition pitch of the trench grooves 121_1 are constant over the entire device. Subsequently, the trench grooves 121_1 are filled with p-type semiconductor by epitaxial growth. For example, a p-type epitaxial buried layer 125_1, which will become p-type epitaxial buried layers 122_1 and 123_1 later, is epitaxially grown to fill the trench grooves 121_1 (FIG. 3A, (2-1), (2-2)). Furthermore, a chemical mechanical polishing (CMP) technique or the like is employed to reduce the p-type epitaxial buried layer 125_1 until the surface of the n-type epitaxial layer 124 is exposed, thereby obtaining p-type epitaxial buried layers 122_1 and 123_1 embedded in the trench grooves 121_1 (FIG. 3A, (3-1), (3-2)).

Furthermore, the device is covered with a photoresist mask or the like and then subjected to patterning, followed by ion injection of a predetermined concentration of p-type semiconductor which forms a p-type lateral RESURF region 130 into only the terminal part 5 (FIG. 3A, (4-1), (4-2)). In this case, the patterning may cover at least the element part 3, so that it may not cover each of the p-type epitaxial buried layers 123. Therefore, a p-type lateral RESURF region 130 is formed only on the terminal part 5 so that it may cover the p-type epitaxial buried layer 123_1 and the n-type epitaxial layer 124.

Subsequently, an n-type semiconductor at a predetermined concentration is epitaxially grown to a desired film thickness so that it may continuously cover the p-type lateral RESURF region 130 which is formed to cover the p-type epitaxial buried layer 122_1 and n-type epitaxial layer 124_1 of the element part 3 and the p-type epitaxial buried layer 123_1 and the n-type epitaxial layer 124_1 of the terminal part 5 (FIG. 3A (5-1), (5-2)). Therefore, n-type epitaxial layers 120_2 having substantially the same film thickness (depth) as that of the p-type epitaxial buried layers 122_1 and 123_1 are formed.

Furthermore, a trench groove 121_2 which is aligned with the trench groove 121_1 is formed in the n-type epitaxial layer 120_2 (FIG. 3B (6-1), (6-2)). Furthermore, the trench groove 121_2 is filled with p-type semiconductor by epitaxial growth. For example, the trench groove 121_2 is filled with the p-type epitaxial buried layer 125_2 by epitaxial growth to cover the n-type epitaxial layer 120_2 (which will become an n-type epitaxial layer 124_2 later), the p-type epitaxial buried layer 122_1, and the p-type lateral RESURF region 130 (FIG. 3B, (7-1), (7-2)).

After filling the trench groove 121_2 with the p-type semiconductor (p-type epitaxial buried layer 125_2) that forms p-type epitaxial buried layers 122_2 ad 123_2, the p-type epitaxial buried layer 125_2 is reduced by the CMP technique or the like until the surface of the n-type epitaxial layer 124_2 is exposed by the CMP technologies or the like, followed by subjecting the surface with mirror finish. As a result, the p-type epitaxial buried layers 122_2 and 123_2 embedded in the trench grooves 121_2 are obtained (FIG. 3B, (8-1), (8-2)).

After mirror-finishing the surface by the CMP technique or the like, a MOSFET with the super junction structure is completely formed in the element part 3 by forming a base region, a gate insulating film, a gate electrode, a source region, a source electrode, and the like. In the terminal part 5, a channel stopper is formed on the surface of the n-type epitaxial layer 120 located around the terminal part 5. In addition, a source electrode is formed to cover substantially the whole surface of the element part 3 and the terminal part 5. Therefore, the p-type lateral RESURF region 130 is electrically connected to the source electrode.

Therefore, in the n-type epitaxial layer 120 formed on the high-concentration n-type substrate 110, the p-type epitaxial buried layers 122 and 123 and the n-type epitaxial layers 124 have substantially the same dimensions (width and depth) and are alternately arranged at substantially the same pitch in a repetitive manner to form a super junction structure. The n-type epitaxial layer 124 is directly constructed of the n-type epitaxial layer 120 itself. Each of the p-type epitaxial buried layers 122 and 123 is formed by filling the trench groove 121 formed in the n-type epitaxial layer 120 with p-type semiconductor doped with a predetermined concentration of impurities by epitaxial growth. The p-type epitaxial buried layers 122 and 123 have the same dimensions and are arranged with substantially the same pitch in a certain direction over the entire area of the device. It continues throughout a device, and it is approximately same size and an approximately same pitch, and p-type epitaxial buried layer 122, 123 is also formed in the fixed direction of epitaxial formation of an n-type semiconductor to trench groove 121.

Thus, the manufacturing method of the semiconductor device 1A_1 of the first embodiment (basic configuration) carries out the embedded crystal growth with relative ease. In addition, he super junction structure can be formed so that the number of crystal growth repetition is smaller than that of the process of repeating the ion injection and the embedded crystal growth.

Furthermore, trench-embedded crystal growth with a low aspect ratio is repeated two or more times.

Thus, the completed device with a high aspect ratio can be easily formed by embedded crystal growth. Namely, in the third manufacturing method in which the trench groove is formed and then filled by crystal growth may principally carry out embedding and growth steps one times. However, the aspect ratio of the trench groove expected for the super junction structure is comparatively high (e.g., five or more are requested). Thus, the normal epitaxial growth is difficult to realize such embedded crystal growth at a time. Therefore, as a manufacturing method for high aspect ratio, any special process, a silicon-deep etching technique such as anisotropic etching and LIGA process, may be necessary. In this case, an increase in production costs may occur but the present embodiment overcomes such a disadvantage.

First Embodiment

First Modified Example

Figure 4D:
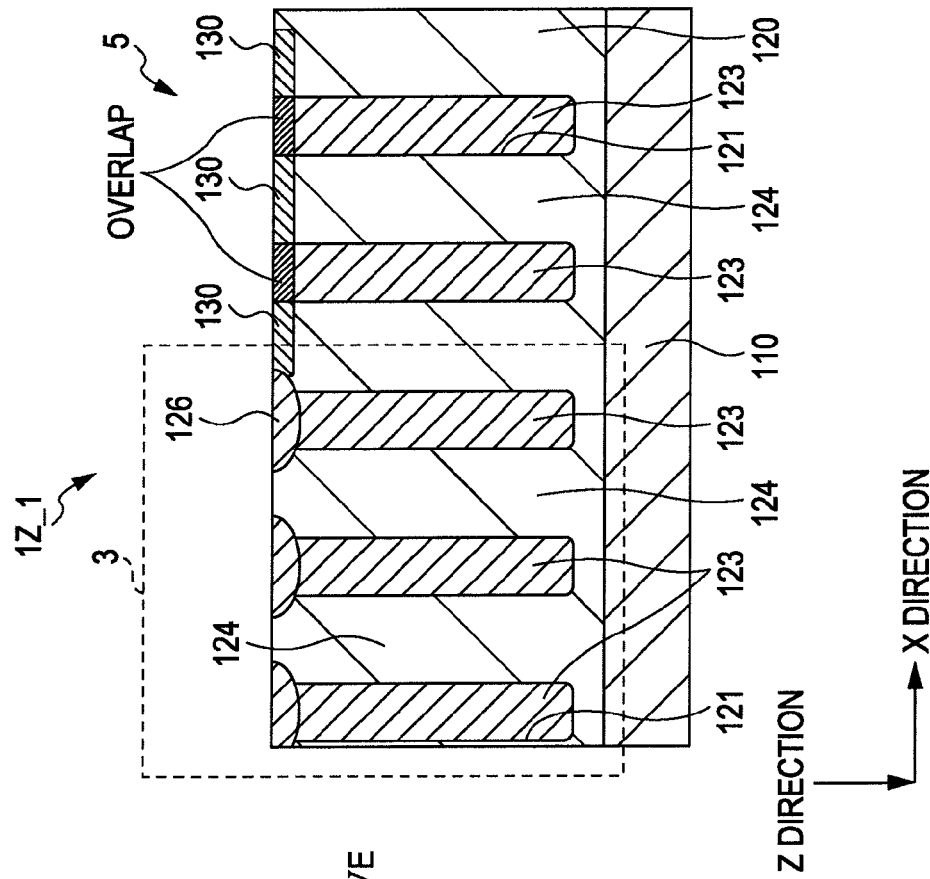
FIG. 4D is a plan view of the semiconductor with reference to the X-Y plane.

FIG. 4A to FIG. 4E illustrate the configuration of a semiconductor device 1A_2 according to the first embodiment of the present invention (first modified example). Here, FIG. 4A is a perspective diagram schematically illustrating the configuration of almost the half part of the semiconductor device 1A_2. FIG. 4B and FIG. 4C are schematic diagrams illustrating the configuration of the boundary between an element part 3 and a terminal part 5 of the semiconductor device 1A_2, where FIG. 4B is a schematic perspective view of the semiconductor device 1A_2 and FIG. 4C is a cross-sectional view of the semiconductor device 1A_2 along the IVC-IVC line in X-Y directions in FIG. 4B. FIG. 4D is a schematic diagram for illustrating undesired effects of applying a lateral RESURF structure to a super junction structure.

Principally, a semiconductor device 1A_2 of the first embodiment (first modified example) has the same configuration as that of the semiconductor device 1A_1 of the first embodiment (basic configuration) with respect to the structure of a p-type epitaxial buried layer 123, except for the structure of a p-type lateral RESURF structure 130 of the terminal part 5. In other words, in the first modified example, some modifications are applied to the p-type lateral RESURF structure 130. The basic idea of such modifications is to have a structure of keeping a p-type lateral RESURF region 130 from overlapping from a p-type pillar when forming the p-type lateral RESURF region 130.

Figure 4E:
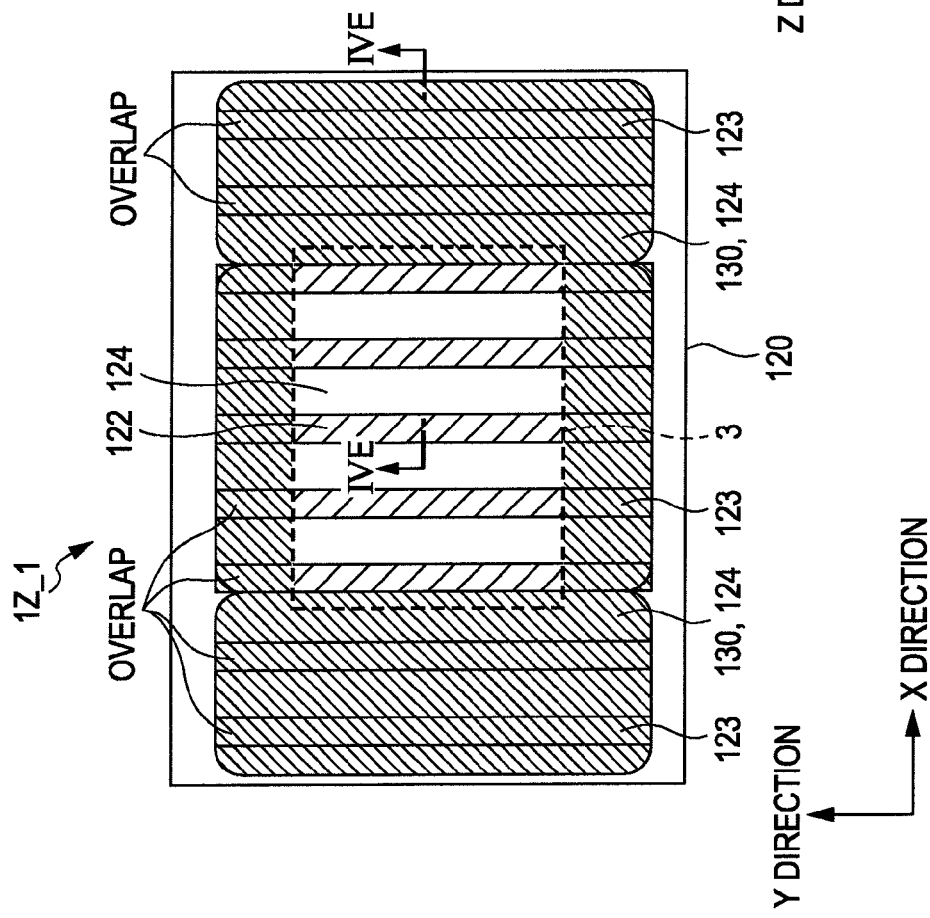
FIG. 4E is a side view of the semiconductor with reference to the X-Z plane.

The p-type epitaxial buried layer 123 (i.e., the p-type pillar region) has a vertical RESURF structure and a combination thereof with a lateral RESURF structure having a depletion layer extending function may obtain a higher breakdown voltage. In this case, however, it is considerable that an increase in concentration of impurities in an area where the p-type epitaxial buried layer 123 and the p-type lateral RESURF region 130 are simultaneously formed may cause some disadvantages (e.g., a decrease in breakdown voltage and a decrease in electric field balance). In other words, the area where the p-type pillar region and the p-type lateral RESURF region are overlapped becomes a p-type structure with an excess amount (high concentration) of impurities because of influx of impurities from both regions. Therefore, as in the case of a semiconductor device 1Z of a third comparative example as shown in FIG. 4D and FIG. 4E, it may leads to do not satisfy the conditions of depletion. In actual, an expected high breakdown voltage will not be obtained.

For solving such disadvantages, the formation of a lateral RESURF region may be performed so that it can be prevented from overlapping with the p-type pillar region and major portions of the terminal part 5 can be depleted. A p-type epitaxial buried layer 123 is selectively formed on a portion (n-type epitaxial layer 124) that divides the adjacent stripes (p-type epitaxial buried layers 123) while avoiding a contact with the p-type epitaxial buried layer 123 and being substantially continued.

The phrase "while avoiding a contact with the p-type epitaxial buried layer 123 and being substantially continued" means that the chance of overlapping between the p-type epitaxial buried layer 123 and the p-type lateral RESURF region 130 is small. It means that a p-type RESURF region is selectively formed in the middle portion of the n-type epitaxial layer 120 so that it does not overlap the p-type epitaxial buried layer 123 as much as possible.

It is optimal that the p-type epitaxial buried layer 123 and the p-type lateral RESURF region 130 substantially extend without interruption in a state of without any overlap at all. Alternatively, they may be overlapped in some degree. It is because the p-type epitaxial buried layer 123 may keep from overlapping with the p-type lateral RESURF region 130 as much as possible. The phrase "substantially extend without interruption" means that, in a planar state, a depletion layer continuously extends in the lateral direction along the p-type lateral RESURF region 130 which a lateral p-type semiconductor region. When viewing the plane of the middle portion, the surface area of the portion where the p-type lateral RESURF region 130 is not placed on the p-type epitaxial buried layer 123 may be smaller than the surface area of the overlapped portion where the p-type lateral RESURF region 130 is placed on the p-type epitaxial buried layer 123. For example, an appropriate surface area of the p-type lateral RESURF region 130 may be arranged on a portion where the adjacent p-type epitaxial buried layers are isolated from each other. In this case, the p-type epitaxial buried layer 123 and the p-type lateral RESURF region 130 may be overlapped in some degree.

Each of the p-type epitaxial buried layers 123 of the terminal part 5 is not brought into an electrically floating state but a least part thereof is designed to electrically connect to the p-type lateral RESURF region 130. The p-type lateral RESURF region 130 connects with, for example, the p-type epitaxial buried layer 122 located at the boundary portion of the element part 3 with the terminal part 5 to electrically connect to the source electrode. The p-type pillar domain (p-type epitaxial buried layer 123) is electrically connected to the p-type lateral RESURF region 130 (depletion layer extending region) formed in the terminal part 5. Thus, the transmission of hall current, which is generated when the breakdown with serge voltage or avalanche breakdown generated at the time of switching operation with inductive load or recovery delay of reverse diode occurs, is facilitated. As a result, overload capacities to these phenomena can be improved.

For example, while arranging the p-type lateral RESURF region 130 in the terminal part 5, the whole p-type lateral RESURF region 130 is arranged outside the area of the p-type epitaxial buried layer 123 (hereinafter, such an arrangement is referred to as a first structure). The entire surface of the p-type epitaxial buried layer 123 excludes the p-type lateral RESURF region 130. Thus, it is a preferable structure because of no overlapped portion. For example, the p-type lateral RESURF region 130 may be arranged on a portion where the adjacent p-type epitaxial buried layers 123 are isolated from each other. Substantially the entire surface of the terminal portion 5 (except for portion of the p-type epitaxial buried layer 123) is not necessarily covered with the p-type lateral RESURF region 130.

For example, patterns for forming trench grooves may have substantially the same dimensions (width and depth) and substantially the same pitch. In this case, the formation of patterns of p-type lateral RESURF regions 130 having the same dimensions and substantially the same pitch can be realized. Although an increase in number of steps is inevitable when the lateral RESURF structure is employed, a high stable breakdown voltage is preferentially realized by forming a p-type lateral RESURF region 130 in the terminal part 5, while the p-type layers are kept from overlapping one another in the terminal part 5.

In the semiconductor device 1A_2 of the first embodiment (first modified example) of the present invention, the p-type lateral RESURF region 130 is selectively formed on a separate portion (the surface of the n-type epitaxial layer 124) of repetition in the direction perpendicular to the elongation direction of stripes (p-type epitaxial buried layer 123) to keep the p-type epitaxial buried layer 123 from overlapping with the p-type lateral RESURF region 130. Therefore, the area of highly concentrated portion where the epitaxial patterns for p-type repetitive periphery embedding and the p-type RESURF structure are overlapped one another is reduced. As a result, the major portions of terminal part 5 are appropriately depleted. The potential of an independent floating p-type buried layer (p-type epitaxial buried layer 123) is stabilized to realize an improvement in recovery characteristic of a reverse diode and ensure a high breakdown voltage. The terminal part 5 of the semiconductor device 1A_1 has a structure that the concentration of electric field is avoided during the application of voltage. As a result, an increase in impurity concentration of the whole N region (the n-type epitaxial layer 120 and the n-type epitaxial layer 124) leads to a decrease in on-resistance. In addition, the formation of patterns for the p-type lateral RESURF region 130 may be formed by reversing from patterns of p-type buried layer (p-type epitaxial buried layer 123) in the terminal part 5, thereby facilitating the pattern arrangement.

Manufacturing Method

First Embodiment: First Modified Example

Figure 5A:
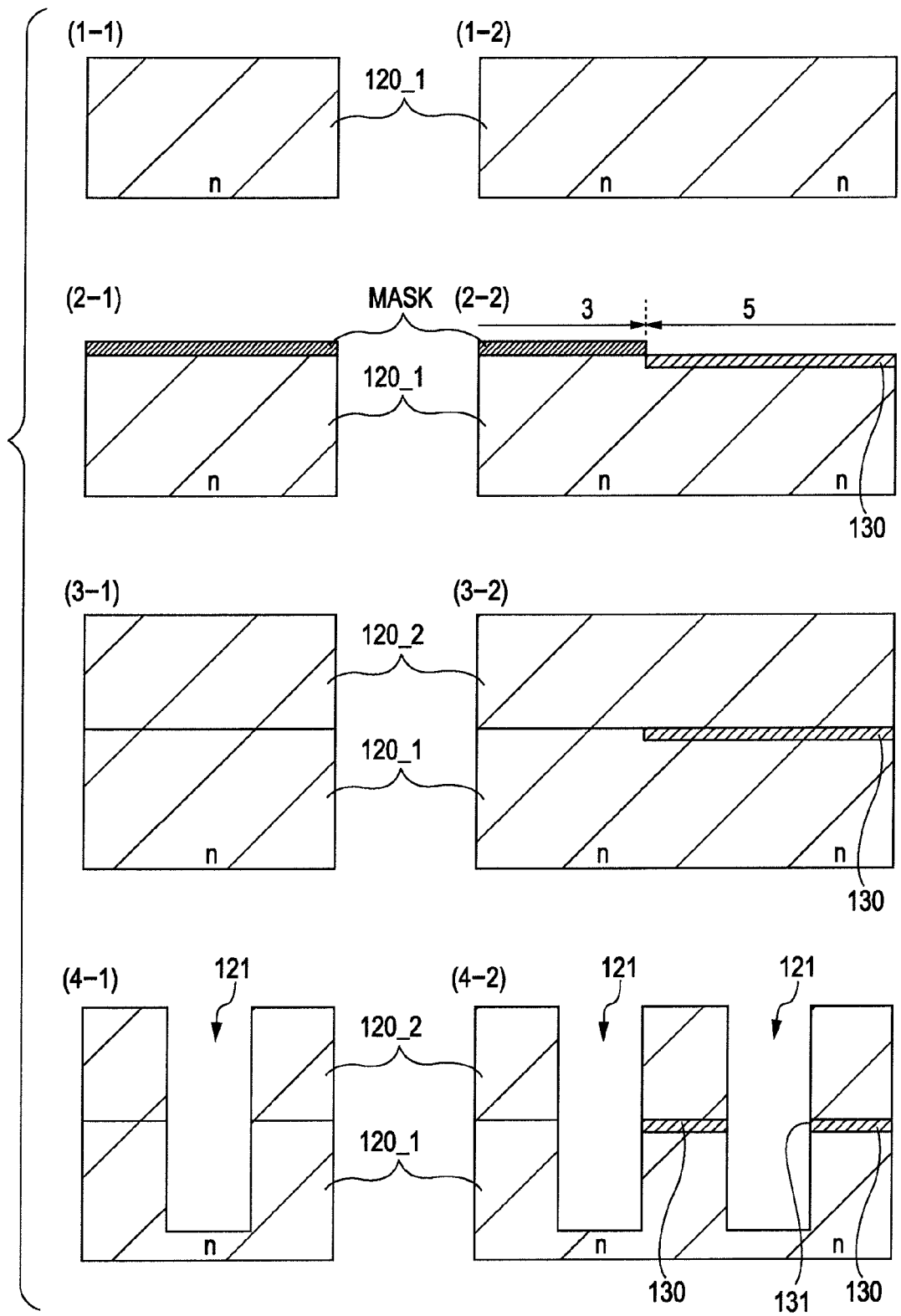
FIG. 5A and FIG. 5B are schematic cross sectional view for illustrating the respective steps in the manufacturing process.
Figure 5B:
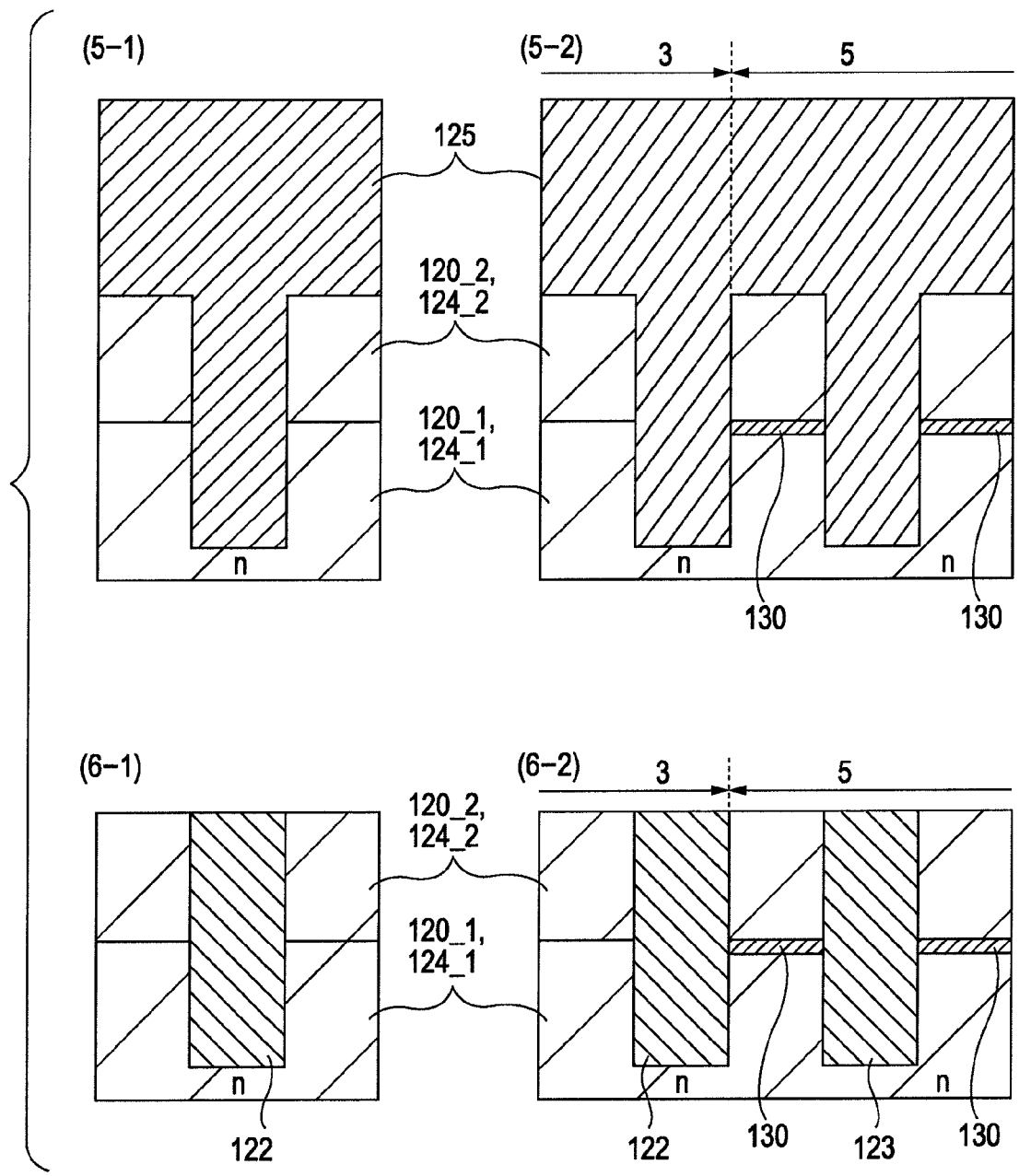

FIG. 5A and FIG. 5B illustrate an exemplary process for manufacturing the semiconductor device 1A_2 having the basic configuration according to the first embodiment (first modified example). The following description will focus on the difference with the manufacturing method of the semiconductor device 1A_1 according to the first embodiment (basic configuration).

A trench-formation epitaxial-refilling method (the third manufacturing method) is applied to the formation of p-type epitaxial buried layers 122 and 123. At this time, however, the process may be performed in consideration of forming a p-type lateral RESURF region 130 on the middle portion of the n-type epitaxial layer 120 in the terminal part 5 to prevent from overlapping with the p-type epitaxial buried layer 123. For example, the process includes the steps of forming a first n-type epitaxial layer 120_1, forming a p-type lateral RESURF region 130, forming a second n-type epitaxial layer 120_2, and then forming trench grooves at once, followed by filling the trench grooves. In principle, the formation of trench grooves and the embedding growth may be carried out only once.

First, an n-type epitaxial layer 120_1 is formed up to one half of the desired film thickness on a high-concentration n-type substrate 110 (drain layer) (FIG. 5A, (1-1), (1-2)). Furthermore, the device is covered with a photoresist mask or the like and then subjected to patterning, followed by ion injection of a predetermined concentration of p-type semiconductor which forms a p-type lateral RESURF region 130 into only the terminal part 5 (FIG. 5A, (2-1), (2-2)). In this case, the patterning may cover at least the element part 3, so that it may not cover part of the p-type epitaxial buried layers 123 on the terminal part 5. Therefore, a p-type lateral RESURF region 130 is formed only on the terminal part 5 so that it may cover the n-type epitaxial layer 120_1.

Subsequently, an n-type semiconductor at a predetermined concentration is epitaxially grown to a desired film thickness so that it may continuously cover the p-type lateral RESURF region 130 which is formed to cover the n-type epitaxial layer 120_1 of the element part 3 and the n-type epitaxial layer 120_1 of the terminal part 5 (FIG. 5A (3-1), (3-2)). Therefore, an n-type epitaxial layer 120_2 is formed. The resulting layer 120_2 has substantially the same film thickness as that of the p-type epitaxial buried layer 120_1 is formed.

Therefore, in the n-type epitaxial layer 120 (120_1, 120_2) formed on the high-concentration n-type substrate 110 with respect to both the element part 3 and the terminal part 5, a trench groove 121 is formed by etching processing using a photoresist or an oxidized film hard mask with an aspect ratio enough to fill the finally desired width W and depth D of each of the p-type epitaxial buried layers 122 and 123 (FIG. 5A, (4-1), (4-2)). At this time, the trench grooves 121 for the p-type epitaxial buried layers 122 and 123 are formed throughout the device so that they have substantially the same dimensions and substantially the same pitch in a certain direction. In other words, the dimensions and repetition pitch of the trench grooves 121 are constant over the entire device.

Subsequently, the trench grooves 121 are filled with p-type semiconductor by epitaxial growth to form a super junction structure. For example, a p-type epitaxial buried layer 125, which will become p-type epitaxial buried layers 122 and 123 later, is epitaxially grown to fill the trench grooves 121 (FIG. 5B, (5-1), (5-2)). After filling the trench groove 121 with the p-type semiconductor that forms p-type epitaxial buried layers 122 ad 123, the p-type epitaxial buried layer 125 is reduced by the CMP technique or the like until the surface of the n-type epitaxial layer 124 is exposed by the CMP technologies or the like, followed by subjecting the surface with mirror finish. As a result, the p-type epitaxial buried layers 122 and 123 embedded in the trench grooves 121 are obtained (FIG. 5B, (6-1), (6-2)).

As described above, according to the manufacturing method of the semiconductor device 1A_2 of the first embodiment (first modified example) of the present invention, the n-type epitaxially layer 120 is provided with a finally desired film thickness and then once subjected to the formation of trench grooves 121 and the embedding growth to fill up the trench grooves 121. Thus, the super junction structure can be formed so that the number of crystal growth repetition is smaller than that of the process of repeating the ion injection and the embedded crystal growth.

Although a specific process, for example a silicon deep etching technique such as anisotropic etching and LIGA process is necessary, the embedding crystal growth with a comparatively high aspect ratio may be carried out only once. Thus, there is an advantage in that the process can be simplified. In addition, the p-type lateral RESURF region 130 of the middle portion is removed by the formation of the trench groove 121 to form an opening 131 to prevent from overlapping with the p-type epitaxial buried layer 123. After that, the p-type epitaxial buried layer 123 is formed by filling the trench groove 121 with the p-type epitaxial buried layer 123, thereby preventing the p-type epitaxial buried layer 123 and the p-type lateral RESURF region 130 from overlapping with each other. However, comparing with the manufacturing method of the first embodiment (second modified example) as described later, during the epitaxial growth of a p-type epitaxial buried layer 125, a considerable amount thereof may permeate to the p-type lateral RESURF region 130. Thus, the p-type lateral RESURF region 130 and the p-type epitaxial buried layer 123 may be overlapped with each other on the boundary between them.

First Embodiment

Second Modified Example

Figure 6A:
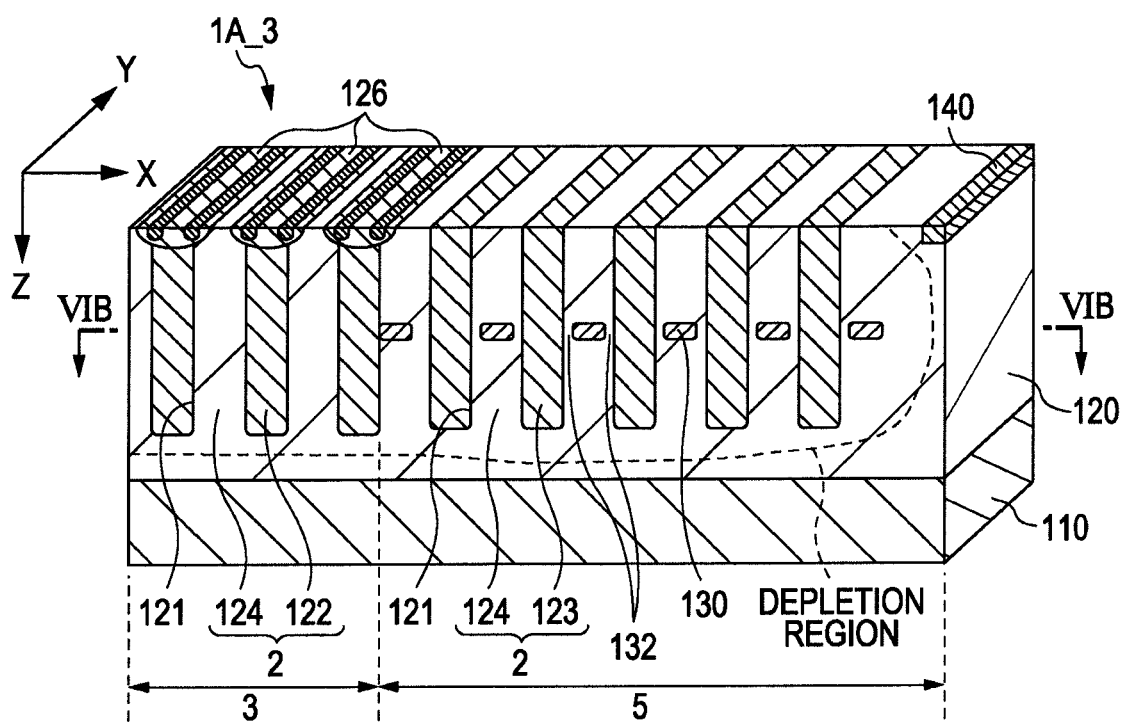
FIG. 6A to FIG. 6C are schematic perspective diagrams illustrating the configuration of the semiconductor device.
Figure 6B:
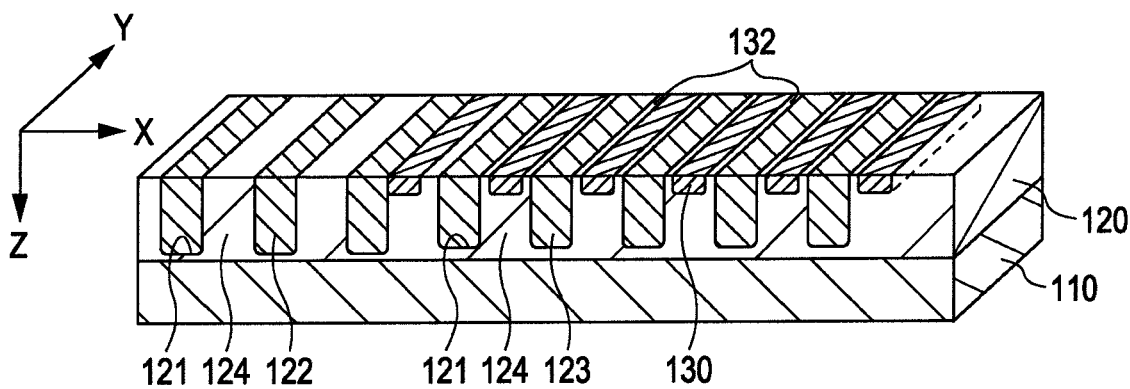
Figure 6C:
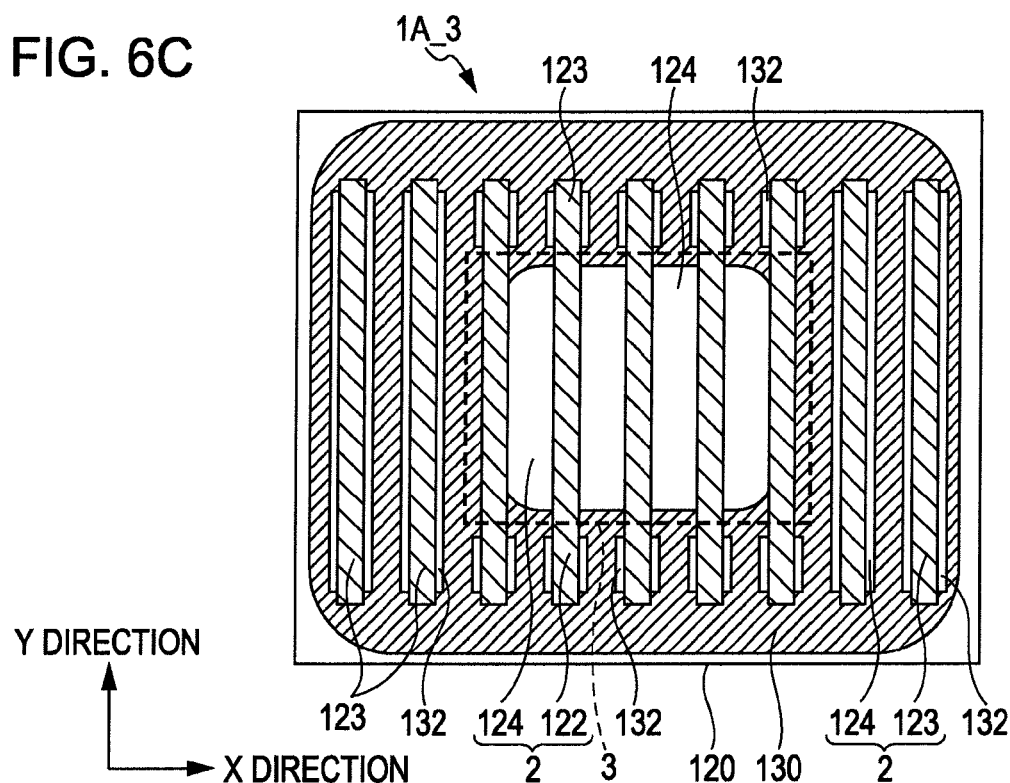
Figure 6D:
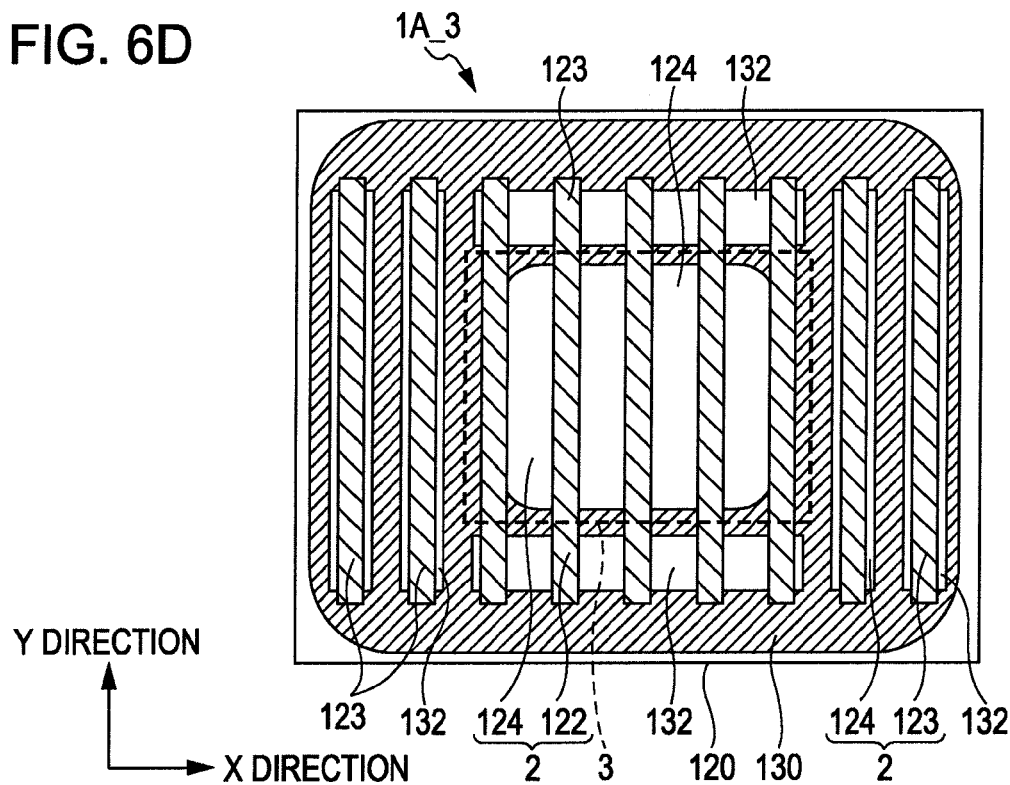
FIG. 6D is a plan view of the semiconductor with reference to the X-Y plane.

FIG. 6A to FIG. 6D illustrate the configuration of a semiconductor device 1A_3 according to the first embodiment of the present invention (second modified example). FIG. 6A and FIG. 6B are schematic diagrams illustrating the configuration of the semiconductor device 1A_3. FIG. 6A is a schematic perspective view of the semiconductor device 1A_3 and FIG. 6B is a cross-sectional view of the semiconductor device 1A_1 along the VIB-VIB line in X-Y directions in FIG. 6A. FIG. 6C and FIG. 6D are plan views of the semiconductor device 1A_3 with reference to the X-Y plane in FIG. 6B.

Principally, the semiconductor device 1A_3 of the first embodiment (second modified example) has the same configuration as that of the semiconductor device 1A_1 of the first embodiment (basic configuration or first modified example) with respect to the structure of a p-type epitaxial buried layer 123, except for the structure of a p-type lateral RESURF structure 130 of the terminal part 5. In other words, in the first modified example, some modifications are applied to the p-type lateral RESURF structure 130. When forming the p-type lateral RESURF region 130, the basic idea of such modifications is to form an opening 132 in the p-type lateral RESURF region 130 at a position on at least part of the p-type epitaxial buried layer 123 while the p-type lateral RESURF region 130 in the terminal part 5. The opening 132 may be formed at a position corresponding to the p-type epitaxial buried layer 123 in the completed product.

In fact, in the middle portion in the n-type epitaxial layer 120 around the element part 3, substantially the entire surface of the terminal part 5 (except for the p-type epitaxial buried layer 123) may be covered with the p-type lateral RESURF region 130, or in general the p-type epitaxial buried layer 123 and the p-type lateral RESURF region 130 are overlapped with each other. In this case, the opening 132 is formed in the part of the p-type lateral RESURF region 130 at a crossing portion with the p-type epitaxial buried layer 123. The formation of the opening 132 in the p-type lateral RESURF region 130 at the cross point with the p-type epitaxial buried layer 123 leads to keep the p-type lateral RESURF region 130 and the p-type epitaxial buried layer 123 from overlapping with each other. To reduce the degree of overlapping between the p-type lateral RESURF region 130 and the p-type epitaxial buried layer 123 (or preferably to avoid the overlapping), the dimensions of the opening 132 (particularly, the width in the present example) may be larger than the dimensions of the p-type epitaxial buried layer 123.

In the case of an example shown in FIG. 6D, an opening 132 is formed in each of the separate portions (portions of the n-type epitaxial layer 124) in the direction of arranging the p-type epitaxial buried layers 123. In addition, an opening 132 is also formed in each of the p-type epitaxial buried layers 123 extended from the p-type epitaxial buried layers 122. In this case, as shown in the figure, the p-type lateral RESURF region 130 may be arranged n the boundary between the element part 3 and the terminal part 5. Alternatively, openings 132 in the element part 3 and the openings 132 of the respective p-type epitaxial buried layers 123 may be communicated with each other (not shown).

In the case of an example shown in FIG. 6C, an opening 132 is formed in each of the separate portions (portions of the n-type epitaxial layer 124) in the direction of arranging the p-type epitaxial buried layers 123. In addition, an opening 132 is also formed as a single continuous opening 132 passing through the respective p-type epitaxial buried layers 123 extended from the p-type epitaxial buried layers 122. In this case, the boundary between the element part 3 and the terminal part 5 may be arranged on the p-type lateral RESURF region 130 as shown in the figure. In addition, but not shown in the figure, the opening 132 of the element unit 3 may be communicated with the single opening 132 for the respective p-type epitaxial buried layer 132.

In any of these cases, the p-type RESURF region (p-type horizontal RESURF region 130) is selectively formed so that the formation of the p-type epitaxial buried layer 123 may be avoided from the terminal part 5. This is no difference from the view of the first embodiment (first modified example) in which overlap with the p-type pillar layer is prevented to deplete the major portions of the terminal part 5. The same advantageous effects as those of the examples of the first embodiment (the basic configuration and the first modified example) may be obtained in that a high stable breakdown voltage can be attained by forming the p-type lateral RESURF region 130 in the middle portion of the n-type epitaxial layer 120 while keeping from the overlap between the p-type layers in the terminal part 5. However, it is advantageous to individually form openings 132 to provide the p-type horizontal RESURF region 130 with a wide surface area and a high breakdown voltage.

Manufacturing Method

First Embodiment: Second Modified Example

Figure 7:
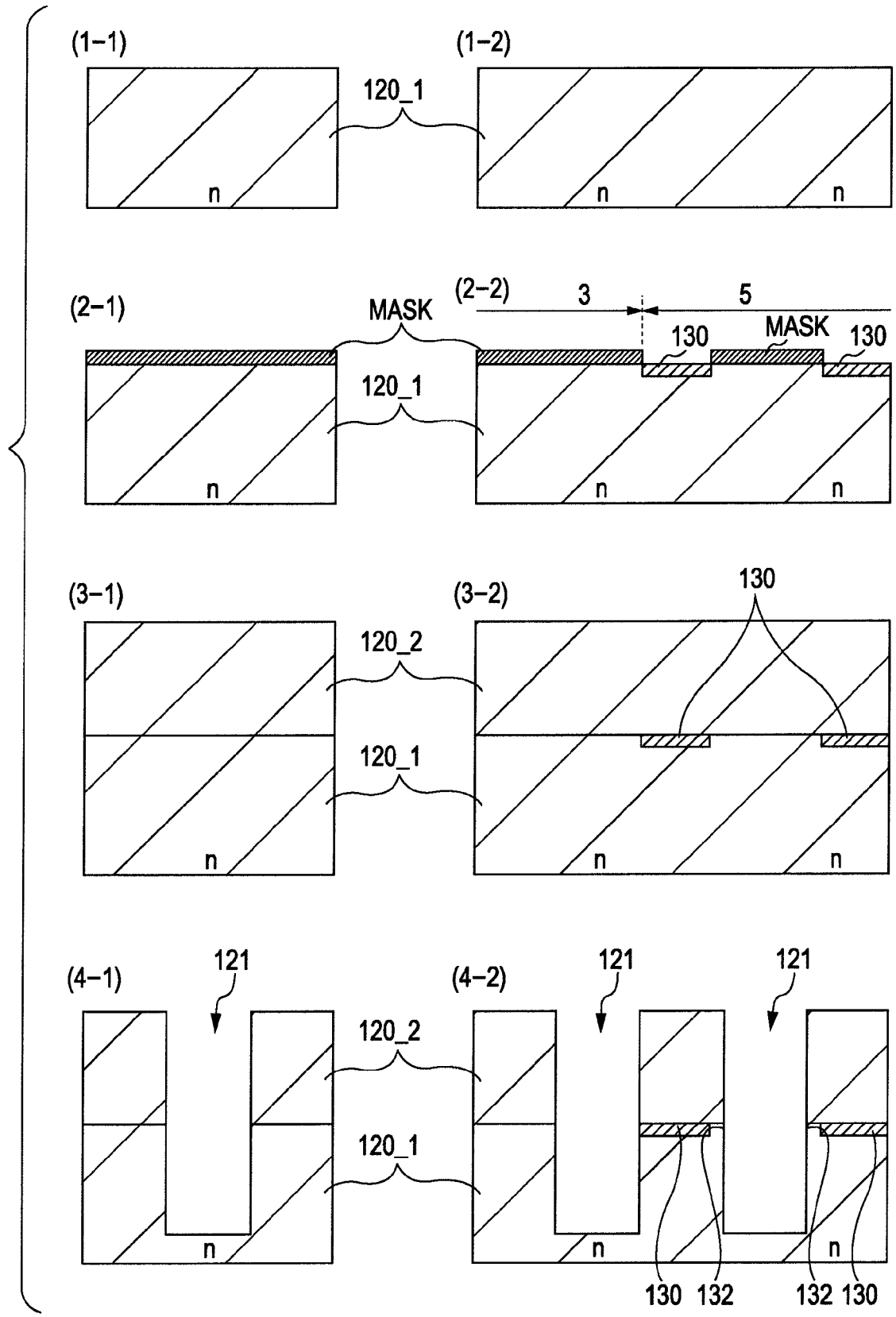
FIG. 7 is a schematic diagram that illustrates an exemplary process for manufacturing the semiconductor device according to the first embodiment (second modified example)

FIG. 7 illustrates an exemplary process for manufacturing the semiconductor device 1A_3 having the basic configuration according to the first embodiment (second modified example). The following description will focus on the difference with the manufacturing method of the semiconductor device 1A_2 according to the first embodiment (second modified example).

In principle, like the first embodiment (first modified example), the formation of trench grooves and the embedding growth may be carried out only once. At this time, however, the process may be performed in consideration of patterning an opening 132 to prevent the generation of overlap with the p-type epitaxial buried layer 123 at the time of forming the p-type lateral RESURF region 130 on the middle portion of the n-type epitaxial layer 120 in the terminal part 5.

First, an n-type epitaxial layer 120_1 is formed up to one half of the desired film thickness on a high-concentration n-type substrate 110 (drain layer) (FIG. 7, (1-1), (1-2)). Furthermore, the device is covered with a photoresist mask or the like and then subjected to patterning, followed by ion injection of a predetermined concentration of p-type semiconductor which forms a p-type lateral RESURF region 130 into only the terminal part 5 (FIG. 7, (2-1), (2-2)). The subsequent steps are the same as those of the first embodiment (first modified example).

A patterning mask covers at least the whole area of the element part 3. In the terminal part 5, the mask portion that covers a position corresponding to the p-type epitaxial buried layer 123 is made larger than the p-type epitaxial a portion 123 (in this example, particularly, the width in a stripe-arrangement direction). In other words, the mask covers not only the p-type epitaxial buried layer 123 but also the periphery portion of the opening 132 that surrounds the p-type epitaxial buried layer 123. If it is larger than the size of the p-type epitaxial buried layer 123, the overlap can be avoided very well.

In this way, according to the manufacturing method of the semiconductor device 1A_3 of the first embodiment (second modified example), the n-type epitaxially layer 120 is provided with a finally desired film thickness and then once subjected to the formation of trench grooves 121 and the embedding growth to fill up the trench grooves 121. Thus, the super junction structure can be formed so that the number of crystal growth repetition is smaller than that of the process of repeating the ion injection and the embedded crystal growth.

Although a specific process, for example a silicon deep etching technique such as anisotropic etching and LIGA process is necessary, the embedding crystal growth with a comparatively high aspect ratio may be carried out only once. Thus, there is an advantage in that the process can be simplified. In addition, in the terminal part 5, the formation of the p-type lateral RESURF region 130 is formed so that the opening 132 surrounding the p-type epitaxial buried layer 123 may be formed. Thus, the overlap is prevented very well, compared with the first modified example.

First Embodiment

Third Modified Example

Figure 8:
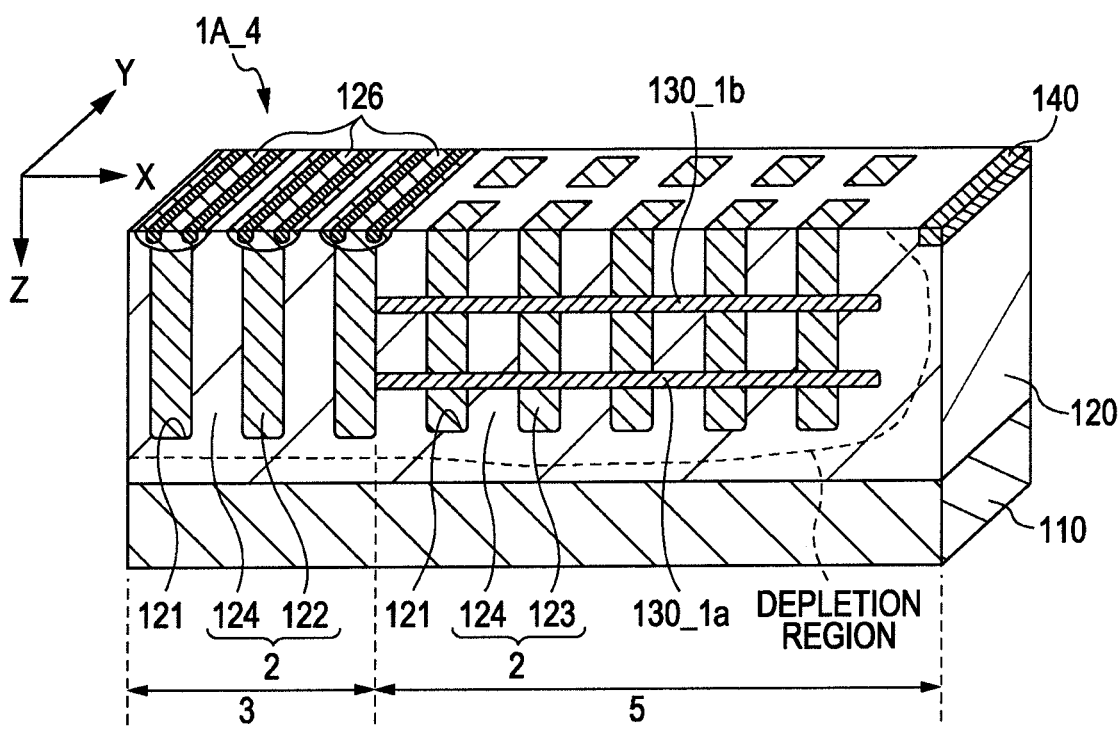
FIG. 8 is a schematic perspective diagram that illustrates the configuration of a semiconductor device as a third modified example according to the first embodiment of the present invention.

FIG. 8 illustrates the configuration of a semiconductor device 1A_4 according to the first embodiment of the present invention (third modified example). Here, FIG. 8 is a perspective diagram schematically illustrating the configuration of the semiconductor device 1A_4.

Principally, the semiconductor device 1A_4 of the first embodiment (third modified example) has the same configuration as that of the semiconductor device 1A_1 of the first embodiment (basic configuration) with respect to the structure of a p-type epitaxial buried layer 123, except for the structure of a p-type lateral RESURF structure 130 of the terminal part 5. In other words, in the third modified example, some modifications are applied to the p-type lateral RESURF structure 130. A fundamental view of the modification is that two or more p-type lateral RESURF regions 130 are formed only in the terminal part 5. Furthermore, the semiconductor device 1A_4 is different from one of the fourth embodiment as described later in that only the terminal part 5 is provided with more than one p-type lateral RESURF region 130 in the n-type epitaxial layer 120 sandwiched between the drain electrode and the source electrode. In the figure, there are two layers of p-type lateral RESURF regions 130_1a and 130_1b in the n-type epitaxial layer 120.

In such a configuration, a plurality of layers of p-type lateral RESURF regions 130 is employed in the n-type epitaxial layer 120 in the terminal part 5. Thus, there is an advantage in that easily to design the shape of a depletion layer with a curvature formed when applying a drain voltage, compared with that of the first embodiment.

As an example, the n-type epitaxial layer 120 is roughly divided into almost halves in the Z direction (depth direction). Then, each of the p-type lateral RESURF regions 130 is formed on the corresponding divided position (i.e., on a position every α/N from the bottom in the Z direction, wherein a represents 1 to N−1). However, it is not desirable to divide the n-type epitaxial layer 120 equally.

The manufacturing method of the semiconductor device 1A_4 of this first embodiment (third modified example) is not illustrated in the figure. In the manufacturing method of first embodiment (basic configuration), the trench-embedded crystal growth with a low aspect ratio may be repeated the number of times corresponding to "the number of layers of p-type lateral RESURF region 130 plus 1 (one)".

Here, although the basic configuration of the semiconductor device of the first embodiment has been modified and illustrated, the present modification may be also applied to the first modified example and the second modified example. In these modified examples, the formation of the n-type epitaxial layer 120 may be repeated the number of times corresponding to "the number of layers of p-type lateral RESURF region 130 plus 1 (one)" in the manufacturing method of each of the first and second modified examples. The n-type epitaxial layer 120 is formed so that the film thickness thereof corresponds to a finally desired one. Then, the formation of trench grooves 121 and the embedding growth are carried out once and the trench grooves 121 are then filled with the p-type epitaxial buried layer 125.

Second Embodiment

Basic Configuration

Figure 9A:
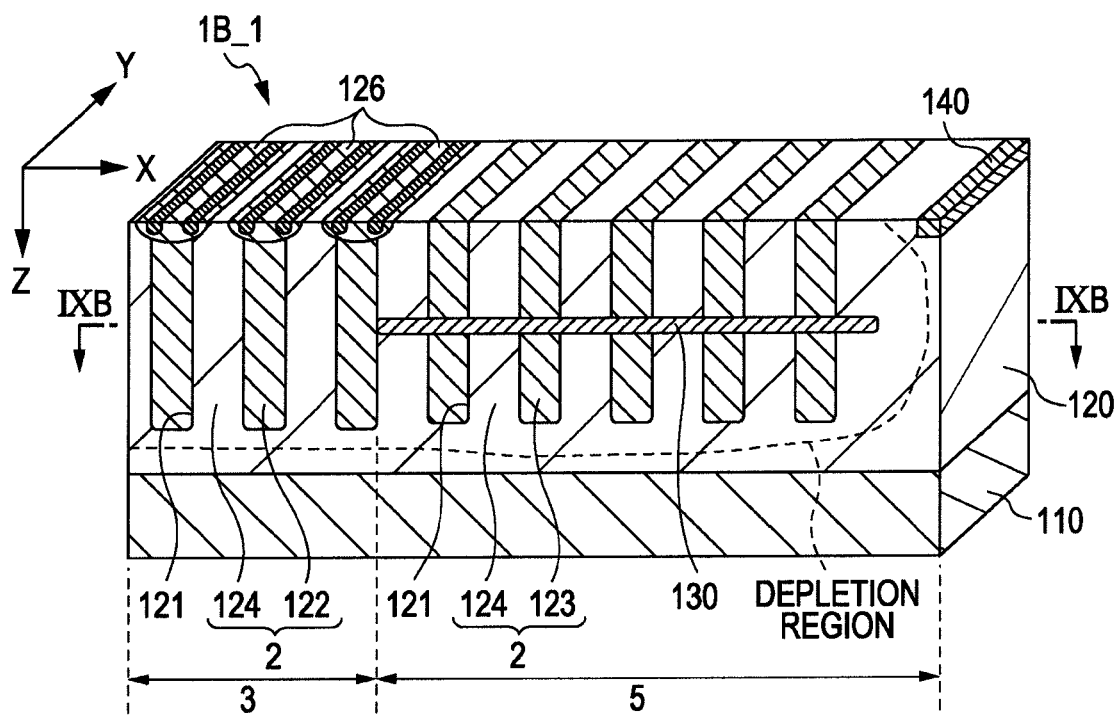
FIG. 9A and FIG. 9B are schematic perspective diagrams illustrating the configuration of the semiconductor device.
Figure 9B:
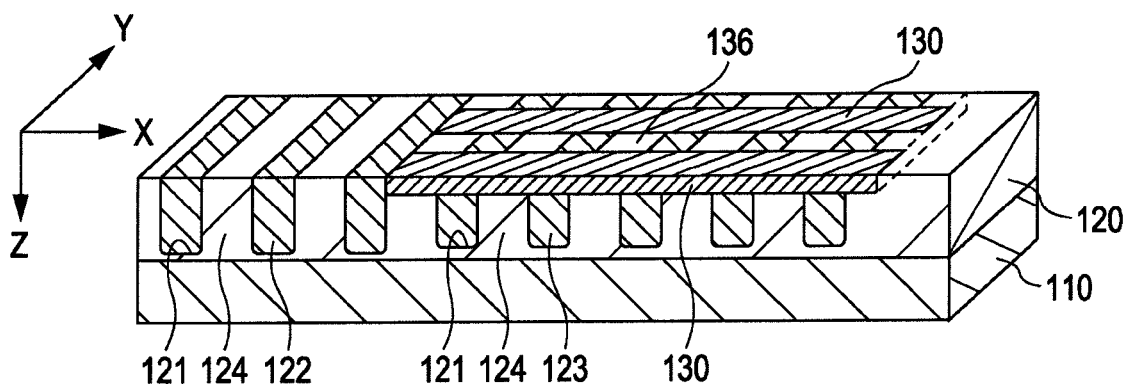
Figure 9C:
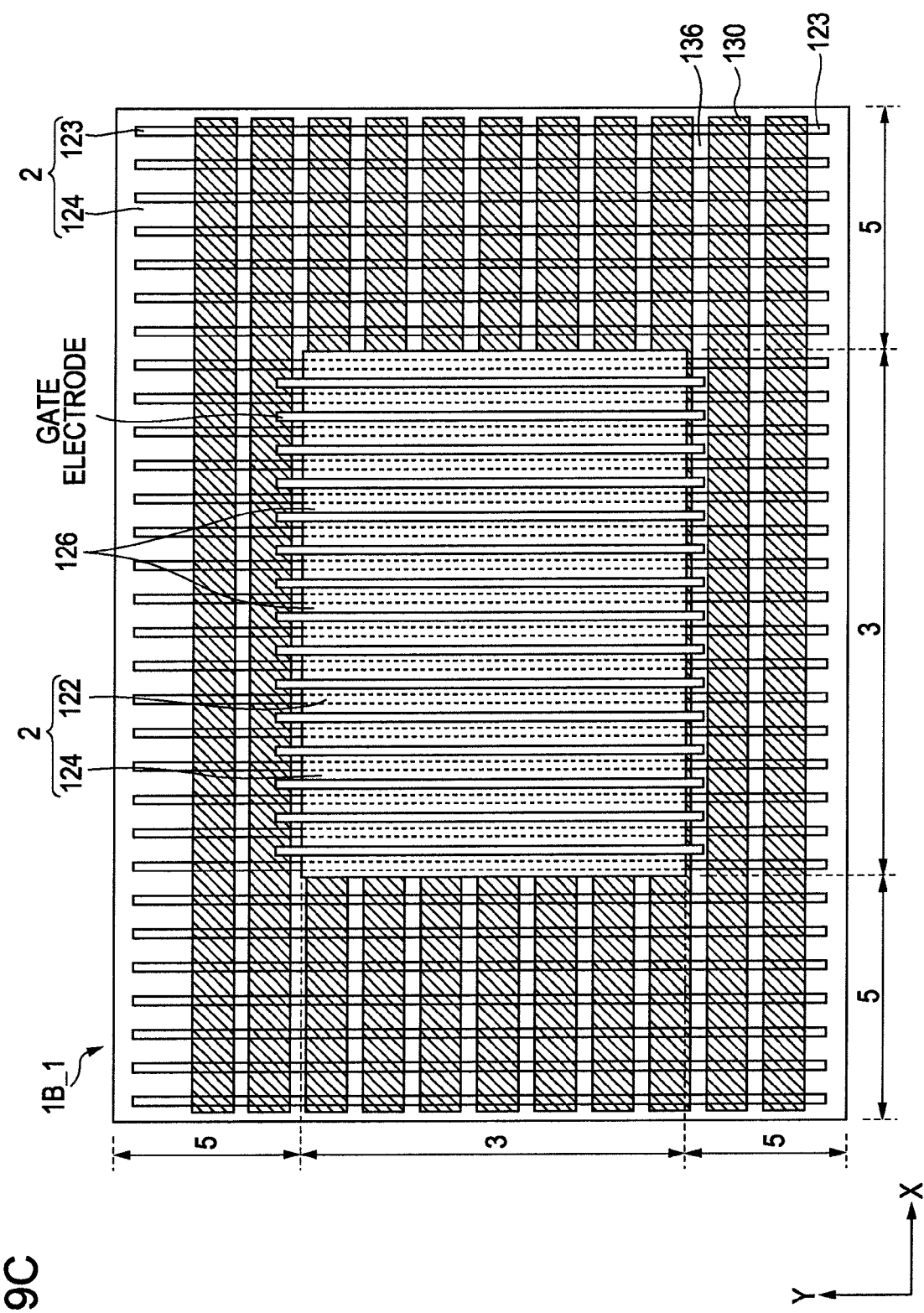
FIG. 9C is a plan view of the semiconductor with reference to the X-Y plane.

FIG. 9A to FIG. 9C illustrate the configuration of a semiconductor device 1B_1 according to a second embodiment (basic configuration) of the present invention. Here, FIG. 9A and FIG. 9B schematically illustrate the configuration of the boundary between the element part 3 and the terminal part 5 of the semiconductor device 1B_1, where FIG. 9A is a schematic perspective view of the semiconductor device 1B_1 and FIG. 9B is a cross-sectional view of the semiconductor device 1B_1 along the IXB-IXB line in X-Y directions in FIG. 9B. In addition, FIG. 9C is a plan view (transparent view) of the semiconductor device 1B_1 with reference to the X-Y plane in FIG. 9A and the X-Y plane in FIG. 9B. In this figure, a source region is omitted, while both a base region and a gate electrode are illustrated.

The semiconductor device 1B_1 of the second embodiment (basic configuration) of the present invention is a modified example of the first embodiment (basic configuration). One of advantageous features of the semiconductor device 1B_1 may be the formation of uniformly spaced slits 136 in the p-type lateral RESURF region 130 formed in the middle portion of the middle part 5 so that the slits 136 extend in a direction perpendicular to the arrangement direction of the p-type epitaxial buried layers 123. An n-type epitaxial layer 124 (n-type epitaxial layer 120) is arranged on the slit 136. That is, the uniformly spaced slits of n-type semiconductor are included in the p-type lateral RESURF region 130.

The impurity concentrations of the p-type epitaxial buried layers 123 and the n-type epitaxial layers 124 are not typically constant because of process variation. If the p-type lateral RESURF region 130 is formed in substantially the entire area of the terminal part 5, a depletion layer will unevenly extend depending on the process variation. On the other hand, the formation of slits 136 on the p-type lateral RESURF region 130 leads to application of electric fields not only from the vertical direction but also from the horizontal direction. Thus, the depletion layer may extend more easily.

Second Embodiment

Modified Example

Figure 9D:
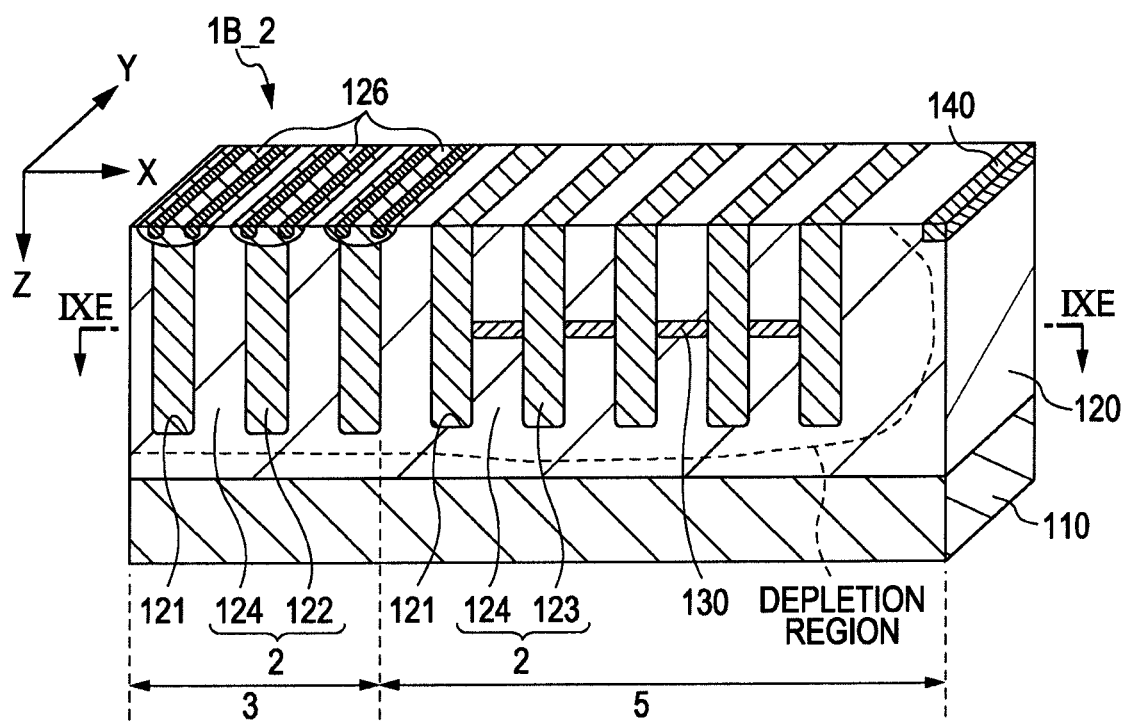
FIG. 9D and FIG. 9E are schematic perspective diagrams illustrating the configuration of a modified example of the semiconductor device.
Figure 9E:
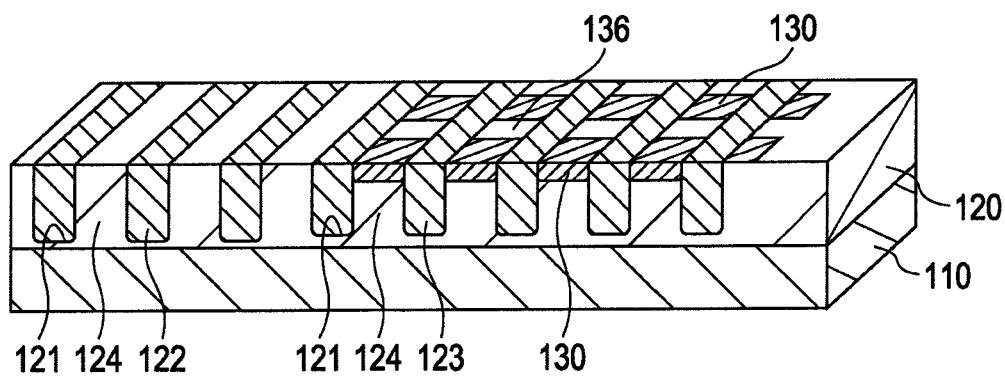

FIG. 9D and FIG. 9E are diagrams illustrating a modified example of the second embodiment. Here, a semiconductor device 1B_2 of the second embodiment (modified example) is illustrated as a modified example of the first embodiment (first modified example) that forms the lateral RESURF region to be kept from overlapping with the p-type pillar layer. Specifically, FIG. 9D and FIG. 9E schematically illustrate the configuration of the boundary between the element part 3 and the terminal part 5 of the semiconductor device 1B_2, where FIG. 9D is a schematic perspective view of the semiconductor device 1B_2 and FIG. 9E is a cross-sectional view of the semiconductor device 1B_2 along the IXE-IXE line in X-Y directions in FIG. 9B. Although illustration is omitted, the same structure is also applicable to the second and third modified examples of the first embodiment.

Third Embodiment

Figure 10A:
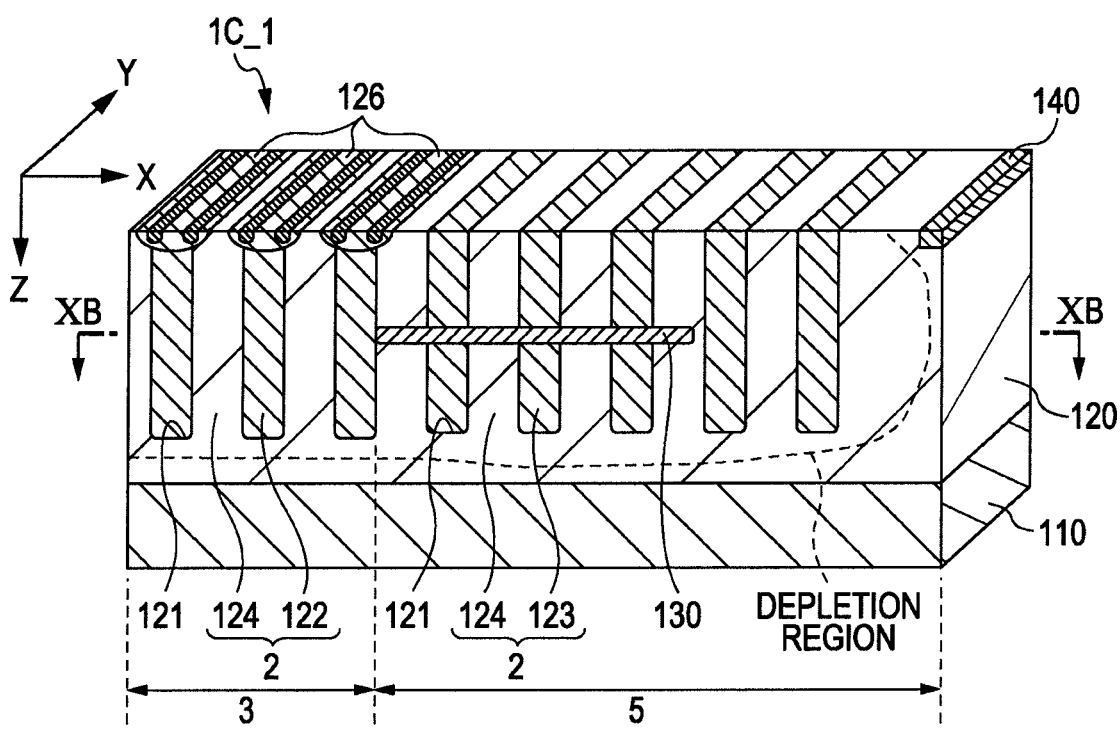
FIG. 10A and FIG. 10B are schematic perspective diagrams illustrating the configuration of the semiconductor device.
Figure 10B:
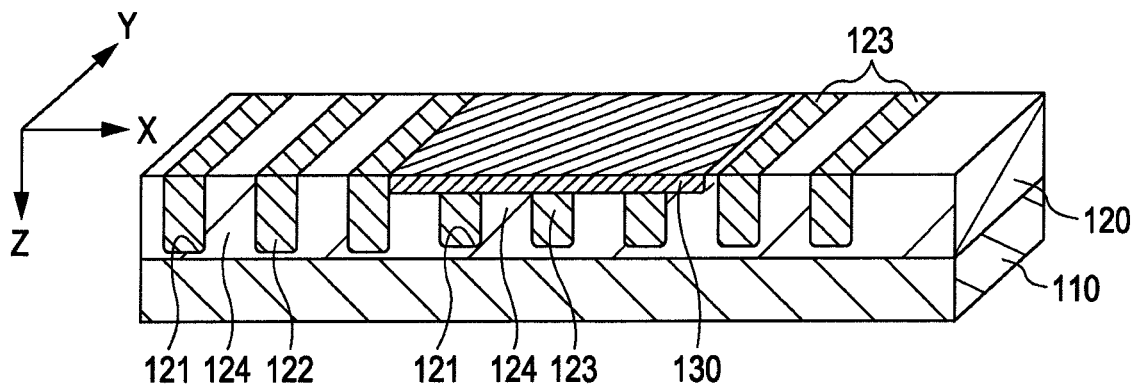
Figure 10C:
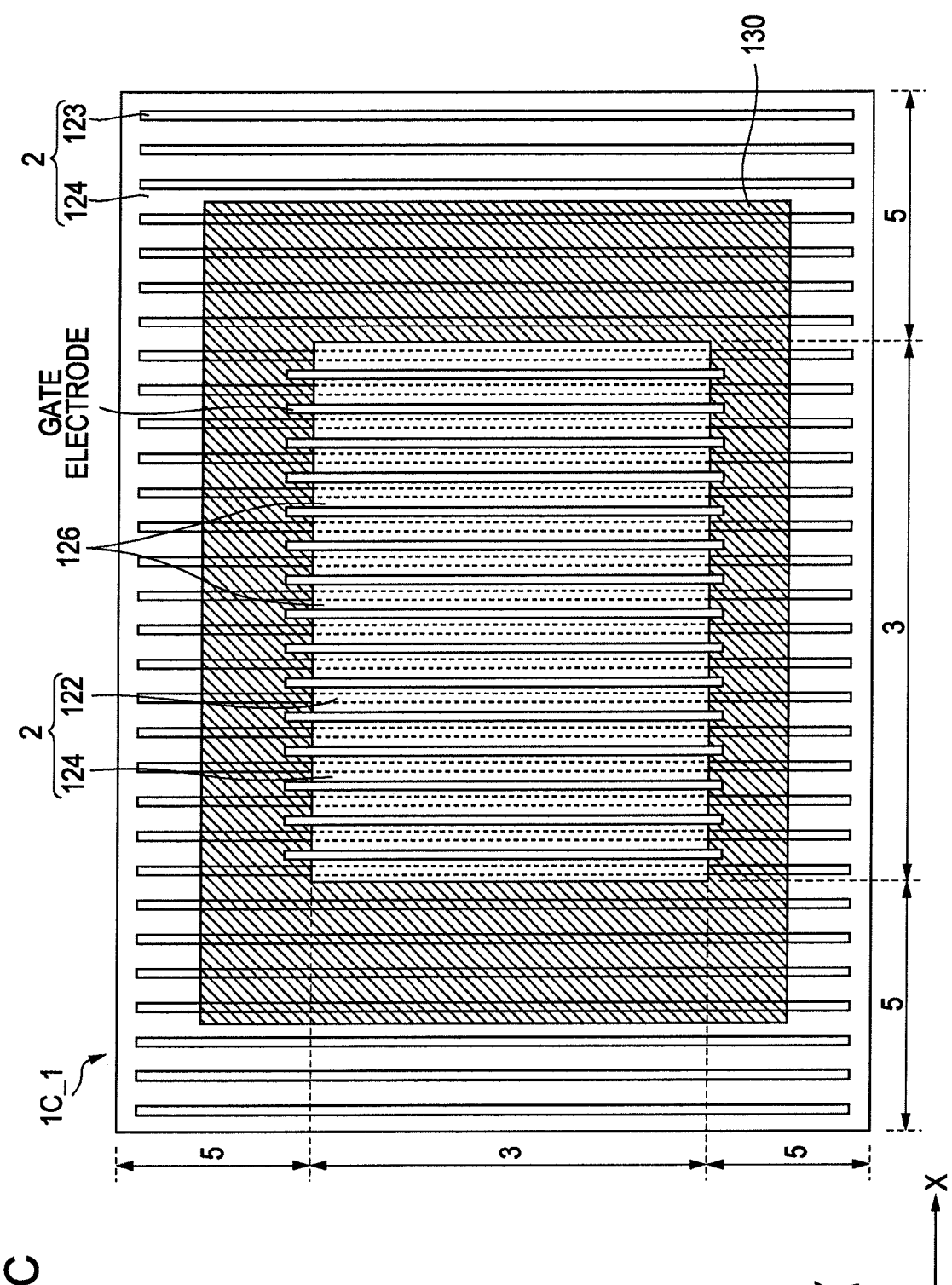
FIG. 10C is a plan view of the semiconductor with reference to the X-Y plane.

FIG. 10A to FIG. 10C illustrate a semiconductor device 1C_1 of a third embodiment of the present invention. FIG. 10A and FIG. 10B are schematic diagrams illustrating the configuration of the boundary between an element part 3 and a terminal part 5 of the semiconductor device 1C_1, where FIG. 10A is a schematic perspective view of the semiconductor device 1C_1 and FIG. 10B is a cross-sectional view of the semiconductor device 1C_1 in along the XB-XB line in X-Y directions in FIG. 10A. FIG. 10C is a plan view (transparent view) of the semiconductor device 1C_1 with reference to the X-Y plane in FIG. 10A and the X-Y plane in FIG. 10B. In this figure, a source region is omitted, while both a base region and a gate electrode are illustrated.

The semiconductor device 1C_1 of the third embodiment of the present invention is a modified example of the first embodiment (basic configuration). Advantageously, the p-type lateral RESURF region 130 to be functioned as a depletion layer extending region formed on the middle portion in the terminal part 5 does not extend to the peripheral edge of the terminal part 5 in the arrangement direction of the p-type epitaxial buried layer 123. In addition, the p-type epitaxial buried layer 123 is advantageously formed in a floating state in the arrangement direction of stripes outside the terminal end of the p-type lateral RESURF region 130. The configuration of the semiconductor device 1C_1 of the third embodiment is designed for electrically separating the p-type epitaxially buried layer 124 on the peripheral side of the device and the p-type lateral RESURF region 130 in the n-type epitaxial layer 120. In these figures, although the modified example of the first embodiment (basic configuration) is illustrated, the same modification may be also applied to any of the first to third modified examples of the first embodiment.

That is, in the formation of the p-type lateral RESURF region 130 in the terminal part 5, the p-type lateral RESURF region 130 may be not typically arranged between the adjacent members in all the p-type epitaxial buried layers 123.

In addition, all the p-type epitaxial buried layers 124 may be not typically electrically connected to the p-type lateral RESURF regions 130. The p-type epitaxial buried layer 123 on the outermost periphery of the device may be in a floating state.

The periphery of the device may tend to have some defects such as processing mistakes (e.g., etching cracks), compared with the inside thereof. If the p-type epitaxial buried layer 123 of the periphery of the device is electrically connected to the internal p-type epitaxial buried layer 123, any processing mistake in the periphery of the device may lead to tan electrical connection between the p-type epitaxial buried layer 123 and any of other structural members. However, such an electric connection will be avoided by electrically separating the outermost periphery of the device from the inside thereof.

Furthermore, the periphery of the device may not only tend to cause any processing mistake but also cause differences between the peripheral circumstances and the inside of the device during the formation of trench grooves and the embedding growth. As a result, characteristic differences may occur because the formation of trench grooves and the epitaxial growth do not proceed similarly on the periphery and the inside of the device. If the peripheral structural components and the inner structure components are electrically connected to one another in an integrated fashion even in the presence of such differences, good internal characteristics of the device may not be utilized. However, such an electric connection will be avoided by electrically separating the outermost periphery of the device from the inside thereof.

Third Embodiment

Modified Example

Figure 10D:
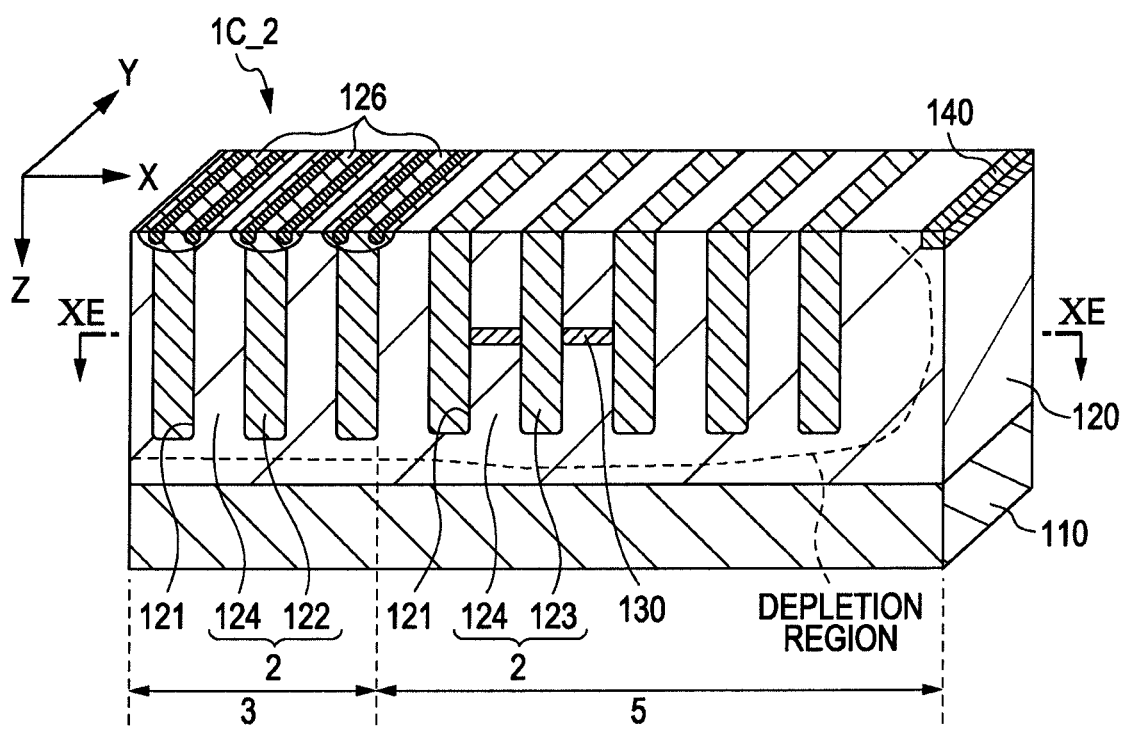
FIG. 10D and FIG. 10E are schematic perspective diagrams illustrating the configuration of a modified example of the semiconductor device.
Figure 10E:
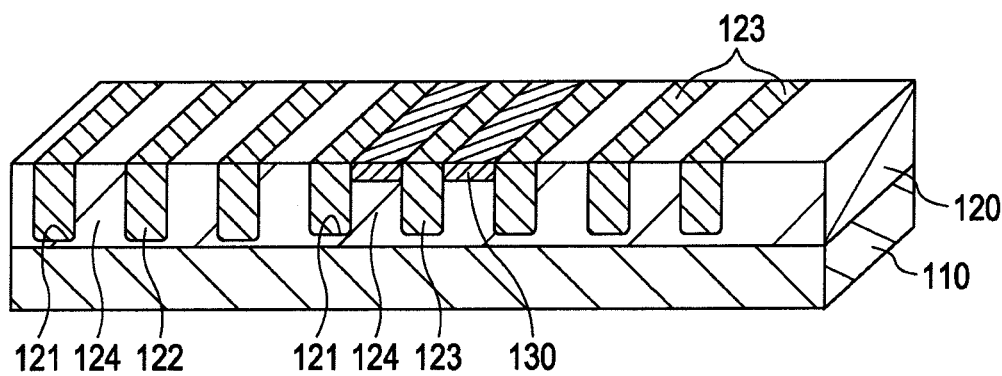

FIG. 10D and FIG. 10E are diagrams illustrating a modified example of the third embodiment. Here, a semiconductor device 1C_2 of the third embodiment (modified example) is illustrated as a modified example of the first embodiment (first modified example) that forms the lateral RESURF region to be kept from overlapping with the p-type pillar layer. Specifically, FIG. 10D and FIG. 10E schematically illustrate the configuration of the boundary between the element part 3 and the terminal part 5 of the semiconductor device 1C_2, where FIG. 10D is a schematic perspective view of the semiconductor device 1C_2 and FIG. 10E is a cross-sectional view of the semiconductor device 1C_2 along the XE-XE line in X-Y directions in FIG. 10B. Although illustration is omitted, the same modification is also applicable to the second and third modified examples of the first embodiment or the second embodiment.

Fourth Embodiment

Figure 11A:
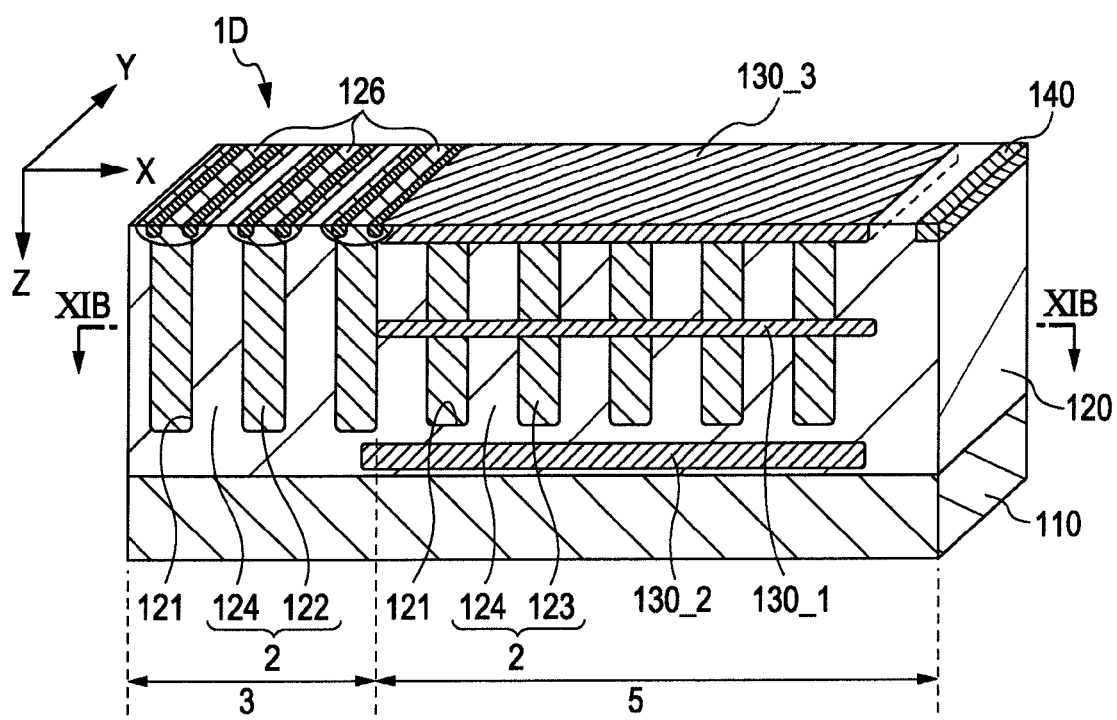
FIG. 11A and FIG. 11B are schematic perspective diagrams illustrating the configuration of the semiconductor device.
Figure 11B:
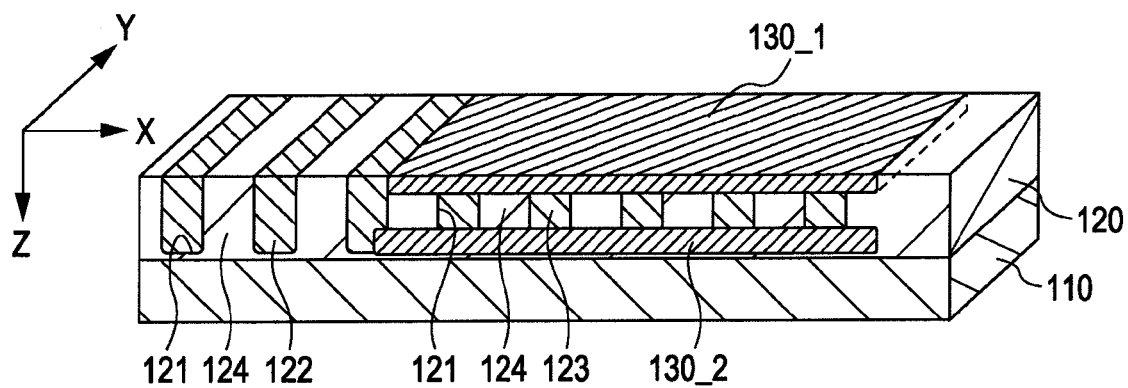

FIG. 11A and FIG. 11B illustrate a semiconductor device 1D of a fourth embodiment of the present invention. Here, FIG. 11A and FIG. 11B are schematic diagrams illustrating the configuration of the boundary between an element part 3 and a terminal part 5 of the semiconductor device 1D, where FIG. 11A is a schematic perspective view of the semiconductor device 1D and FIG. 11B is a cross-sectional view of the semiconductor device 1D along the XIB-XIB line in X-Y directions in FIG. 11A.

Principally, the semiconductor device 1D of the fourth embodiment has the same configuration as that of the semiconductor device 1A_1 of the first embodiment (basic configuration) with respect to the structure of a p-type epitaxial buried layer 123, except for the structure of a p-type lateral RESURF structure 130 of the terminal part 5. In other words, in this embodiment, some modifications are applied to the p-type lateral RESURF structure 130. A fundamental view of the modification is that two or more p-type lateral RESURF regions 130 are formed only in the terminal part 5. Furthermore, the semiconductor device 1D is advantageously different from one of the first embodiment (third modified example) as described later in that a p-type depletion layer extending layer is also formed on at least one surface of the n-type epitaxial layer 120 sandwiched between the drain electrode and the source electrode in addition to the formation of a p-type depletion layer extending layer inside the n-type epitaxial layer 120.

In the figures, as an example, one layer of p-type lateral RESURF region 130_1 is formed in the middle portion of the n-type epitaxial layer 120. Furthermore, p-type lateral RESURF regions 130_2 and 130_3 are formed on the opposite sides of the n-type epitaxial layer 120 on the drain electrode and the source electrode, respectively. Although not illustrated, one of the p-type lateral RESURF region 130_2 on the drain electrode side and the p-type lateral RESURF region 130_3 on the source electrode side may be combined with the p-type lateral RESURF region 130_1 in the n-type epitaxial layer 120.

Such a configuration of the semiconductor device utilizes not only the p-type lateral RESURF region 130_1 in the n-type epitaxial layer 120 in the terminal part 5 but also the p-type lateral RESURF regions 130_2 and 130_3 on the opposite sides of the n-epitaxial layer 120. Thus, a depletion layer may extend more easily than that of the first embodiment (basic configuration). In addition, the transmission of hall current, which is generated when the breakdown with serge voltage or avalanche breakdown generated at the time of switching operation with inductive load or recovery delay of reverse diode occurs, is facilitated. As a result, overload capacities to these phenomena can be further improved.

Manufacturing Method

Fourth Embodiment

Figure 12:
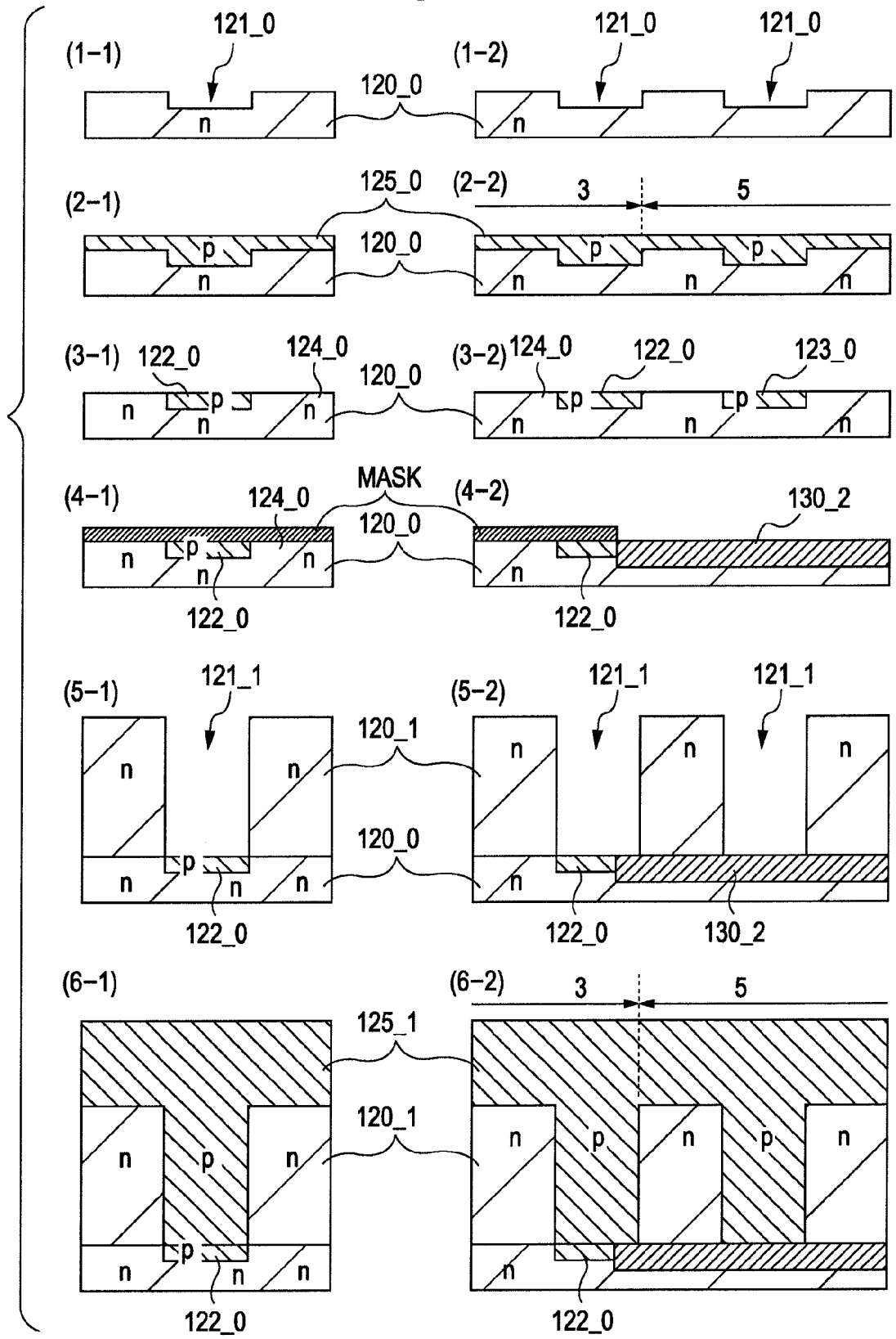
FIG. 12 is a schematic diagram that illustrates an exemplary process for manufacturing the semiconductor device according to the fourth embodiment.

FIG. 12 illustrates an exemplary process for manufacturing the semiconductor device 1D according to the fourth embodiment of the present invention. The following description will focus on the difference with the manufacturing method of the semiconductor device 1A_1 according to the first embodiment (basic configuration).

In principle, in addition to the manufacturing method of the first example (basic configuration), the process further includes a step of forming p-type depletion layer extending layers (p-type lateral RESURF regions 130_2 and 130_3) on the opposite sides (on the drain electrode side and the source electrode side) of the n-type epitaxial layer 120.

First, for example, an n-type epitaxial layer 120_0 is formed on the high-concentration n-type substrate (drain layer) 110 up to a thickness almost corresponding to that of a p-type lateral RESURF region 130_2 on the bottom of the trench groove 121. Furthermore, on each of the element part 3 and the terminal part 5, a trench-shaped groove (trench groove 121_0) is formed by etching using a photoresist, an oxidized film hard mask, or the like (FIG. 12, (1-1), (1-2)). At this time, the trench grooves 121_0 for the p-type epitaxial buried layers 122 and 123 are formed throughout the device so that they have substantially the same dimensions and substantially the same pitch in a certain direction. In other words, the dimensions and repetition pitch of the trench grooves 121_0 are constant over the entire device.

Subsequently, a p-type epitaxial buried layer 125_0, which will become p-type epitaxial buried layers 122_0 and 123_0 later, is epitaxially grown to fill the trench grooves 121_0 (FIG. 12, (2-1), (2-2)). Furthermore, the p-type epitaxial buried layer 125_0 is reduced by the CMP technique or the like until the surface of the n-type epitaxial layer 124 is exposed by the CMP technique or the like. As a result, the p-type epitaxial buried layers 122_0 and 123_0 embedded in the trench grooves 121_0 are obtained (FIG. 12, (3-1), (3-2)).

Furthermore, the device is covered with a photoresist mask or the like and then subjected to patterning, followed by ion injection of a predetermined concentration of p-type semiconductor which forms a p-type lateral RESURF region 130_2 into only the terminal part 5 (FIG. 12, (4-1), (4-2)). Therefore, a p-type lateral RESURF region 130 is formed only on the terminal part 5 so that it may cover the p-type epitaxial buried layer 123_1 and the n-type epitaxial layer 124 slightly inside from the side of the drain electrode. Furthermore, an n-type epitaxial layer 120_1 is formed up to one half of the desired film thickness on the p-type lateral RESURF region 130. In each of the element part 3 and the terminal part 5, a trench groove 121_1 which is aligned with the trench groove 121_0 is formed in the n-type epitaxial layer 120_1 (FIG. 12, (5-1), (5-2)). Subsequently, a p-type epitaxial buried layer 125_1, which will become p-type epitaxial buried layers 122_1 and 123_1 later, is epitaxially grown to fill the trench grooves 121_1 (FIG. 12, (6-1), (6-2)).

After that, but not shown in the figure, a p-type lateral RESURF region 130_1 is formed in the middle portion of the n-type epitaxial layer 120 in a manner similar to the first embodiment (basic configuration). Furthermore, an n-type epitaxial layer 120_2 is formed, and then the formation of a trench groove 121, the embedding of the n-type epitaxial layer 125_2 into the trench groove 121, and the mirror finishing of the surface of the device are carried out. As a result, p-type epitaxial buried layers 122_2 and 123_2 embedded in the trench grooves 121_2 are obtained.

After finishing the surface of the device by mirror finishing with the CMP technique or the like, p-type semiconductor doped with a predetermined concentration of impurities is injected into the n-type epitaxial layer 124 (n-type epitaxial layer 120) in the terminal part 5. Therefore, a p-type lateral RESURF region 130 is formed on the surface of the n-type epitaxial layer 120 on the source electrode side so that it may cover the p-type epitaxial buried layer 123 and the n-type epitaxial layer 124. Subsequently, a MOSFET with the super junction structure is completely formed in the element part 3 by forming a base region, a gate insulating film, a source region, a source electrode, and the like.

Here, the modified example of the basic configuration of the semiconductor device according to the first embodiment has been described. Furthermore, the same modification is also applicable to the first, second, and third modified examples of the first embodiment or the second or third embodiment.

Fifth Embodiment

Figure 13A:
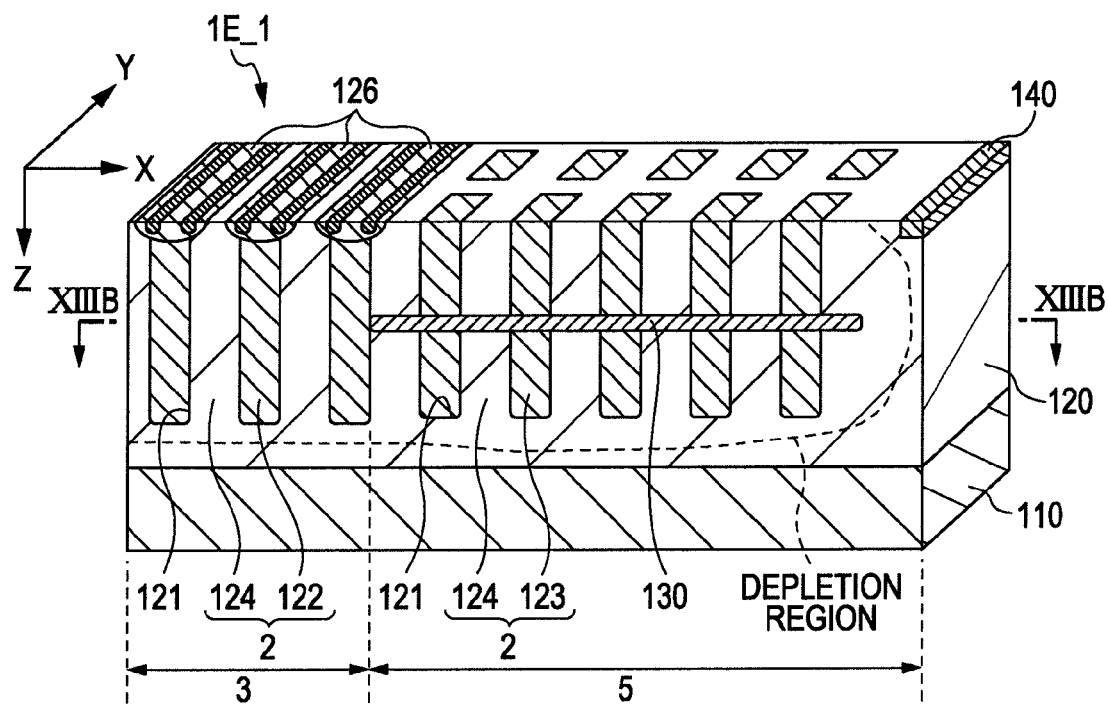
FIG. 13A and FIG. 13B are schematic perspective diagrams illustrating the configuration of the semiconductor device.
Figure 13B:
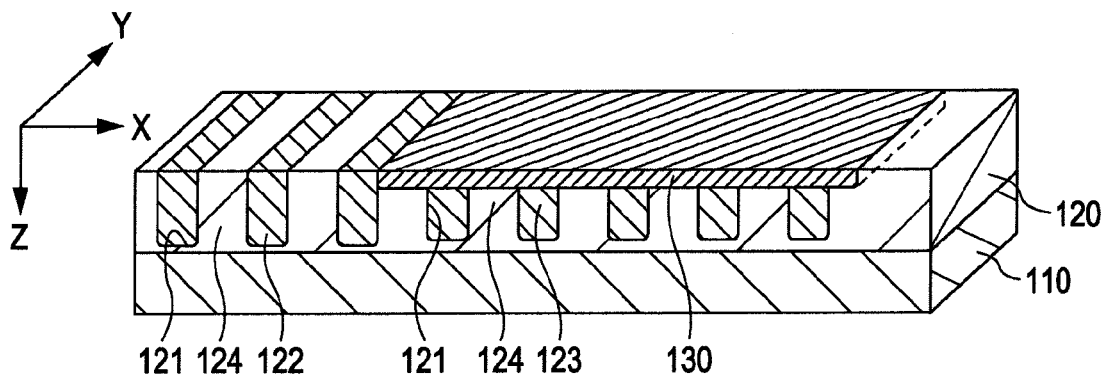
Figure 13C:
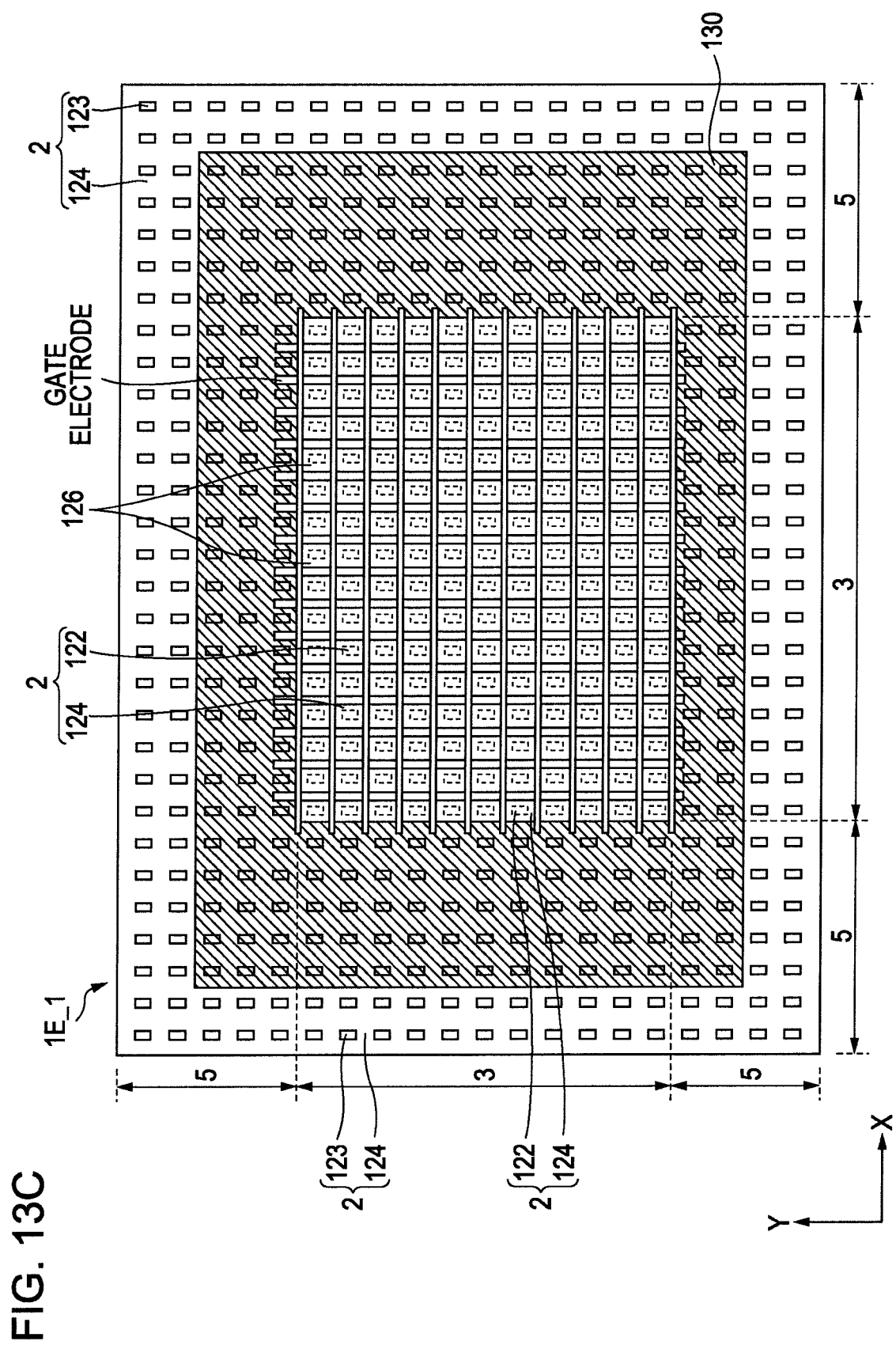
FIG. 13C is a plan view of the semiconductor with reference to the X-Y plane.

FIG. 13A to FIG. 13C illustrate a semiconductor device 1E of a fifth embodiment of the present invention. FIG. 13A and FIG. 13B are schematic diagrams illustrating the configuration of the boundary between an element part 3 and a terminal part 5 of the semiconductor device 1E_1, where FIG. 13A is a schematic perspective view of the semiconductor device 1E_1 and FIG. 13B is a cross-sectional view of the semiconductor device 1E_1 along the XIIIB-XIIIB line in X-Y directions in FIG. 13A. FIG. 13C is a plan view (transparent view) of the semiconductor device 1E_1 with reference to the X-Y plane in FIG. 13A. In this figure, a source region is not shown but a base region and a gate electrode are shown.

The semiconductor device 1E_1 of the fifth embodiment is advantageously provided with p-type epitaxial buried layers 123 in an island or reticular pattern in at least the terminal part 5. An n-type epitaxial layer 124 is formed so that it may surround the p-type epitaxial embedded layers 123. In the element part 3, the shape of a p-type epitaxial buried layer 122 is not limited to a particular one, so that it may be any of shapes such as a stripe and an island.

Preferably, the p-type epitaxial buried layers 122 in the element part 3 may be arranged in an island pattern in a manner similar to those of the terminal part 5. All parts of the device (the element part 3 and the terminal part 5) may be formed into the same shape (substantially the same depth, shape, and pitch) when trench grooves are formed. In this case, therefore, the shape is fixed, so that an etching shape may be kept constant. In addition, at the time of filling the trench groove by epitaxial growth, the conditions of epitaxial growth can be kept constant because of constant trench shape. Therefore, such a configuration of the device may lead to stable formation of a pillar structure with a predetermined shape using an epitaxially filled trench groove and stable formation of a peripheral structure with a high breakdown voltage.

In FIG. 13B, the strip-shaped p-type epitaxial buried layers 122 are arranged in the element part 3. In FIG. 13A, the island-shaped p-type epitaxial buried layers 122 are arranged in the element part 3. In FIG. 13B, the terminal part 5 is covered with the p-type lateral RESURF region 130 so that the arrangement of p-type epitaxial buried layers 122 may not be apparently represented. In contrast, from the high-concentration n-type substrate 110 (drain side) to the top side (source side) of FIG. 13A, p-type epitaxial buried layers 123 are arranged in an island pattern. Principally, other structural features are the same as those of the first embodiment (basic configuration).

The planer shape of each of the p-type epitaxial buried layer 123 arranged in an island pattern may be any of shapes, such as a tetragon (a square, a rhombus, or a rectangle) or any of other polygonal or circular shapes (including an oval shape).

The p-type epitaxial buried layers 123 formed in substantially the same shape (same dimensions and depth) in the terminal part 5 and arranged around the element part 3 with substantially the same pitch in X and Y directions. Here, the term "dimensions" mean those of the p-type epitaxial buried layers 122 or 123 in the directions (X direction and Y direction) along which the n-type epitaxial layers 124 and the p-type epitaxial buried layers 122 or 123 are alternately appeared at the same depth position. The term "substantially the same" means that it may have a difference of several percents (e.g., 5% or less).

The semiconductor device 1E_1 of the fifth embodiment may be manufactured in a manner similar to that of the first embodiment (basic configuration) except for the arrangement of p-type epitaxial buried layers 123 in an island pattern at least in the terminal part 5. Thus, the corresponding trench grooves 121 may be formed in island shape instead of stripe shape.

Here, although the basic configuration of the semiconductor device of the first embodiment has been modified and illustrated, the present modification may be also applied to the first, second, or third modified example of the first embodiment or any of the second to fourth embodiments.

Fifth Embodiment

Modified Examples

Figure 13D:
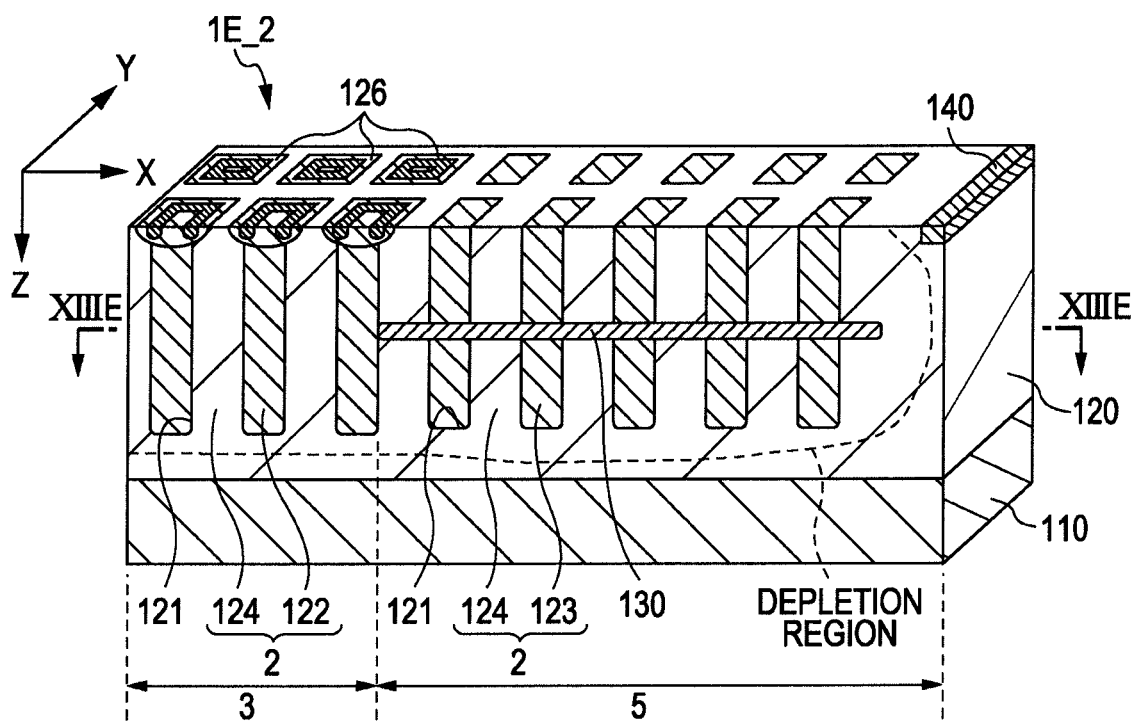
FIG. 13D and FIG. 13E are schematic perspective diagrams illustrating the configurations of a modified example of the semiconductor device.
Figure 13E:
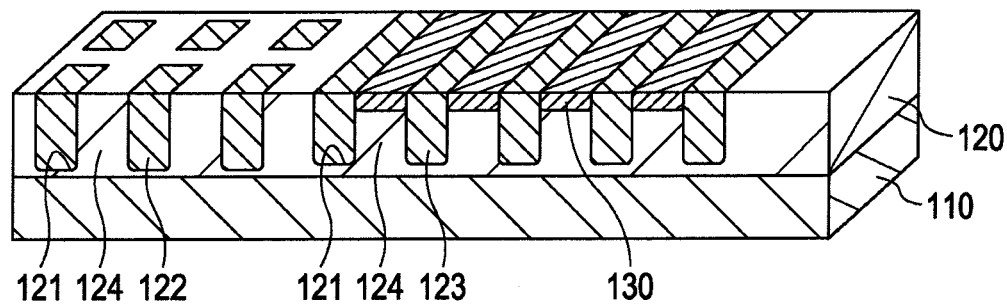
Figure 13F:
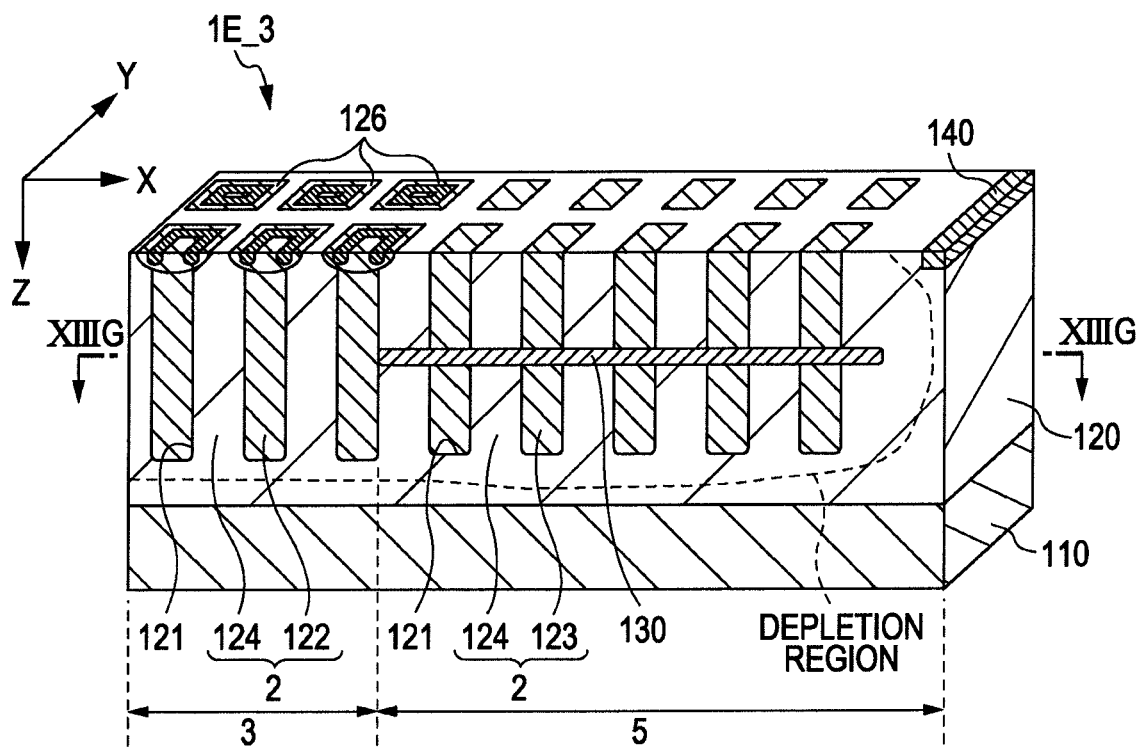
FIG. 13F and FIG. 13G are schematic perspective diagrams illustrating the configurations of another modified example of the semiconductor device.

FIG. 13D to FIG. 13G are diagrams illustrating modified exampled of the fifth embodiment. In this figures, FIG. 13E is a cross sectional view of FIG. 13D along the XIIIE-XIIIE line and FIG. 13F is a cross sectional view of FIG. 13G along the XIIIG-XIIIG line. Here, the semiconductor devices 1E_2 and 1E_3 of the fifth embodiment (modified examples) in which the element part 3 is formed in an island pattern. As is evident from each of FIG. 13D to FIG. 13G, the element part 3 includes p-type epitaxial buried layers 122 arranged in an island pattern from the side of the high-concentration n-type substrate 110 (drain side) to the top side (source side). On the other hand, the terminal part 5 includes p-type epitaxial buried layers 123 arranged in a stripe pattern from the side of the high-concentration n-type substrate 110 (drain side) to the p-type lateral RESURF region 130 in the middle portion of the terminal part 5. In addition, p-type epitaxial buried layers 123 are also arranged in an island pattern from the p-type lateral RESURF region 130 in the middle portion to the top side (source side).

FIG. 13E is not a cross-sectional view of the semiconductor device 1E_2 along the XIIIE-XIIIE line in X-Y directions in FIG. 13D. FIG. 13D is a perspective view of the semiconductor device 1E_2, where the p-type lateral RESURF region 130 is one described in the first embodiment (basic configuration). In contrast, FIG. 3E is a perspective view of the semiconductor device 1E_2, where the p-type lateral RESURF region 130 is one described in the first embodiment (first modified example).

Figure 13G:
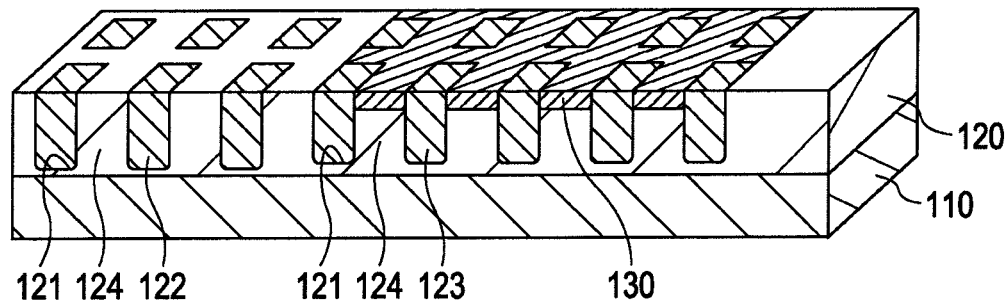

As shown in FIG. 13G, in each of the element part 3 and the terminal part 5, the p-type epitaxial buried layers 122 or 124 may be arranged in an island pattern from the high-concentration n-type substrate 110 (drain side) to the top side (source side). Alternatively, but not shown in the figure, from the high-concentration n-type substrate 110 (drain side) to the top side (source side) in the terminal portion 5, p-type epitaxial buried layers 123 are arranged in an island pattern. In the element part 3, the middle portion thereof, where the p-type lateral RESURF region 130 is arranged, may be provided as a boundary between the stripe-shaped p-type epitaxial buried layers 122 and island-shaped p-type epitaxial buried layers 122.

As described above, the semiconductor device of the fifth embodiment may be modified in various ways. However, among them, it is preferable that p-type epitaxial buried layers 122 may be arranged in an island pattern from the high-concentration n-type substrate 110 (drain side) to the surface side (source side) because of its simplest configuration instead of providing the p-type lateral RESURF region 130 as a boundary between the stripe-shaped p-type epitaxial buried layers 122 and island-shaped p-type epitaxial buried layers 122. For realizing the configuration of switching the stripe pattern and the island pattern, the process may be complicated, for example, different masks may be used in different manufacturing steps.

Sixth to Eighth Embodiments

Figure 14A:
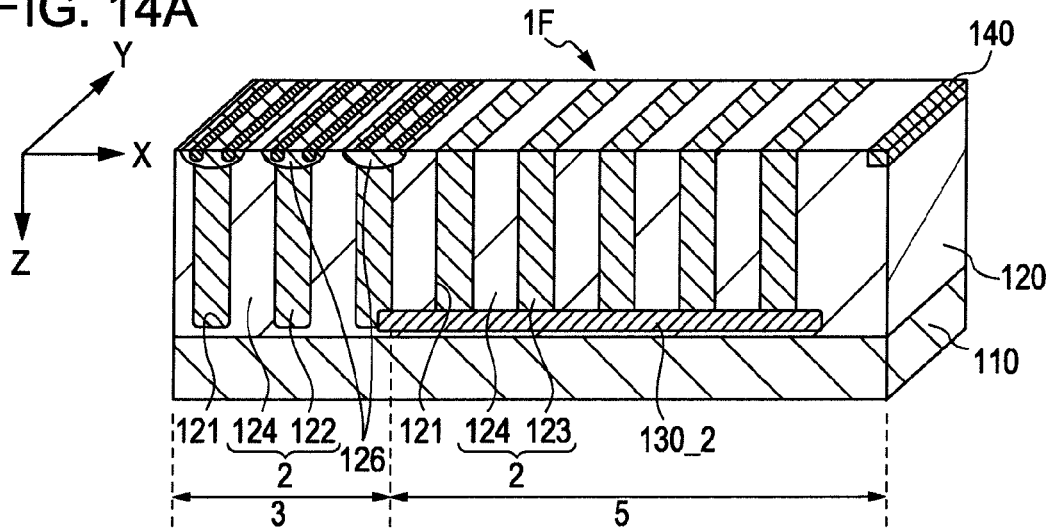
FIG. 14A is a schematic perspective diagram illustrating the configuration of the semiconductor device of the sixth embodiment.
Figure 14B:
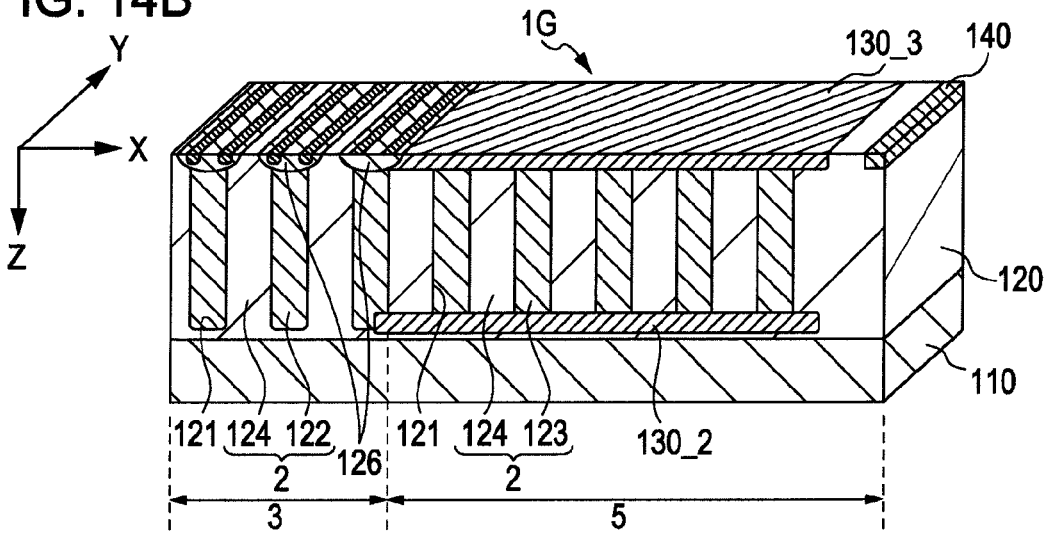
FIG. 14B is a schematic perspective diagram illustrating the configuration of the semiconductor device of the seventh embodiment.
Figure 14C:
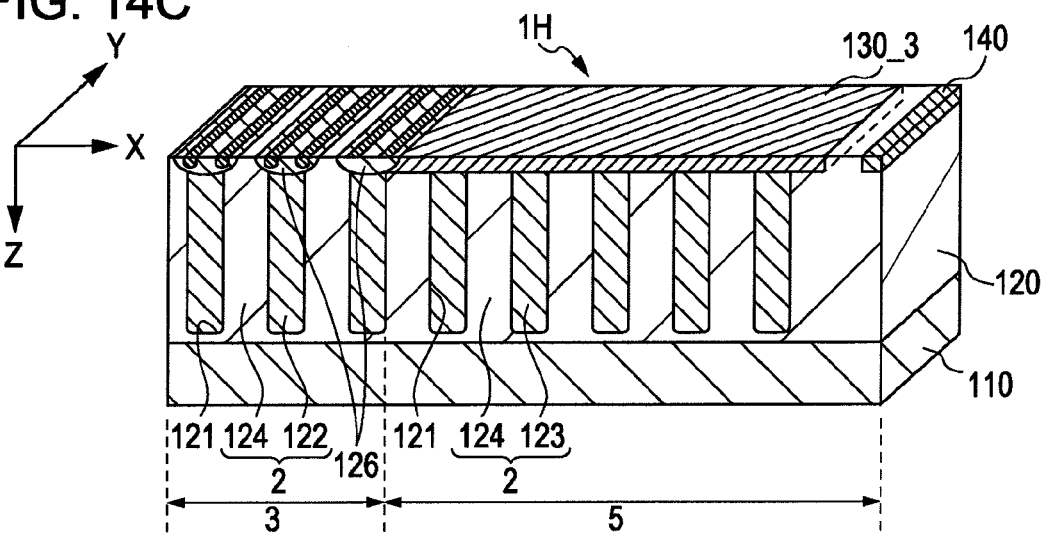
FIG. 14C is a schematic perspective diagram illustrating the configuration of the semiconductor device of the eighth embodiment.

FIG. 14A to FIG. 14C illustrate semiconductor devices of sixth to eighth embodiments of the present invention, respectively. Here, each of FIG. 14A to FIG. 14C is a schematic perspective diagram illustrating the configuration of the boundary between an element part 3 and a terminal part 5 of the semiconductor device. Principally, the semiconductor device 1F of the sixth embodiment has the same configuration as that of the semiconductor device 1A_1 of the first embodiment (basic configuration) with respect to the structure of a p-type epitaxial buried layer 123, except for the structure of a p-type lateral RESURF structure 130 of the terminal part 5. In other words, in this embodiment, some modifications are applied to the p-type lateral RESURF structure 130. A fundamental view of the modification is that a p-type depletion layer extending layer is formed on the surface on the side of the drain electrode but not arranged in the n-type epitaxial layer 120 sandwiched between the drain electrode and the source electrode.

As an example in the figure, p-type lateral RESURF region 130_2 is arranged on the surface of the n-type epitaxial layer 120 on the side of the high-concentration n-type substrate 110 in a manner similar to that of the fourth embodiment with respect to all the p-type epitaxial buried layers 123 in the terminal part 5. All the p-type epitaxial buried layers 124 may be electrically connected to the p-type lateral RESURF regions 130.

Alternatively, all the p-type epitaxial buried layers 123 may be not typically electrically connected to the p-type lateral RESURF regions 130. As described in the third embodiment, but not shown in the figure, the p-type epitaxial buried layer 123 on the outermost periphery of the device may be in a floating state. In other words, the p-type lateral RESURF region 130_2 that functions as a depletion layer does not extend to the periphery of the terminal part 5 in the arrangement direction of the p-type epitaxial buried layer 123 that functions as a depletion layer extending region. In addition, the p-type epitaxial buried layer 123 is formed in a floating state in the arrangement direction of stripes outside the terminal end of the p-type lateral RESURF region 130_2. The configuration of the semiconductor device is designed for electrically separating the p-type epitaxially buried layer 123 on the peripheral side of the device from the p-type lateral RESURF region 130_2.

The semiconductor device 1F of the sixth embodiment forms a p-type depletion layer extending layer on the surface on the drain electrode side. A potential transfer can be improved and easily performed by the RESURF structure to a recovery delay of the reverse diode which provides a periphery floating structure for ensuring a high breakdown voltage. The extent of the depletion layer formed upon application of drain voltage inclines toward the drain electrode side. Thus, comparing with the first embodiment in which the middle portion is formed, the shape of a depletion layer with a curvature may be not easily performed. In other points, almost the same advantageous effects as those of the first embodiment will be obtained.

The semiconductor device 1G of the seventh embodiment as shown in FIG. 14B is based on the configuration of the semiconductor device 1F of the sixth embodiment and is advantageously formed with a p-type lateral RESURF region 130_3 that functions as a p-type depletion layer extending layer on the surface on the source electrode side. In other words, the semiconductor device 1F is constructed in a manner similar to the semiconductor device 1D of the fourth embodiment except for removing the p-type lateral RESURF region 130_1 from the n-type epitaxial layer 120. That is, the semiconductor device 1F does not include a p-type depletion layer extending layer in the n-type epitaxial layer 120 but p-type depletion layer extending layers are arranged on the opposite sides of the n-type epitaxial layer 120.

The semiconductor device 1G of the seventh embodiment forms p-type depletion layer extending layers on the opposite sides of the n-type epitaxial layer 120. A potential transfer can be improved and easily performed by the RESURF structure to a recovery delay of the reverse diode which provides a periphery floating structure for ensuring a high breakdown voltage. Since depletion layers formed upon the application of drain voltage extend from both sides on the n-type epitaxial layer 120, the depletion layer does not extend disproportionately in contrast to one in which the depletion layer is formed on only one side of the n-type epitaxial layer 120. It may contribute to design a depletion layer that extends in a lateral direction in shape with a more appropriate curvature. The depletion layer may extend substantially in a manner similar to that of the first embodiment, so that the same advantageous effects as those of the first embodiment will be obtained. In contrast with the fourth embodiment, the p-type lateral RESURF region 130_1 may be advantageously omitted from the n-type epitaxial layer 120.

Principally, the semiconductor device 1H of the eighth embodiment as shown in FIG. 14C has the same configuration as that of the first embodiment (basic configuration) with respect to the structure of a p-type epitaxial buried layer 123, except for the structure of a p-type lateral RESURF structure 130 of the terminal part 5. In other words, in this embodiment, some modifications are applied to the p-type lateral RESURF structure 130. A fundamental view of the modification is that a p-type depletion layer extending layer is formed on the surface on the side of the source electrode but not arranged in the n-type epitaxial layer 120 sandwiched between the drain electrode and the source electrode.

In the case, a p-type lateral RESURF region 130_3 is arranged on the surface of the n-type epitaxial layer 120 opposite to the side of the high-concentration n-type substrate 110 in a manner similar to that of the fourth embodiment with respect to all the p-type epitaxial buried layer 123 in the terminal part 5. All the p-type epitaxial buried layers 123 may be electrically connected to the p-type lateral RESURF regions 130_3. In this embodiment, the p-type epitaxial buried layer 123 on the outermost periphery of the device is not brought into a floating state.

The semiconductor device 1H of the eighth embodiment forms a p-type depletion layer extending layer on the surface on the source electrode side. A potential transfer can be improved and easily performed by the RESURF structure to a recovery delay of the reverse diode which provides a periphery floating structure for ensuring a high breakdown voltage. All the p-type epitaxial buried layers 123 in the terminal part 5 may be electrically connected to the p-type lateral RESURF regions 130_3. Thus, a depletion layer with a curvature, which is formed when applying a drain voltage, may extend toward the periphery of the device without mistake.

The extent of the depletion layer formed upon application of drain voltage inclines toward the source electrode side. Thus, comparing with the first embodiment in which the middle portion is formed, the shape of a depletion layer with a curvature may be not easily designed. However, poor distribution of the depletion layer may be avoidable. In other points, almost the same advantageous effects as those of the first embodiment will be obtained.

In any of the semiconductor devices 1F to 1H of the sixth to eighth embodiments, each of the p-type lateral RESURF regions 130_2 and 130_3 may be one in which slits 136 are formed in a manner similar to those of the second embodiment.

Ninth Embodiment

Figure 15A:
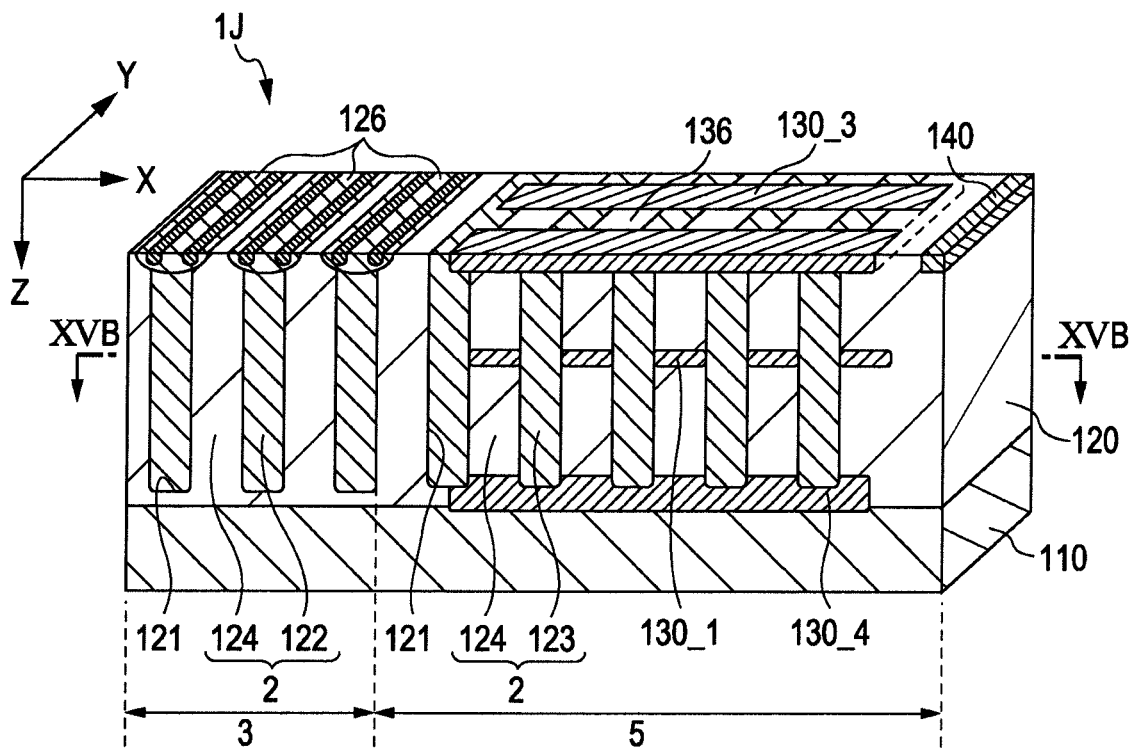
FIG. 15A and FIG. 15B are schematic perspective diagrams illustrating the configuration of the semiconductor device.
Figure 15B:
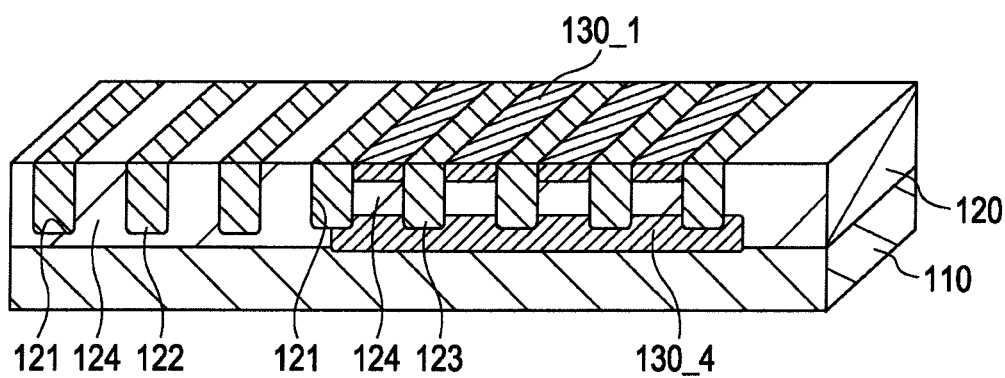

FIG. 15 is a diagram illustrating the semiconductor device 1J of the ninth embodiment of the present invention. Here, FIG. 15A and FIG. 15B are schematic diagrams illustrating the configuration of the boundary between an element part 3 and a terminal part 5 of the semiconductor device 1J, where FIG. 15A is a schematic perspective view of the semiconductor device 1J and FIG. 15B is a cross-sectional view of the semiconductor device 1J along the XVB-XVB line in X-Y directions in FIG. 15A.

In the ninth embodiment, a p-type lateral RESURF region 130_4 is formed on the boundary between the high-concentration n-type substrate 110 (drain layer) and the n-type epitaxial layer 120 in addition to the formation of a p-type lateral RESURF region 130_1 in the n-type epitaxial layer 120 sandwiched between the drain electrode and the source electrode. The configuration of the semiconductor device 1J of the ninth embodiment is similar to that of the fourth embodiment except for the continuous (integral) formation of the p-type lateral RESURF region 130_4 from the high-concentration n-type substrate to the n-type epitaxial layer 120 on the boundary between the high-concentration n-type substrate 110 and the n-type epitaxial layer 120.

The example illustrated in the figure is one in which the p-type lateral RESURF region 130_3 to which the second embodiment that provides slits 136 is formed on the surface on the source electrode side. Structurally, the p-type lateral RESURF region 130_4 is formed on the side of the n-type epitaxial layer 120 on the boundary between the high-concentration n-type substrate 110 and the n-type epitaxial layer 120. The p-type lateral RESURF region 130_4 on the surface of the high-concentration n-type substrate 110 and the p-type lateral RESURF region 130_4 in the n-type epitaxial layer 120 are may be combined. A lateral RESURF region is formed on each side of the boundary between the high-concentration n-type substrate 110 and the n-type epitaxial layer 120.

When applying the ninth embodiment, a manufacturing method of the semiconductor device may utilize the mechanism of a so-called upward diffusion. The upper diffusion used herein may utilize any of a difference in diffusion coefficient between impurities such as arsenic As and antimony Sb to be included in the high-concentration n-type substrate 110 and impurities such as boron B to be included in the p-type lateral RESURF region, compensation for high-concentration impurities, and the like. For example, patterns are directly formed on the high-concentration n-type substrate 110 provided as a drain layer by photoresist, and a predetermined concentration of p-type semiconductor that forms a p-type lateral RESURF region 130_4 is then injected into only the terminal part 5 by ion injection. In this case, for example, the high-concentration n-type substrate 110 may be injected with N-type impurities, arsenic As, at a concentration of 3 e 19 atoms/cm$^3$. The high-concentration n-type substrate 110 is subjected to patterning with photoresist and then subjected to selective ion injection (30 kev) of boron B at a concentration of 1 e 14 atoms/cm$^2$ through a 10-nm oxidized film.

After that, in a manner similar to that of the first embodiment (e.g., first modified example), patterning is carried out using a photoresist mask at the stage of forming the n-type epitaxial layer 120_1 up to one half of the desired film thickness. Then, the ion injection of p-type semiconductor is carried out only on the terminal part 5. Therefore, the p-type lateral RESURF region 130_1 is formed in the middle portion of the n-type epitaxial layer 120. Subsequently, the n-type semiconductor is epitaxially grown to a desired film thickness, thereby forming an n-epitaxial layer 120_2. Furthermore, patterning is carried out using a photoresist mask or the like and p-type semiconductor is then ion-injected into only the terminal part 5, thereby forming a p-type lateral RESURF region 130_3 on the surface (source electrode side).

Subsequently, after forming the trench grooves 121 at once by etching with a photoresist and an oxidized film hard mask, the trench grooves 121 are filled with p-type semiconductor by epitaxial growth to form a super junction structure. The surface of the device is finished by mirror finishing with the CMP technique or the like. A MOSFET with the super junction structure is completely formed in the element part 3 by forming a base region, a gate insulating film, a source region, a source electrode, and the like.

Here, the high-concentration n-type substrate 110 is injected with boron B and then subjected to a high-temperature process to diffuse boron upwardly to the n-type epitaxial layer 120. Although arsenic As may also diffuse upward, the degree of upward diffusion of boron is higher than that of arsenic As because of a difference in diffusion coefficient. As a result, the p-type lateral RESURF region 130_4 is continuously formed in the boundary between the high-concentration n-type substrate 110 and the n-type epitaxial layer 120. Here, examples of the "high-temperature process" include N-epitaxial growth or P-epitaxial embedding at about 1100° C. and diffusion for the formation of transistor base layer at about 1000° C.

In the fourth embodiment, the p-type lateral RESURF region 130_2 is formed near the surface of n-type epitaxial layer 120 on the side of the high-concentration n-type substrate 110. For this purpose, the number of steps may be increased for stopping the epitaxial growth of the n-type epitaxial layer 120. In contrast, in this embodiment, the upper diffusion and the diffusion coefficient of the impurities in the respective layers are used effectively. In this embodiment, therefore, the p-type lateral RESURF region 130_4 can be continuously formed in the boundary between the high-concentration n-type substrate 110 and the n-type epitaxial layer 120. The embedding of impurities for such a process may be carried out on the surface of the high-concentration n-type substrate 110, so that the epitaxial growth of n-epitaxial layer 120 near the boundary does not have to be stopped.

Such a manufacturing method allows the formation of super-junction MOSFET by carrying out a single trench formation (it means that the formation of trench grooves 121 is performed only once), an epitaxial growth process in trench grooves 121, and a CMP process. In this case, one of advantageous features is that the depth of the trench groove 121 of only the terminal part 5 is enough to connect to the p-type lateral RESURF region 130_2. In other words, if the trench grooves 121 of the element part 3 and the trench grooves 121 of the terminal part 5 have the same dimensions (in this case, the same depth), the dimensions thereof may be set so that the trench grooves 121 of the element part 3 do not reach to the high-concentration n-type substrate 110 but those of the terminal part 5 reaches to the p-type lateral RESURF region 130.

The structure of the device of the ninth embodiment may be also applied to the devices of the sixth and seventh embodiments.

In the above description, the embodiments of the present invention have been described with reference to the attached drawings. However, the technical scope of the present invention is not limited to the scope of the description in these embodiments. Various changes or modifications may be added to the aforementioned embodiments without limiting the scope of the invention and such changed or modified embodiments will be also included in the technical scope of the present invention.

In addition, the aforementioned embodiments are not intended to restrict the inventions claimed in claims and all of combinations of characteristic features described in the embodiments may not be indispensable to overcome the disadvantages considered in the present invention.

The aforementioned embodiments may include various stages of the invention, so that various kinds of invention may be extracted by appropriate combinations of two or more disclosed constituent features. Even if some constituent features may be deleted from all the constituent features disclosed in the embodiments, any constitution, construction, or structure that lacks some constituent features may be also extracted as an invention.

For instance, each of the embodiments may have a structure in which the bottom of the p-type epitaxial buried layer 122 or 123 (i.e., the trench groove 121) does not reach to the high-concentration n-type substrate 110 but reaches to the high-concentration n-type substrate 110.

In this case, the manufacturing method for the application of the fourth embodiment may be modified as follows: For example, the surface of the high-concentration n-type substrate 110 (drain layer) is patterned using a photoresist mask or the like. A predetermined concentration of p-type semiconductor to be functioned as a p-type lateral RESURF region 130_2 is injected into only the terminal part 5 by ion injection. After that, in a manner similar to the first embodiment (basic configuration), an n-type epitaxial layer 120_1 is formed. Then, the formation of trench grooves 121_1 and the embedding of p-type epitaxial layers 125_1 into the trench grooves 121_1 are performed. In addition, a p-type lateral RESURF region 130_1 is formed in the middle portion of the n-type epitaxial layer 120. Subsequently, after the formation of an n-type epitaxial layer 120_2, the formation of trench grooves 121_2 and the embedding of p-type epitaxial layers 125_2 into the trench grooves 121_2 are performed, followed by surface mirror finishing. As a result, p-type epitaxial buried layers 122_2 and 123_2 embedded in the trench grooves 121_2 are obtained. Alternatively, the manufacturing method of the first embodiment (first modified example) may be employed to carry out once the formation of trench grooves 121 and the embedding of p-type epitaxial buried layers 125 into the trench grooves 121.

In each embodiment, the p-type semiconductor region is used as the semiconductor region embedded in the trench groove 121. Alternatively, n-type semiconductor may be employed. In other words, trench grooves 121 may be formed in a p-type single crystal semiconductor layer arranged on the high-concentration n-type substrate 110. Thus, the resulting structure may include n-type epitaxial layers embedded in the trench grooves 121.

In each embodiment, the n-type semiconductor substrate (high-concentration n-type substrate 110) is used. Alternatively, a p-type semiconductor substrate may be used. In this case, the super junction structure may be one of the following two structures: One structure is prepared by forming trench grooves 121 in a p-type single crystal semiconductor arranged on a p-type semiconductor substrate and embedding n-type epitaxial layers into the respective trench grooves 121; and the other structure is prepared by forming trench grooves 121 in an n-type single crystal semiconductor layer arranged on a p-type semiconductor substrate and embedding p-type epitaxial layers into the respective trench grooves 121.

As a MOSFET provided as an example of a switching device arranged on the super junction structure, a combination with a lateral MOSFET using a silicon surface as a channel has been described, but not limited thereto. Alternatively, a vertical MOSFET in which a gate oxide and a gate metal formed on the inner wall of a comparatively shallow trench groove may be used.

In each of the aforementioned embodiments, the gate insulating film is a MOS type that contains a silicon dioxide film, but not limited thereto. Alternatively, the gate insulating film may be a MIS (metal insulator semiconductor) type that contains an insulating film (e.g., a high-dielectric film) other than the silicon dioxide film.

In each embodiment, the power MOSFET (insulated gate field effect transistor) has been illustrated. Alternatively, each of the aforementioned embodiments may be applied to any kind of semiconductor devices as long as it is able to employ a super junction structure.

Such semiconductor devices include those that simultaneously satisfy a high breakdown voltage and a high current capacity, such as IGBTs (insulated gate bipolar transistors) and SBTs (schottky barrier diodes), usual bipolar transistors, and diodes.

In each embodiment, the semiconductor device uses silicon (Si) as a semiconductor material. However, the material (substrate) is not limited to Si.

Any of other materials may be used, for example compound semiconductors such as silicon carbide (SiC), gallium nitride (GaN), and aluminum nitride (AlN) and diamonds.

The present application contains subject matter related to that disclosed in Japanese Priority Patent Application JP filed in the Japan Patent Office on Sep. 10, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device, comprising:
   a first conductive type first semiconductor region arranged on a first electrode side;
   a second semiconductor region including first conductive type first pillar regions and second conductive type second pillar regions alternately arranged on an element part and a terminal part around said element part along a surface of said first semiconductor region on a second electrode side opposite to said first electrode side of said first semiconductor region; and
   a second conductive type lateral RESURF region formed in said second semiconductor region on said terminal part, wherein
   a plurality of said lateral RESURF regions are formed in said second semiconductor region, and wherein another second conductive lateral RESURF region is integrally formed at a boundary between said first semiconductor region and said second semiconductor region, extending from said first semiconductor region to said second semiconductor region.

2. The semiconductor device according to claim 1, wherein the
   another second conductive type lateral RESURF region is formed on the surface of said second semiconductor region at said terminal part.

3. A semiconductor device, comprising:
   a first conductive type first semiconductor region arranged on a first electrode side;
   a second semiconductor region including first conductive type first pillar regions and second conductive type second pillar regions alternately arranged on an element part and a terminal part thereof along a surface on a second electrode side opposite to said first electrode side of said first semiconductor region; and
   a second conductive type lateral RESURF region formed on the surface of said second semiconductor region on said terminal part on the side of said first semiconductor region, wherein
   a plurality of said lateral RESURF regions are formed in said second semiconductor region.

4. The semiconductor device according to claim 3, wherein said second conductive lateral RESURF region is integrally formed on a boundary between said first semiconductor region and said second semiconductor region, extending from said first semiconductor region to said second semiconductor region.

5. The semiconductor device according to claim 4, wherein another second conductive type lateral RESURF region is formed on the surface of said second semiconductor region on said terminal part on said second electrode side.

6. A semiconductor device, comprising:
   a first conductive type first semiconductor region arranged on a first electrode side;

a second semiconductor region including first conductive type first pillar regions and second conductive type second pillar regions alternately arranged on an element part and a terminal part around said element part along a surface of said first semiconductor region on a second electrode side opposite to said first electrode side of said first semiconductor region; and
a second conductive type lateral RESURF region formed in said second semiconductor region on said terminal part, wherein
a plurality of said lateral RESURF regions are formed in said second semiconductor region, wherein
all of said second pillar regions on said terminal part electrically connecting to said lateral RESURF region.

7. A semiconductor device according to claim 1, wherein
among said second pillar regions on said terminal part, those located on the periphery of said second pillar regions are electrically unconnected to said lateral RESURF region; and
the rest of said second pillar regions on said terminal part electrically connecting to said lateral RESURF region.

8. A semiconductor device, comprising:
a first conductive type first semiconductor region arranged on a first electrode side;
a second semiconductor region including first conductive type first pillar regions and second conductive type second pillar regions are alternately arranged on an element part and a terminal part thereof along a surface of said first semiconductor region on a second electrode side opposite to said first electrode side of said first semiconductor region; and
a second conductive type lateral RESURF region formed on the surface of said second semiconductor region on said terminal part on said second electrode side, wherein
all of said second pillar regions on said terminal part electrically connecting to said lateral RESURF region, wherein
a plurality of said lateral RESURF regions are formed in said second semiconductor region.

9. A semiconductor device, comprising:
a first conductive type first semiconductor region arranged on a first electrode side;
a second semiconductor region including first conductive type first pillar regions and second conductive type second pillar regions alternately arranged on an element part and a terminal part around said element part along a surface of said first semiconductor region on a second electrode side opposite to said first electrode side of said first semiconductor region; and
a second conductive type lateral RESURF region formed in said second semiconductor region on said terminal part, wherein
a plurality of said lateral RESURF regions are formed in said second semiconductor region, wherein
slits are formed in said lateral RESURF region with a predetermined spacing, and a first conductive type semiconductor is arranged on said slits.

10. A semiconductor device, comprising:
a first conductive type first semiconductor region arranged on a first electrode side;
a second semiconductor region including first conductive type first pillar regions and second conductive type second pillar regions alternately arranged on an element part and a terminal part around said element part along a surface of said first semiconductor region on a second electrode side opposite to said first electrode side of said first semiconductor region; and
a second conductive type lateral RESURF region formed in said second semiconductor region on said terminal part, wherein
a plurality of said lateral RESURF regions are formed in said second semiconductor region, wherein
each of said second pillar regions is formed such that a second conductive semiconductor is embedded in each trench groove formed in said second semiconductor region by epitaxial growth,
each of said first pillar regions is formed in an area sandwiched between said second pillar regions,
said second pillar regions are arranged at the same depth in the same direction over said element part and said terminal part of said second semiconductor region, and
said second pillar regions arranged on said element part and said second pillar regions arranged on said terminal part have the same shape and same pitch.

11. The semiconductor device according to claim 1, wherein
at least a part of each of said second pillar regions on said terminal part does not overlap said lateral RESURF region.

\* \* \* \* \*